US012217694B2

(12) United States Patent
Kim et al.

(10) Patent No.: US 12,217,694 B2
(45) Date of Patent: Feb. 4, 2025

(54) DISPLAY DEVICE AND METHOD OF MANUFACTURING THE SAME

(71) Applicant: Samsung Display Co., Ltd., Yongin-si (KR)

(72) Inventors: Keun Woo Kim, Yongin-si (KR); Mee Jae Kang, Yongin-si (KR); Doo Na Kim, Yongin-si (KR); Yun Jung Oh, Yongin-si (KR); Yong Su Lee, Yongin-si (KR); Jae Hwan Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 16/849,882

(22) Filed: Apr. 15, 2020

(65) Prior Publication Data
US 2021/0057458 A1 Feb. 25, 2021

(30) Foreign Application Priority Data
Aug. 20, 2019 (KR) ........................ 10-2019-0101685

(51) Int. Cl.
*G09G 3/3266* (2016.01)
*G09G 3/20* (2006.01)
*H01L 27/12* (2006.01)

(52) U.S. Cl.
CPC ............. *G09G 3/3266* (2013.01); *G09G 3/20* (2013.01); *H01L 27/1229* (2013.01); *H01L 27/1251* (2013.01); *H01L 27/1285* (2013.01); *G09G 2300/08* (2013.01)

(58) Field of Classification Search
CPC ............. H01L 27/1251; H01L 27/1229; H01L 27/1285; H01L 27/32; H01L 27/33; H01L 27/124; H01L 27/1225; H01L 27/1255; H01L 27/323; H01L 51/52; G09G 3/20; G09G 2300/08
See application file for complete search history.

(56) References Cited

U.S. PATENT DOCUMENTS

| 8,400,589 B2 | 3/2013 | Lee |
| 9,324,449 B2 | 4/2016 | Yamazaki et al. |
| 10,347,351 B2 | 7/2019 | Eom et al. |
| 2009/0185407 A1* | 7/2009 | Park .................... H01L 21/8221 365/230.06 |
| 2011/0090438 A1* | 4/2011 | Lee ..................... H01L 27/1218 349/110 |
| 2013/0146931 A1 | 6/2013 | Liu et al. |

(Continued)

FOREIGN PATENT DOCUMENTS

| JP | H11214983 A1 * | 1/1998 | ......... H03K 19/0027 |
| JP | 2019-68080 A | 4/2019 | |

(Continued)

*Primary Examiner* — Benjamin C Lee
*Assistant Examiner* — Nathan P Brittingham
(74) *Attorney, Agent, or Firm* — Lewis Roca Rothgerber Christie LLP

(57) ABSTRACT

A display device includes: a plurality of pixels connected to gate lines and data lines; a gate driver to supply a gate signal to the gate lines; and a data driver to supply a data signal to the data lines. The gate driver includes: a first transistor including a first active layer at a first layer; and a second transistor including a second active layer at a second layer on the first layer.

14 Claims, 21 Drawing Sheets

(56) References Cited

U.S. PATENT DOCUMENTS

| | | | |
|---|---|---|---|
| 2013/0257699 A1* | 10/2013 | Yamazaki | G11C 19/28 377/64 |
| 2015/0309637 A1 | 10/2015 | Sakuishi et al. | |
| 2017/0323593 A1* | 11/2017 | Kim | G11C 19/28 |
| 2018/0158406 A1 | 6/2018 | Kim et al. | |
| 2019/0155113 A1* | 5/2019 | Zeng | G02F 1/136286 |
| 2020/0203382 A1* | 6/2020 | Jung | H01L 23/552 |
| 2020/0357829 A1* | 11/2020 | Yang | H01L 27/1251 |

FOREIGN PATENT DOCUMENTS

| | | | |
|---|---|---|---|
| KR | 10-2011-0043187 | 4/2011 | |
| KR | 10-2015-0079314 | 7/2015 | |
| KR | 20200080056 A1 * | 12/2018 | H01L 27/124 |
| TW | 201324760 A1 | 6/2013 | |

* cited by examiner

TP″: TP1、TP2″、TP3″、TP4、TP5、TP6、TP7

SST: SST1、SST2、SST3、SST4 ······

DISPLAY DEVICE AND METHOD OF MANUFACTURING THE SAME

CROSS-REFERENCE TO RELATED APPLICATION

This application claims priority to and the benefit of Korean Patent Application No. 10-2019-0101685, filed in the Korean Intellectual Property Office on Aug. 20, 2019, the content of which in its entirety is herein incorporated by reference.

BACKGROUND

1. Field

Aspects of embodiments of the disclosure relate to a display device and a method of manufacturing the same.

2. Description of the Related Art

A display device includes pixels, and a driving circuit for driving the pixels. The driving circuit includes a gate driver for controlling a driving timing of the pixels in correspondence with timing control signals, and a data driver for controlling a luminance of the pixels in correspondence with image data.

The driving circuit may be disposed in a display panel in addition to (e.g., together with) the pixels or may be disposed outside (e.g., disposed external to) the display panel.

SUMMARY

One or more example embodiments of the disclosure are directed to a display device including a gate driver and a method of manufacturing the display device.

According to an example embodiment of the disclosure, a display device includes: a plurality of pixels connected to gate lines and data lines; a gate driver to supply a gate signal to the gate lines; and a data driver to supply a data signal to the data lines. The gate driver includes: a first transistor including a first active layer at a first layer; and a second transistor including a second active layer at a second layer on the first layer.

In an example embodiment, the gate lines may include scan lines and light emission control lines; and the gate driver may include: a scan driver to supply a scan signal to the scan lines; and a light emission control driver to supply a light emission control signal to the light emission control lines.

In an example embodiment, the scan driver may include a scan stage including the second transistor; and the light emission control driver may include a light emission control stage including the first transistor.

In an example embodiment, the scan driver may include a scan stage including the first transistor; and the light emission control driver may include a light emission control stage including the second transistor.

In an example embodiment, the gate lines may include scan lines; the gate driver may include scan stages to sequentially supply scan signals to the scan lines; and each of the scan stages may include: an input circuit including the second transistor; and an output circuit including the first transistor.

In an example embodiment, the gate lines may include light emission control lines; the gate driver may include light emission control stages to sequentially supply light emission control signals to the light emission control lines; and each of the light emission control stages may include: an input circuit including the second transistor; and an output circuit including the first transistor.

In an example embodiment, the first active layer and the second active layer may overlap each other.

In an example embodiment, the first transistor and the second transistor may have different characteristics from each other.

In an example embodiment, the first transistor and the second transistor may have different threshold voltages from each other.

In an example embodiment, each of the first transistor and the second transistor may include a P-type transistor; and the threshold voltage of the first transistor may be greater than the threshold voltage of the second transistor.

In an example embodiment, the first active layer and the second active layer may have different characteristics from each other.

In an example embodiment, the first active layer may have a degree of crystallization that is less than a degree of crystallization of the second active layer.

In an example embodiment, the display device may further include: a display panel including a display area at which the pixels may be disposed, and a non-display area at which the gate driver may be disposed.

In an example embodiment, each of the pixels may include a pixel transistor including a third active layer; and the third active layer may have a degree of crystallization that is less than a degree of crystallization of at least one active layer from among the first active layer and the second active layer.

According to an example embodiment of the disclosure, a method of manufacturing a display device including a gate driver including a first transistor and a second transistor is provided. The method includes: forming an active layer of the first transistor on a base layer; and forming an active layer of the second transistor on the active layer of the first transistor. The active layer of the first transistor and the active layer of the second transistor are crystallized under different conditions from each other.

In an example embodiment, the active layer of the first transistor may be irradiated with a laser at a first pitch when crystallizing the active layer of the first transistor; and the active layer of the second transistor may be irradiated with the laser at a second pitch when crystallizing the active layer of the second transistor.

In an example embodiment, the first pitch may be greater than the second pitch.

In an example embodiment, the active layer of the first transistor may be crystallized before crystallizing the active layer of the second transistor.

In an example embodiment, the method may further include: forming a pixel transistor at a display area of the display device, and an active layer of the pixel transistor may be crystallized under a condition different from a crystallization condition of at least one from among the active layers of the first and second transistors.

In an example embodiment, the at least one active layer from among the active layers of the first and second transistors may be irradiated with a laser at a first pitch when crystallizing the at least one active layer from among the active layers of the first and second transistors; and the active layer of the pixel transistor may be irradiated with the laser at a second pitch that is greater than the first pitch when crystallizing the active layer of the pixel transistor.

According to one or more embodiments of the disclosure, a high density stacked gate driver may be formed by dividing and disposing the first and second transistors that configure (e.g., that are included in) the gate driver into different layers from each other. Therefore, the non-display area of the display panel including the gate driver may be reduced (e.g., effectively reduced).

In addition, according to one or more embodiments of the disclosure, the crystallization condition of the transistors may be controlled for each layer or region in consideration of characteristics used (or desired) for each transistor disposed at (e.g., in or on) the display panel. Therefore, a manufacturing efficiency of the display device may be improved while improving or securing an operation characteristic of the display device.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1A:
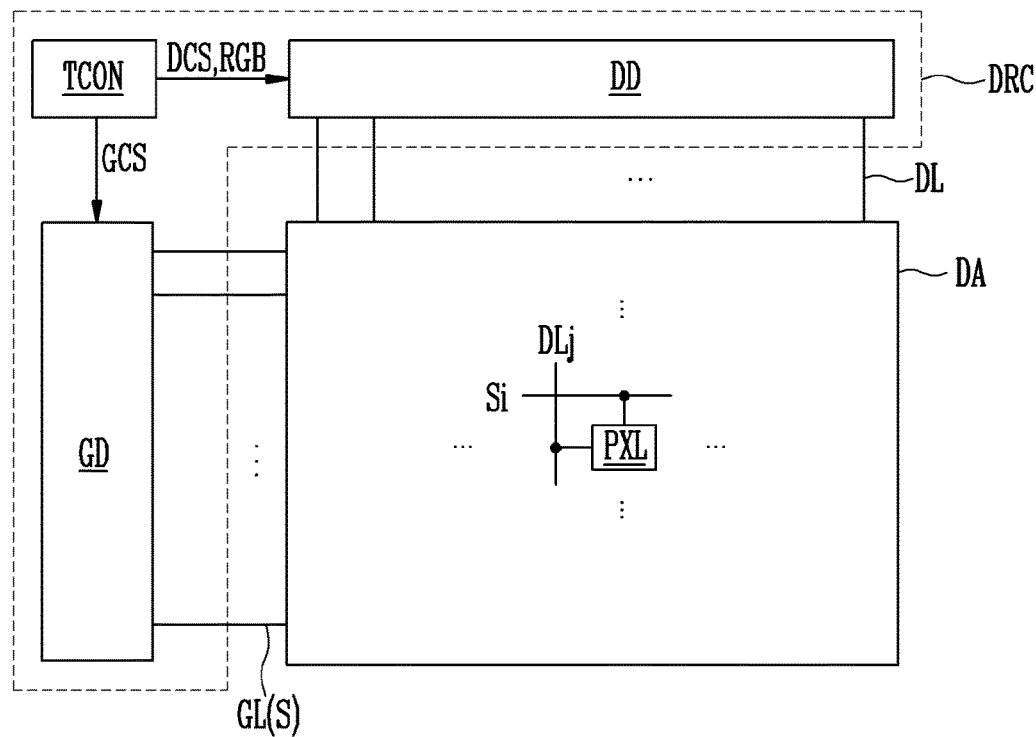
FIGS. 1A-1D illustrate various examples of display devices according to embodiments of the disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Descriptions of features or aspects within each example embodiment should typically be considered as available for other similar features or aspects in other example embodiments. For example, each of the embodiments disclosed herein may be implemented alone or in any suitable combination with at least one of the other embodiments.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIGS. 1A to 1D illustrate various examples of display devices according to embodiments of the disclosure. For example, FIGS. 1A to 1D illustrate different embodiments from each other in relation to gate lines GL and a gate driver GD for driving the gate lines GL.

Referring to FIG. 1A, the display device according to an embodiment of the disclosure includes pixels PXL disposed at (e.g., in or on) a display area DA, and a driving circuit DRC for driving the pixels PXL.

The display area DA includes the gate lines GL, data lines DL, and the pixels PXL connected to the gate lines GL and the data lines DL. As used in the present disclosure, the term "connection" may refer to an electrical connection and/or a physical connection.

Each of the gate lines GL extends in a first direction (for example, in a horizontal direction or a row direction) at (e.g., in or on) the display area DA, and the gate lines GL are sequentially arranged along a second direction (for example, in a vertical direction or a column direction) that crosses the first direction. The gate lines GL may be connected (e.g., commonly connected) to the pixels PXL positioned at (e.g., in or on) each horizontal line (which may also be referred to as a "pixel row"). According to an embodiment, the gate lines GL may include at least one or more scan lines S, and may further include at least one kind (or type) of other control lines in addition to the scan lines S.

Each of the data lines DL extends in the second direction (for example, the vertical direction or the column direction) at (e.g., in or on) the display area DA to cross the gate lines GL, and the data lines DL are sequentially arranged along a suitable direction (for example, the first direction) that crosses the second direction. The data lines DL may be connected (e.g., commonly connected) to the pixels PXL positioned at (e.g., in or on) each vertical line (which may also be referred to as a "pixel column").

The pixels PXL are connected to the gate lines GL and the data lines DL to receive respective gate signals and data signals from the gate lines GL and the data lines DL. As an example, a pixel PXL positioned at an i-th (i is a natural number) horizontal line and a j-th (j is a natural number) vertical line may be connected to an i-th scan line Si and a j-th data line DLj to receive a scan signal and a data signal of each frame from the i-th scan line Si and the j-th data line DLj. In an embodiment, the pixels PXL may be further connected to other kinds of signal lines (for example, connected to each of a light emission control line, an initialization control line, and/or a sensing control line), in addition to the scan lines S and the data lines DL, according to a structure and/or a driving method of the pixels PXL, and an operation of the pixels PXL may be controlled by respective control signals supplied from the signal lines.

In addition, the pixels PXL may further receive operation power from a power supply. For example, the pixels PXL may be driven by receiving first pixel power and second pixel power having different potentials (e.g., different power levels or voltage levels) from each other from the power supply. In addition, the pixels PXL may further selectively receive at least one other power (for example, an initialization power and/or a reference power), in addition to the first pixel power and the second pixel power, according to the structure and/or the driving method of the pixels PXL.

The pixels PXL operate according to a driving timing by the gate signals supplied from respective gate lines GL, and emit light having a desired luminance according to the data signals supplied from respective data lines DL. For example, the pixel PXL positioned at (e.g., in or on) the i-th horizontal line and the j-th vertical line receives the data signal from the j-th data line DLj when the scan signal is supplied from the i-th scan line Si, and emits light having a desired luminance corresponding to the data signal during a light emission period of a corresponding frame. Therefore, an image corresponding to the data signal of each frame may be displayed at (e.g., in or on) the display area DA.

The driving circuit DRC includes a gate driver GD for driving the gate lines GL, a data driver DD for driving the data lines DL, and a timing controller TCON for controlling the gate driver GD and the data driver DD. In an embodiment, the driving circuit DRC may be disposed on (e.g., in) the display panel in addition to (e.g., together with) the pixels PXL, or may be positioned outside (e.g., located external to) the display panel and may be connected to the pixels PXL through a pad portion and/or a circuit board.

The gate driver GD receives a gate driving control signal GCS from the timing controller TCON, and supplies the respective gate signals to the gate lines GL in correspondence with the gate driving control signal GCS. According to an embodiment, the gate driver GD may include at least a scan driver. In addition, when the gate lines GL further include at least one kind of other control lines, in addition to the scan lines S, the gate driver GD may further selectively include at least one kind of control line driver (for example, a light emission control driver) for driving the control lines.

The scan driver supplies respective scan signals to the scan lines S in correspondence with a scan driving control signal included in the gate driving control signal GCS. For example, the scan driver may supply (e.g., sequentially supply) the scan signals to the scan lines S during each frame period in correspondence with the scan driving control signal. Accordingly, the scan driver may include a plurality of scan stages. When the scan signals are supplied to the scan lines S, the pixels PXL that are connected to the scan line S to which the scan signal is supplied are selected, and the selected pixels PXL receive the data signals from the data lines DL.

According to an embodiment, the scan signal may be used to select the pixels PXL in a horizontal line unit (e.g., one horizontal row). For example, the scan signal may have a gate-on voltage (for example, a low voltage) at which a switching transistor of each pixel PXL that is connected to a corresponding data line DL may be turned on, and the scan signal may be supplied to the pixels PXL of a horizontal line corresponding to each horizontal period. The pixels PXL that receive the scan signal may be connected to the data lines D1 to Dm to receive the respective data signals during the period in which the scan signal is supplied.

The data driver DD receives a data driving control signal DCS and image data RGB from the timing controller TCON, and supplies the data signals to the data lines DL in correspondence with the data driving control signal DCS and the image data RGB. The data signals supplied to the data lines are supplied to the pixels PXL selected by the respective scan signals. The pixels PXL that receive the data signal emit light having a desired luminance corresponding to the data signal during the light emission period of each frame. On the other hand, when a data signal corresponding to a black grayscale (e.g., a black grayscale level, a black gray level, or a black gray value) is supplied to the pixel PXL, the pixel PXL may maintain or substantially maintain a non-light emission state even during the light emission period of a corresponding frame.

The timing controller TCON receives various timing signals (for example, a vertical/horizontal synchronization signal, a main clock signal, and/or the like) from the outside (for example, from a host processor), and generates the gate driving control signal GCS and the data driving control signal DCS. The gate driving control signal GCS and the data driving control signal DCS are supplied to the gate driver GD and the data driver DD, respectively.

The gate driving control signal GCS may include at least a scan driving control signal. The scan driving control signal includes a first start pulse and at least one scan clock signal. The first start pulse controls an output timing of a first scan signal (for example, a scan signal supplied to a first scan line), and the scan clock signal is used to shift (e.g., sequentially shift) the first start pulse.

The data driving control signal DCS includes a source sampling pulse, a source sampling clock, and a source output enable signal. The data driving control signal DCS controls a sampling operation of data (e.g., image data).

In addition, the timing controller TCON receives input image data from the outside and rearranges the input image data to generate the image data RGB. The timing controller TCON supplies the image data RGB to the data driver DD. The image data RGB supplied to the data driver DD is used to generate the data signal.

Figure 1B:
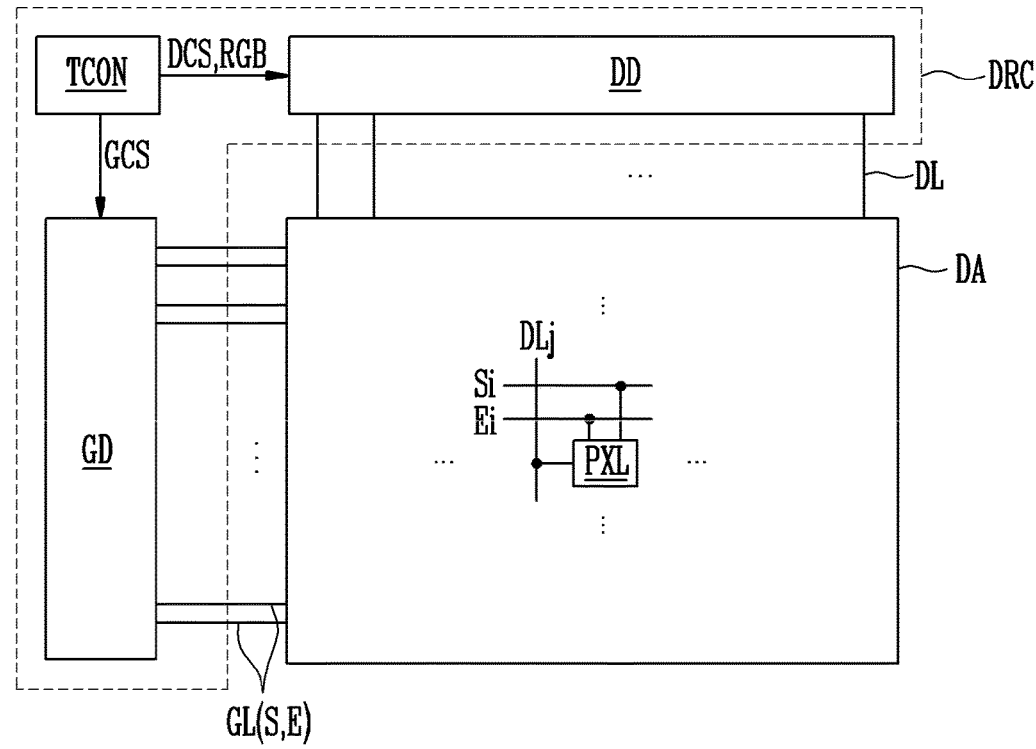

Referring to FIG. 1B, the gate lines GL according to an embodiment of the disclosure may further include light emission control lines E, in addition to (e.g., together with) the scan lines S. For example, the pixel PXL positioned at (e.g., in or on) the i-th horizontal line and the j-th vertical line may be further connected to an i-th light emission control line Ei, in addition to the i-th scan line Si and the j-th data line DLj. The light emission period of the pixel PXL may be controlled by a light emission control signal supplied from the i-th light emission control line Ei. For example, the pixel PXL may maintain or substantially maintain the non-light emission state when a light emission control signal having a gate-off voltage (for example, a high voltage) is supplied from the i-th light emission control line Ei, and may emit light having the desired luminance corresponding to the data signal during other periods (e.g., the other periods in which the light emission control signal is not supplied or the light emission control signal has a gate-on voltage).

In this case, the gate driver GD may further include a light emission control driver for driving the light emission control lines E, in addition to the scan driver for driving the scan lines S. In addition, the gate driving control signal GCS may further include a light emission driving control signal, in addition to the scan driving control signal.

The light emission control driver supplies respective light emission control signals to the light emission control lines E in correspondence with the light emission driving control signal. For example, the light emission control driver may supply (e.g., sequentially supply) the light emission control signals having a gate-off voltage to the light emission control lines E during each frame period in correspondence with the light emission driving control signal. Accordingly, the light emission control driver may include a plurality of light emission control stages.

The light emission control signal may be used to control the light emission period (for example, a light emission time point and/or a light emission duration time) of the pixels PXL. For example, the light emission control signal may have a gate-off voltage at which at least one transistor that is positioned on a current path of each of the pixels PXL may be turned off. In this case, the pixel PXL that receives the light emission control signal may be set to the non-light emission state during the period in which the light emission control signal is supplied, and may be set to a light emission state during the other periods (e.g., during the other periods in which the light emission control signal is not supplied or in which the light emission control signal has a gate-on voltage).

The light emission driving control signal for controlling the light emission control driver includes a second start pulse and at least one light emission clock signal. The second start pulse controls an output timing of a first light emission control signal (for example, a light emission control signal that is supplied to a first light emission control line), and the light emission clock signal is used to shift (e.g., sequentially shift) the second start pulse.

Figure 1C:
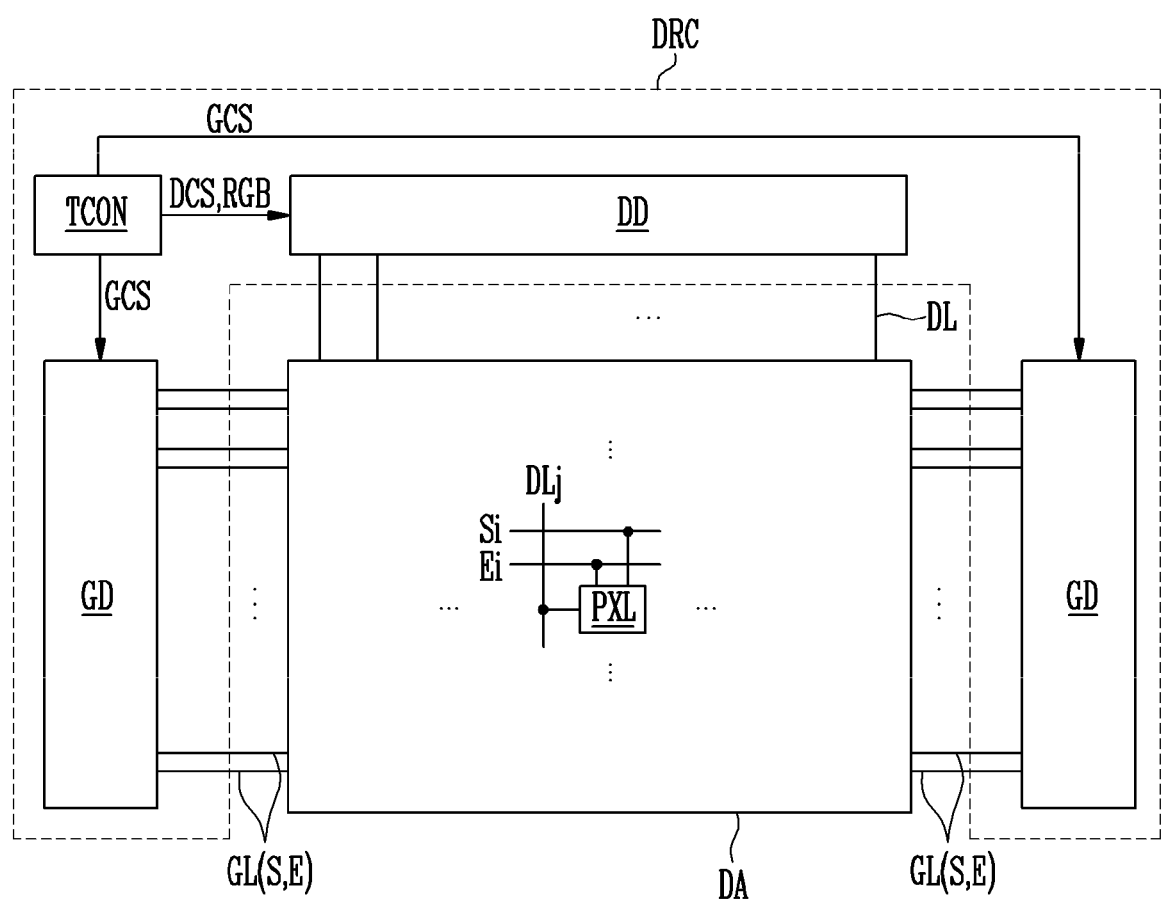

Referring to FIG. 1C, the display device according to an embodiment of the disclosure may include a plurality of gate drivers GD. For example, the display device may include two gate drivers GD that are disposed on sides (e.g., opposite sides) of the display area DA to face each other. Each gate driver GD may include the scan driver and/or the light emission control driver.

In an embodiment, the plurality of gate drivers GD may have the same or substantially the same configuration as each other, and may be connected to ends (e.g., both ends or opposite ends) of each of the gate lines GL. In this case, each gate line GL may receive a gate signal from both ends of the gate line GL concurrently (e.g., simultaneously). For example, each scan line S may receive the scan signal concurrently (e.g., simultaneously) from two scan stages connected to respective ends of the scan line S, and each light emission control line E may receive the light emission control signal concurrently (e.g., simultaneously) from two light emission control stages connected to respective ends of the light emission control line E. In this case, even though the display device is enlarged (e.g., is a large screen display device), a delay of the gate signals may be reduced or minimized.

In another embodiment, the gate drivers GD may be connected to one end of each of different gate lines GL. For example, the gate driver GD that is disposed at one side of the display area DA may be connected to some scan lines S (for example, odd-numbered scan lines) and/or some light emission control lines E (for example, odd-numbered light emission control lines) to drive some of the scan lines S and/or some of the light emission control lines E. In addition, the gate driver GD disposed at another side (e.g., an opposite side) of the display area DA may be connected to other scan lines S (for example, even-numbered scan lines) and/or other light emission control lines (for example, even-numbered light emission control lines) to drive the other scan lines S and/or the other light emission control lines E.

Figure 1D:
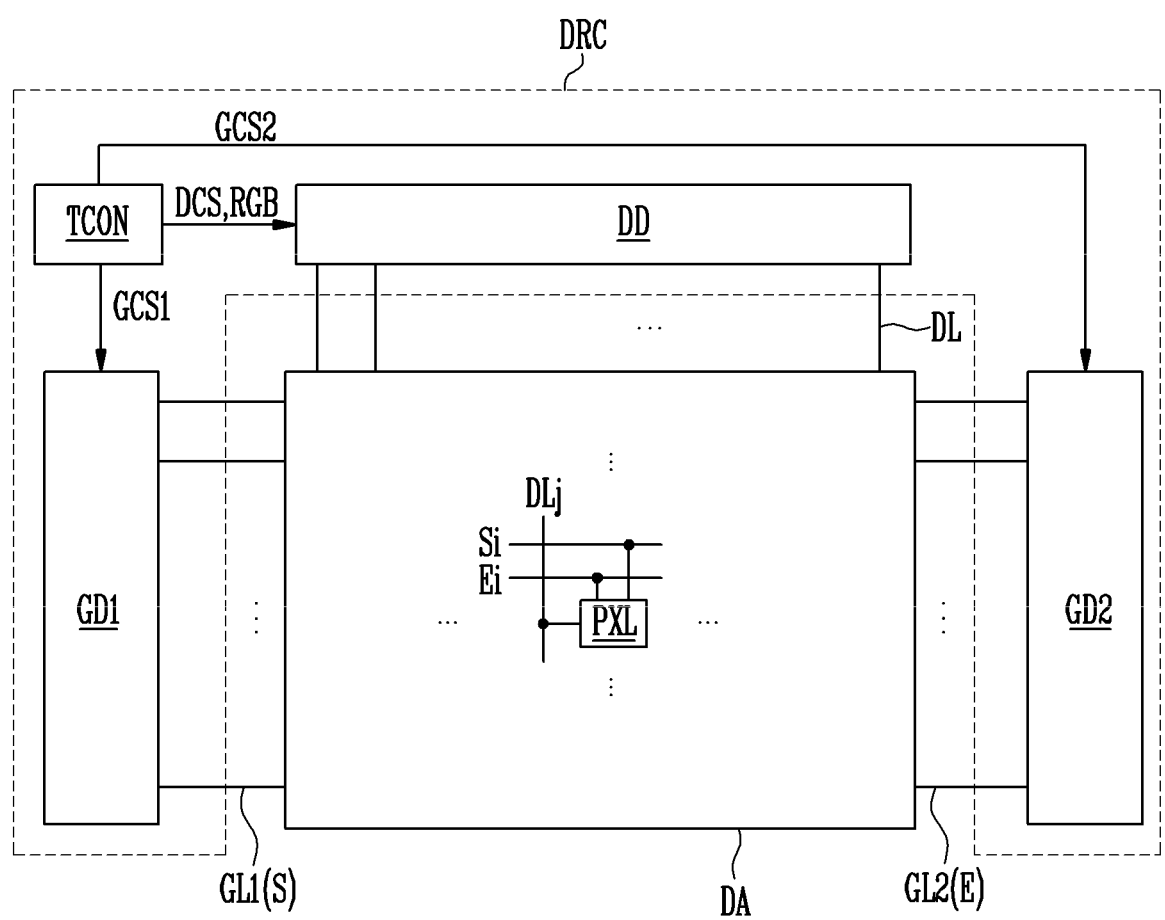

Referring to FIG. 1D, the display device according to an embodiment of the disclosure may include a first gate driver GD1 and a second gate driver GD2 disposed at (e.g., on) different sides (e.g., opposite sides) of the display area DA, and having different circuit configurations from each other. The first gate driver GD1 and the second gate driver GD2 may be connected to first gate lines GL1 (for example, the scan lines S) and second gate lines GL2 (for example, the light emission control lines E), respectively.

In an embodiment, the first gate driver GD1 may be disposed at (e.g., on) one side of the display area DA, and may drive the first gate lines GL1 in correspondence with a first gate driving control signal GCS1 that is supplied from the timing controller TCON. The first gate lines GL1 may include (or may be) the scan lines S, and the first gate driving control signal GCS1 may include (or may be) the scan driving control signal. In this case, the first gate driver GD1 may include (e.g., or may be configured with) a scan driver including one or more scan stages connected to each scan line S. The second gate driver GD2 may be disposed at (e.g., on) another side (e.g., an opposite side of the one side) of the display area DA, and may drive the second gate lines GL2 in correspondence with a second gate driving control signal GCS2 that is supplied from the timing controller TCON. The second gate lines GL2 may include (or may be) the light emission control lines E, and the second gate driving control signal GCS2 may include (or may be) the light emission driving control signal. In this case, the second gate driver GD2 may include (e.g., or may be configured with) a light emission control driver including one or more light emission control stages connected to each light emission control line E.

According to one or more of the above-described embodiments, the display device may have various suitable structures, and a method of driving the display device may be variously modified (e.g., according to the structure of the display device). However, the disclosure is not limited to the structures and/or driving methods described above, and a structure and/or a driving method of the display device may be variously modified to have any suitable structure and/or any suitable driving method as would be understood by those skilled in the art, in addition to any of those of the above-described embodiments.

Figure 2A:
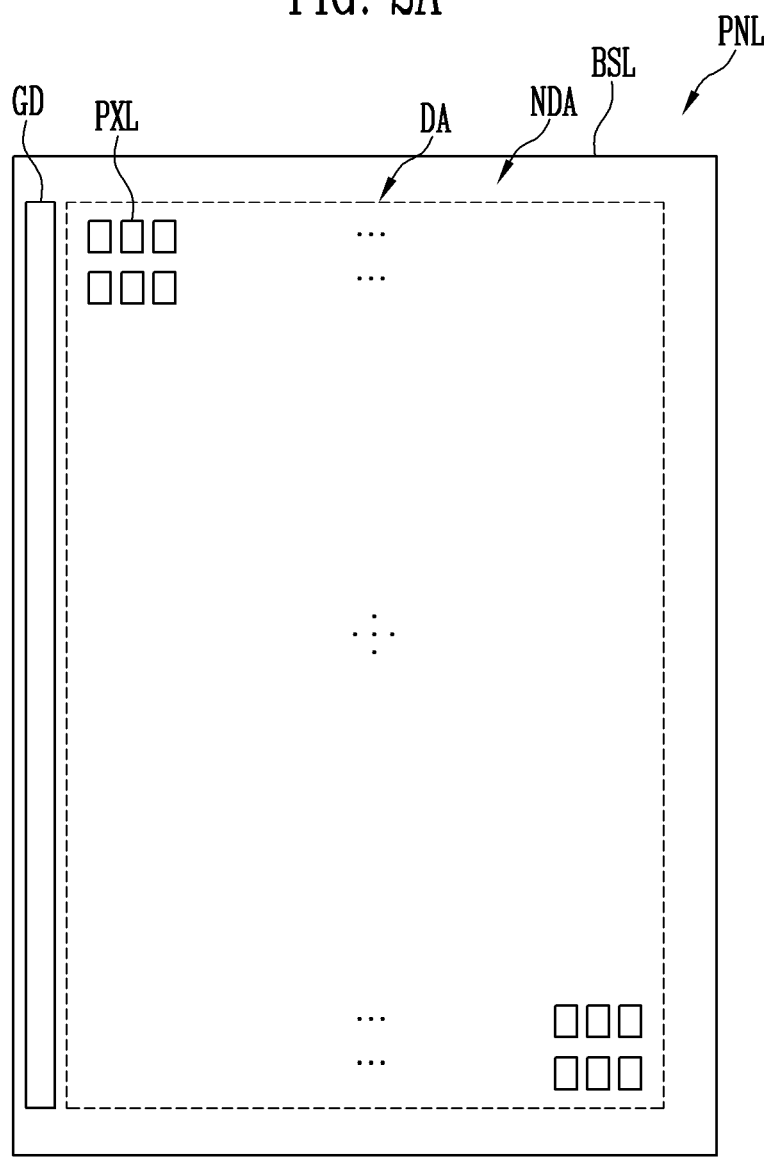
FIGS. 2A-2B illustrate various examples of display panels according to embodiments of the disclosure.
Figure 2B:
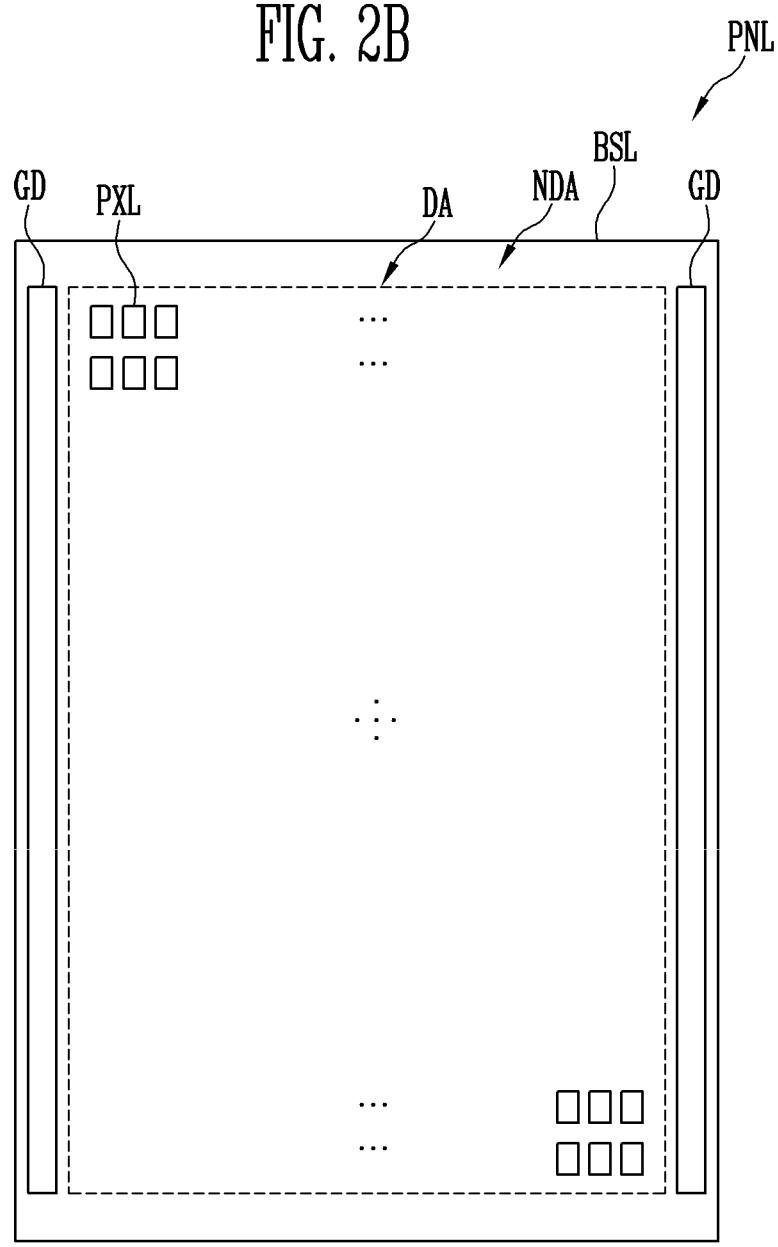

FIGS. 2A and 2B illustrate various examples of display panels PNL according to embodiments of the disclosure. For example, FIGS. 2A and 2B illustrate different embodiments from each other of the display panel PNL, which may be included in any of the display devices of FIGS. 1A to 1D. In particular, FIGS. 2A and 2B illustrate different embodiments of the display panel PNL including the gate driver GD.

Referring to FIGS. 2A and 2B, the display panel PNL according to an embodiment of the disclosure includes a base layer BSL including a display area DA and a non-display area NDA, the pixels PXL disposed at (e.g., in or on) the display area DA of the base layer BSL, and the gate driver GD disposed at (e.g., in or on) the non-display area NDA of the base layer BSL and positioned around (e.g., adjacent to) the pixels PXL. In an embodiment, the display area DA may be disposed at (e.g., in or on) a center area (or a central area) of the display panel PNL, and the non-display area NDA may be disposed outside of the display panel PNL to surround (e.g., around a periphery of) the display area DA. However, a position, a size, and/or the like of the display area DA may be variously modified from those shown in FIGS. 2A and 2B, according to an embodiment.

The base layer BSL may configure a base member of the display panel PNL. The base layer BSL may include (or may be) a rigid substrate or film, or a flexible substrate or film, but a material and/or a physical property thereof are not particularly limited. For example, the base layer BSL may include (or may be) a rigid substrate formed of glass or tempered glass, a flexible substrate (or a flexible thin film) including a plastic or metal material, an insulating film including at least one layer, and/or the like, but the material and/or the physical property thereof are not limited thereto.

In addition, the base layer BSL may be transparent or substantially transparent, but the disclosure is not limited thereto. For example, the base layer BSL may be a transparent base member, a translucent base member, an opaque base member, and/or a reflective base member.

The plurality of pixels PXL may be disposed at (e.g., in or on) the display area DA. For example, the plurality of pixels PXL may be arranged (e.g., regularly arranged) at (e.g., in or on) the display area DA according to a stripe or pentile array structure. However, an arrangement structure of the pixels PXL is not limited thereto, and the pixels PXL may be arranged at (e.g., in or on) the display area DA according to various suitable structures (e.g., disposition structures) and/or methods. The display area DA configures a screen (e.g., a display screen) at or on which an image is displayed.

Various lines (e.g., signal lines, power lines, and/or the like) and/or internal circuits that are connected to the pixels PXL of the display area DA may be disposed at (e.g., in or on) the non-display area NDA. For example, at least one gate driver GD and various power lines and/or signal lines may be disposed at (e.g., in or on) the non-display area NDA.

In an embodiment, the display panel PNL may include a single gate driver GD disposed at (e.g., on) one side (for example, a left side or a right side) of the display area DA as shown in FIG. 2A. In another embodiment, the display panel PNL may include a plurality of gate drivers GD disposed at (e.g., on) two sides (for example, the left side and the right side) of the display area DA as shown in FIG. 2B. For example, as shown in FIG. 2B, the plurality of gate drivers GD may be disposed at opposite sides of the display area DA. According to an embodiment, the plurality of gate drivers GD may be disposed to face each other with the display area DA interposed therebetween, and may have the same or substantially the same circuit configurations as each other or may have different circuit configurations from each other.

Figure 3A:
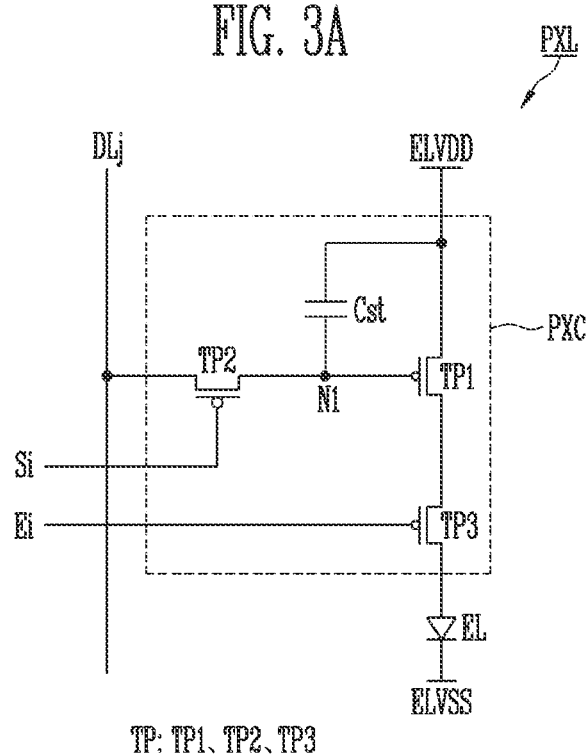
FIGS. 3A-3C illustrate various examples of pixels according to embodiments of the disclosure.
Figure 3B:
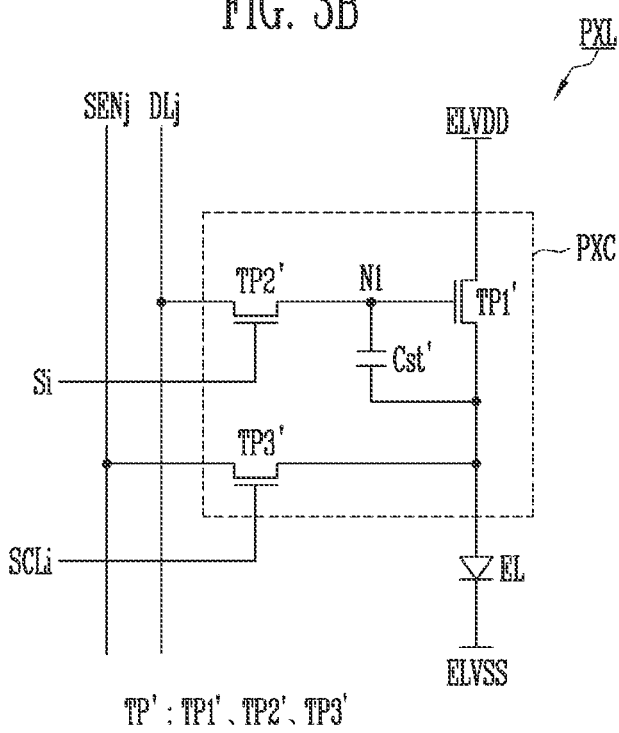
Figure 3C:
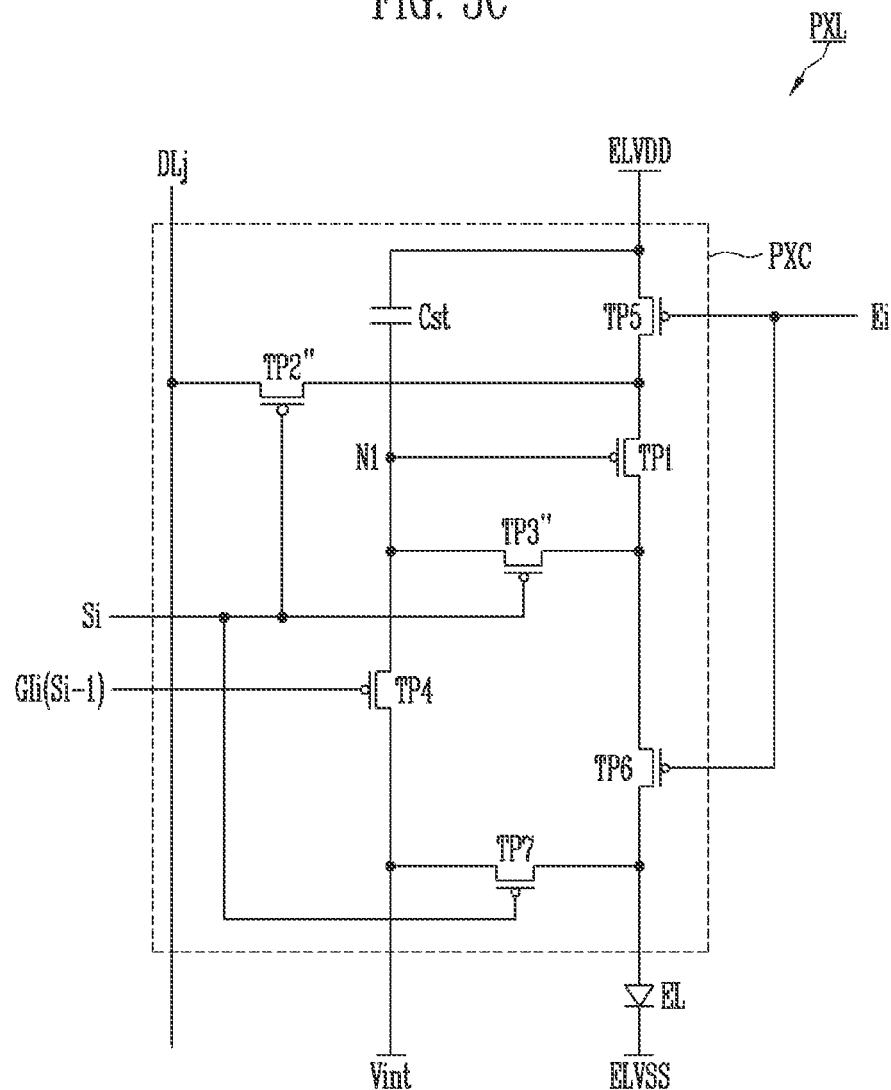

FIGS. 3A to 3C illustrate various examples of pixels PXL according to embodiments of the disclosure. For example, FIGS. 3A to 3C illustrate different embodiments from each other of the pixel PXL, which may be disposed at (e.g., in or on) any of the display areas DA shown in FIGS. 1A to 2B.

According to an embodiment, FIGS. 3A to 3C disclose different embodiments from each other of the pixel PXL that may be included in a light emitting display device. However, the disclosure is not limited to the light emitting display device, and the pixel PXL may be a pixel that is included in any suitable display device having various suitable structures and/or various suitable driving methods as would be known to those skilled in the art.

FIGS. 3A to 3C show an arbitrary pixel (e.g., an example pixel or a representative pixel) PXL that is disposed at (e.g., in or on) the i-th horizontal line and the j-th vertical line of the display area DA, and other pixels PXL that are disposed at (e.g., in or on) the display area DA may have the same or substantially the same (e.g., or similar) structure as those of the pixel PXL shown in any of FIGS. 3A to 3C. For example, in an embodiment, the pixels PXL disposed at (e.g., in or on) the display area DA may have the same or substantially the same structure as each other, or at least some of the pixels PXL disposed at (e.g., in or on) the display area DA may have different structures from each other. Referring to FIGS. 3A to 3C, the pixel PXL may be connected to the i-th scan line Si and the j-th data line DLj, and according to various embodiments, the pixel PXL may further be selectively connected to at least one of an i-th light emission control line Ei, an i-th initialization control line Gli, an i-th sensing control line SCLi, and/or a j-th sensing line SENj. For convenience of description, the "i-th scan line Si", the "j-th data line DLj", the "i-th light emission control line Ei", the "i-th initialization control line Gli", the "i-th sensing control line SCLi", and the "j-th sensing line SENj" may be referred to simply as a "scan line Si", a "data line DLj", a "light emission control line Ei", an "initialization control line Gli", a "sensing control line SCLi", and a "sensing line SENj", respectively.

Referring to FIG. 3A, according to an embodiment of the disclosure, the pixel PXL includes a light emitting element EL, and a pixel circuit PXC for driving the light emitting element EL. According to an embodiment, the light emitting element EL may be connected between the pixel circuit PXC and a second pixel power (e.g., a second pixel power source) ELVSS, but a position of the light emitting element EL is not limited thereto. For example, in another embodiment, the light emitting element EL may be connected between a first pixel power (e.g., a first pixel power source) ELVDD and the pixel circuit PXC.

The light emitting element EL is connected between the first pixel power ELVDD and the second pixel power ELVSS in a forward direction (e.g., in a forward-bias direction). For example, an anode electrode of the light emitting element EL may be connected to the first pixel power ELVDD through the pixel circuit PXC, and a cathode electrode of the light emitting element EL may be connected to the second pixel power ELVSS. The first pixel power ELVDD and the second pixel power ELVSS may have a potential difference (e.g., a difference in power or voltage levels) that enables (e.g., allows) the light emitting element EL to emit light. For example, the first pixel power ELVDD may be a high potential pixel power, and the second pixel power ELVSS may be a low potential pixel power having a potential that is less than that of the first pixel power ELVDD by a threshold voltage or greater of the light emitting element EL.

The pixel circuit PXC is connected to the scan line Si, the light emission control line Ei, and the data line DLj. The pixel circuit PXC includes a first pixel transistor TP1, a second pixel transistor TP2, a third pixel transistor TP3, and a storage capacitor Cst.

For convenience, in describing the embodiment of FIG. 3A, the first, second, and third pixel transistors TP1, TP2, and TP3 may be referred to as "first, second, and third transistors TP1, TP2, and TP3", respectively. In addition, when referring to a particular (or a specific) transistor from among the first, second, and third transistors TP1, TP2, and TP3, the particular transistor may be referred to as the "first transistor TP1", the "second transistor TP2", or the "third transistor TP3" as appropriate. On the other hand, when arbitrarily referring to at least one of the first, second, and third transistors TP1, TP2, and TP3, or when collectively referring to at least two of (or each of) the first, second, and third transistors TP1, TP2, and TP3, the at least one of the first, second, and third transistors TP1, TP2, and TP3 or the collective ones of the first, second, and third transistors TP1, TP2, and TP3 may be referred to as a "pixel transistor TP" or "pixel transistors TP" as appropriate.

The first transistor TP1 is connected between the first pixel power ELVDD and the light emitting element EL. For example, a first electrode (e.g., a source electrode) of the first transistor TP1 may be connected to the first pixel power ELVDD, and a second electrode (e.g., a drain electrode) of the first transistor TP1 may be connected to the anode electrode of the light emitting element EL through the third transistor TP3. In addition, a gate electrode of the first transistor TP1 is connected to a first node N1. The first transistor TP1 controls a driving current flowing from the first pixel power ELVDD to the second pixel power ELVSS through the third transistor TP3 and the light emitting element EL in correspondence with a voltage of the first node N1. In other words, the first transistor TP1 may be a driving transistor of the pixel PXL.

The second transistor TP2 is connected between the data line DLj and the first node N1. For example, a first electrode (e.g., a source electrode) of the second transistor TP2 may be connected to the data line DLj, and a second electrode (e.g., a drain electrode) of the second transistor TP2 may be connected to the first node N1. In addition, a gate electrode of the second transistor TP2 is connected to the scan line Si. The second transistor TP2 is turned on when a scan signal having a gate-on voltage (e.g., a low voltage) is supplied to the scan line Si to transfer a data signal supplied from the data line DLj to the first node N1.

The third transistor TP3 is connected between the first transistor TP1 and the light emitting element EL. For example, a first electrode (e.g., a source electrode) of the third transistor TP3 may be connected to the second electrode of the first transistor TP1, and a second electrode (e.g., a drain electrode) of the third electrode TP3 may be connected to the anode electrode of the light emitting element EL. A gate electrode of the third transistor TP3 is connected to the light emission control line Ei. The third transistor TP3 is turned off when a light emission control signal having a gate-off voltage (e.g., a high voltage) is supplied to the light emission control line Ei, and turned on in other cases (e.g., when the supply of the light emission control signal is stopped and/or a voltage of the light emission control line Ei is maintained or substantially maintained as a gate-on voltage).

When the third transistor TP3 is turned off, the connection between the first transistor TP1 and the light emitting element EL is disconnected (e.g., cut off), and thus, the pixel PXL does not emit light as a current path is blocked in the pixel PXL. On the other hand, when the third transistor TP3 is turned on, the first transistor TP1 and the light emitting element EL are connected to each other, and thus, the pixel PXL is set to a state (e.g., a light-emission state) in which the pixel PXL may emit light as a current path through which a driving current may flow is formed in the pixel PXL.

The storage capacitor Cst is connected between the first pixel power ELVDD and the first node N1. The storage capacitor Cst charges (e.g., stores) the voltage (e.g., a voltage corresponding to a data signal) corresponding to the voltage of the first node N1.

While the pixel transistors TP are shown as P-type transistors in FIG. 3A, the disclosure is not limited thereto. For example, in another embodiment, at least one pixel transistor TP may be an N-type transistor. In this case, a gate-on voltage for turning on the at least one pixel transistor TP (e.g., the N-type transistor) may be a high voltage. In addition, when the first transistor TP1 is a P-type transistor, the pixel PXL may emit light at a higher luminance as a data signal having a lower voltage is supplied, and when the first transistor TP1 is an N-type transistor, the pixel PXL may emit light at a higher luminance as a data signal having a higher voltage is supplied.

However, the disclosure is not limited to the structure of the pixel PXL shown in FIG. 3A, and the structure of the pixel PXL may be variously modified according to an embodiment. For example, the structure of the pixel circuit PXC may be modified as shown in the embodiment of FIG. 3B or the embodiment of FIG. 3C. In addition, the pixel circuit PXC may be configured according to various suitable pixel circuits having various suitable structures and/or various suitable driving methods as known to those skilled in the art.

Referring to FIG. 3B, according to an embodiment of the disclosure, the pixel circuit PXC is connected to the scan line Si, the data line DLj, the sensing control line SCLi, and the sensing line SENj. The pixel circuit PXC includes a first pixel transistor TP1', a second pixel transistor TP2', a third pixel transistor TP3', and a storage capacitor Cst'. However, the disclosure is not limited thereto, and in another embodiment, the sensing line SENj may be omitted, and a characteristic of each pixel PXL may be detected through the data line DLj.

For convenience, in describing the embodiment of FIG. 3B, the first, second, and third pixel transistors TP1', TP2', and TP3' may be referred to as "first, second, and third transistors TP1', TP2', and TP3'", respectively. In addition, when referring to a particular (or a specific) transistor from among the first, second, and third transistors TP1', TP2', and TP3', the particular transistor may be referred to as the "first transistor TP1'", the "second transistor TP2'", or the "third transistor TP3'" as appropriate. On the other hand, when arbitrarily referring to at least one of the first, second, and third transistors TP1', TP2', and TP3', or when collectively referring to at least two of (or each of) the first, second, and third transistors TP1', TP2', and TP3', the at least one of the first, second, and third transistors TP1', TP2', and TP3' or the collective ones of the first, second, and third transistors TP1', TP2', and TP3' may be referred to as a "pixel transistor TP'" or "pixel transistors TP'" as appropriate. In addition, in describing the embodiment of FIG. 3B, redundant description of the same or substantially the same (e.g., or similar) configuration as that of the embodiment of FIG. 3A may not be repeated. In the present embodiment, each pixel transistor TP' may be an N-type transistor, but the disclosure is not limited thereto.

The first transistor TP1' may be a driving transistor of the pixel PXL, and is connected between the first pixel power supply ELVDD and the light emitting element EL to control the driving current of the pixel PXL in correspondence with the voltage of the first node N1. In this case, a gate electrode of the first transistor TP1' may be connected to the first node N1. In an embodiment, when the first transistor TP1' is an N-type transistor, a first electrode of the first transistor TP1' that is connected to the first pixel power ELVDD may be a drain electrode, and a second electrode of the first transistor TP1' that is connected to the light emitting element EL may be a source electrode. In this case, the storage capacitor Cst' may be connected between the first node N1 and the second electrode of the first transistor TP1'.

The second transistor TP2' is connected between the data line DLj and the first node N1. The second transistor TP2' is turned on when a scan signal having a gate-on voltage (for example, a high voltage) is supplied from the scan line Si to transfer the data signal supplied from the data line DLj to the first node N1. Accordingly, a gate electrode of the second transistor TP2' may be connected to the scan line Si.

The third transistor TP3' is connected between the second electrode of the first transistor TP1' and the sensing line SENj. On the other hand, when the sensing line SENj is omitted and the characteristic of each pixel PXL is detected through the data line DLj, the third transistor TP3' may be connected between the second electrode of the first transistor TP1' and the data lines DLj.

A gate electrode of the third transistor TP3' is connected to the sensing control line SCLi. The third transistor TP3' is turned on by a sensing control signal having a gate-on voltage (for example, a high voltage) that is supplied to the sensing control line SCLi during a sensing period (e.g., a predetermined sensing period) to connect the sensing line SENj and the first transistor TP1' to each other.

According to an embodiment, the sensing period may include (or may be) a period for extracting the characteristic (for example, a threshold voltage or the like of the first transistor TP1') of each of the pixels PXL disposed at (e.g., in or on) the display area DA. During the sensing period, the first transistor TP1' may be turned on by supplying a suitable reference voltage (e.g., a predetermined reference voltage) at which the first transistor TP1' may be turned on to the first node N1 through the data line DLj and the second transistor TP2', or by connecting each pixel PXL to a current source or the like. In addition, the first transistor TP1' may be connected to the sensing line SENj by turning on the third transistor TP3' by supplying a sensing control signal having a gate-on voltage to the sensing control line SCLi. Thereafter, a sensing signal is obtained from each pixel PXL through the sensing line SENj, and the characteristic of each pixel PXL, including the threshold voltage or the like of the first transistor TP1', may be detected through (e.g., using) the sensing signal.

The characteristic detected from the pixels PXL during each sensing period may be used to convert the image data so that a characteristic deviation between the pixels PXL disposed at (e.g., in or on) the display area DA may be compensated. In other words, the display device including the pixel PXL according to the embodiment of FIG. 3B may detect the characteristic from each pixel PXL, and may improve image quality by applying an external compensation method that changes the data (e.g., the image data) in correspondence with the characteristic.

Referring to FIG. 3C, according to an embodiment of the disclosure, the pixel circuit PXC is connected to the scan line Si, the data line DLj, the light emission control line Ei, and the initialization control line Gli. The pixel circuit PXC includes first, second, third, fourth, fifth, sixth, and seventh pixel transistors TP1, TP2", TP3", TP4, TP5, TP6, and TP7, and the storage capacitor Cst.

For convenience, in describing the embodiment of FIG. 3C, the first, second, third, fourth, fifth, sixth, and seventh pixel transistors TP1, TP2", TP3", TP4, TP5, TP6, and TP7 may be referred to as "first, second, third, fourth, fifth, sixth, and seventh transistors TP1, TP2", TP3", TP4, TP5, TP6 and TP7", respectively. In addition, when referring to a particular (or a specific) transistor from among the first to seventh transistors TP1, TP2", TP3", TP4, TP5, TP6, and TP7, the particular transistor may be referred to as the "first, second, third, fourth, fifth, sixth, or seventh transistor TP1, TP2", TP3", TP4, TP5, TP6, or TP7" as appropriate. On the other hand, when arbitrarily referring to at least one of the first to seventh transistors TP1, TP2", TP3", TP4, TP5, TP6, and TP7, or when collectively referring to at least two of (or each of) the first to seventh transistors TP1, TP2", TP3", TP4, TP5, TP6, and TP7, the at least one of the first to seventh transistors TP1, TP2", TP3", TP4, TP5, TP6, and TP7, or the collective ones of the first to seventh transistors TP1, TP2", TP3", TP4, TP5, TP6, and TP7 may be referred to as a "pixel transistor TP" or "pixel transistors TP" as appropriate. In addition, in describing the embodiment of FIG. 3C, redundant description of the same or substantially the same (e.g., or similar) configuration as those of the above-described embodiments (for example, the embodiment of FIG. 3A) may not be repeated. According to an embodiment, each pixel transistor TP may be a P-type transistor, but the present disclosure is not limited thereto.

The first electrode of the first transistor TP1 may be connected to the first pixel power ELVDD through the fifth transistor TP5, and the second electrode of the first transistor TP1 may be connected to the anode electrode of the light emitting element EL through the sixth transistor TP6. In addition, the gate electrode of the first transistor TP1 is connected to the first node N1. The first transistor TP1 controls a driving current flowing from the first pixel power ELVDD to the second pixel power ELVSS through the light emitting element EL in correspondence with the voltage of the first node N1.

A first electrode of the second transistor TP2" is connected to the data line DLj, and a second electrode of the second transistor TP2" is connected to the first electrode of the first transistor TP1. The second electrode of the second transistor TP2" is connected to the first node N1 through the first transistor TP1 and the third transistor TP3". In addition, a gate electrode of the second transistor TP2" is connected to the scan line Si. The second transistor TP2" is turned on when a scan signal having a gate-on voltage is supplied to the scan line Si to connect the data line DLj and the first electrode of the first transistor TP1 to each other. Therefore, when the second transistor TP2" is turned on, the data signal from the data line DLj may be transferred to the first electrode of the first transistor TP1. In addition, during a period in which the second transistor TP2" is turned on by the scan signal, the first transistor TP1 is turned on in a diode-connected form by the third transistor TP3". In other words, during the period in which the second transistor TP2" is turned on, the third transistor TP3" may also be turned on to diode-connect the first transistor TP1. Therefore, the data signal from the data line DLj may be transferred to the first node N1 through the second transistor TP2", the first transistor TP1, and the third transistor TP3". Then, the storage capacitor Cst charges a voltage corresponding to the data signal and the threshold voltage of the first transistor TP1.

The third transistor TP3" is connected between the first transistor TP1 and the first node N1. In addition, a gate electrode of the third transistor TP3" is connected to the scan line Si. The third transistor TP3" is turned on when a scan signal having a gate-on voltage is supplied to the scan line Si to connect the second electrode of the first transistor TP1 and the first node N1 to each other. Therefore, when the third transistor TP3" is turned on, the first transistor TP1 is connected in a diode form (e.g., is diode-connected).

The fourth transistor TP4 is connected between the first node N1 and an initialization power (e.g., an initialization power source) Vint. In addition, a gate electrode of the fourth transistor TP4 is connected to the initialization control line Gli. The fourth transistor TP4 is turned on when an initialization control signal having a gate-on voltage is supplied to the initialization control line Gli to connect the first node N1 to the initialization power Vint.

In an embodiment, the initialization control line Gli may include (or may be) one from among previous scan lines. For example, the initialization control line Gli may be an (i−1)-th scan line Si−1. In this case, the fourth transistor TP4 is turned on when a scan signal having a gate-on voltage is supplied to the (i−1)-th scan line Si−1 to initialize the voltage of the first node N1 to a voltage of the initialization power Vint. On the other hand, the initialization control line Gli is not limited to any one of the previous scan lines, and the initialization control line Gli may be variously modified according to an embodiment. For example, in another embodiment, another kind of control line that is driven separately from the scan lines S may be formed at (e.g., in or on) the display area DA and used as the initialization control line Gli.

According to an embodiment, the voltage of the initialization power Vint may be set to be less than or equal to the voltage of the data signal. For example, the voltage of the initialization power Vint may be set to be less than or equal to a lowest voltage of the data signal. Therefore, when the voltage of the first node N1 is initialized to the voltage of the initialization power Vint prior to transferring the data signal of a current frame to each pixel PXL, the first transistor TP1 may be diode-connected in a forward direction (e.g., a forward-bias direction) during a period in which the scan signal of the current frame is supplied, regardless of a data signal of a previous frame. Therefore, the data signal may be stably transferred to the first node N1 of each of the pixels PXL selected by the scan signal during a period in which the scan signal of each frame is supplied.

The fifth transistor TP5 is connected between the first pixel power ELVDD and the first transistor TP1. In addition, a gate electrode of the fifth transistor TP5 is connected to the light emission control line Ei. The fifth transistor TP5 is turned off when a light emission control signal having a gate-off voltage is supplied to the light emission control line Ei, and is turned on in other cases (e.g., when the light emission control signal is not supplied, or when the light emission control signal having a gate-on voltage is supplied).

The sixth transistor TP6 is connected between the first transistor TP1 and the light emitting element EL. In addition, a gate electrode of the sixth transistor TP6 is connected to the light emission control line Ei. The sixth transistor TP6 is turned off when the light emission control signal having the gate-off voltage is supplied to the light emission control line Ei, and is turned on in other cases (e.g., when the light emission control signal is not supplied, or when the light emission control signal having a gate-on voltage is supplied).

In other words, the fifth and sixth transistors TP5 and TP6 may be turned on or turned off concurrently (e.g., simultaneously) with each other by the light emission control signal. When the fifth and sixth transistors TP5 and TP6 are turned on, a current path through which a driving current may flow is formed in the pixel PXL. On the other hand, when the fifth and sixth transistors TP5 and TP6 are turned off, the current path is blocked (e.g., or disconnected) and the pixel PXL does not emit light.

The seventh transistor TP7 is connected between the initialization power Vint and the anode electrode of the light emitting element EL. In addition, a gate electrode of the seventh transistor TP7 is connected to the scan line Si. The seventh transistor TP7 is turned on when a scan signal having a gate-on voltage is supplied to the scan line Si to initialize an anode voltage of the light emitting element EL to the voltage of the initialization power Vint. Therefore, each pixel PXL may exhibit a uniform or substantially uniform luminance characteristic during the light emission period of each frame, regardless of a light emission luminance of the previous frame.

While FIG. 3C shows an embodiment in which the gate electrode of the seventh transistor TP7 is connected to the scan line Si, the disclosure is not limited thereto. For example, in another embodiment, the gate electrode of the seventh transistor TP7 may be connected to any suitable one of next scan lines (for example, an (i+1)-th scan line Si+1), or the gate electrode of the seventh transistor TP7 may be connected to another kind of control line that is formed separately from the scan lines S to be driven.

The storage capacitor Cst is connected between the first pixel power ELVDD and the first node N1. The storage capacitor Cst charges a voltage corresponding to the data signal and the threshold voltage of the first transistor TP1.

As described above, according to one or more embodiments, the pixel PXL may include the pixel circuit PXC having various suitable structures and/or various suitable driving methods. However, the kind (or type), structure, and/or driving method of the pixel PXL are not limited to the above-described embodiments. For example, in another embodiment of the disclosure, each pixel PXL may be configured for (e.g., or configured inside of) a passive light emitting display device or the like. In this case, the pixel circuit PXC may be omitted, and the light emitting element EL may be connected to (e.g., directly connected to) the scan line Si, the data line Dj, a first pixel power line, a second pixel power line, other wires, and/or the like. In addition, in another embodiment of the disclosure, the display device may include a separate light source unit (e.g., a separate light source or a separate light source device) such as a backlight unit (e.g., a backlight source or a backlight device). In this case, the pixel (e.g., each pixel) PXL may not include the light emitting element EL or the like.

Figure 4:
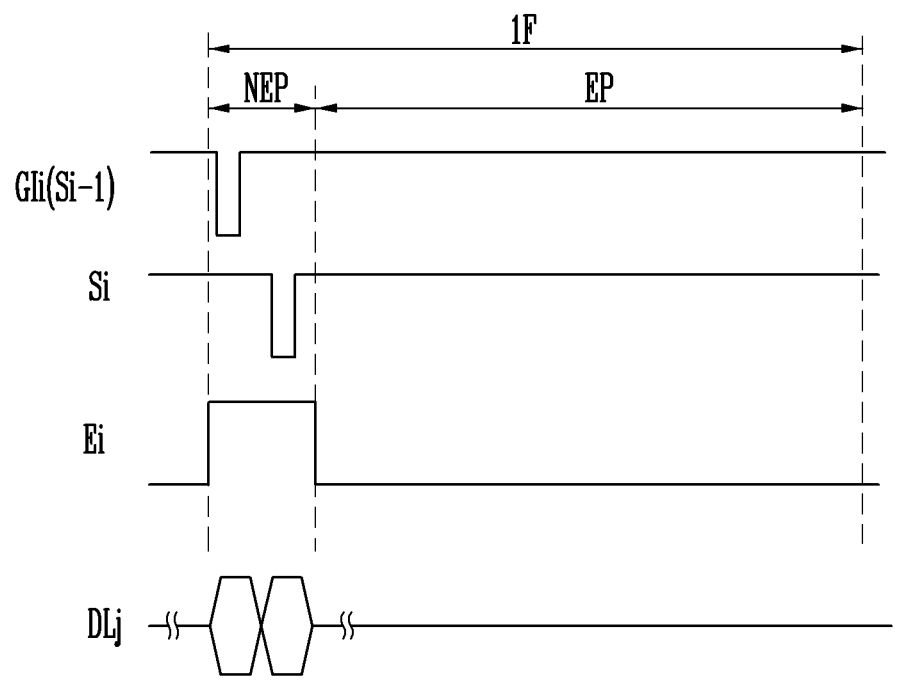
FIG. 4 illustrates a driving method of the pixel according to an embodiment of the disclosure.

FIG. 4 illustrates a driving method of the pixel PXL according to an embodiment of the disclosure. For example, FIG. 4 illustrates an exemplary waveform of driving signals that may be supplied to signal lines connected to the pixel PXL to drive the pixel PXL of FIG. 3C.

Referring to FIGS. 3C and 4, one frame period 1F may include a non-light emission period NEP and a light emission period EP. The non-light emission period NEP of each frame period 1F may be a period during which the light emission control signal having the gate-off voltage is supplied to the light emission control line Ei of the pixel PXL, and the scan signal having the gate-on voltage may be sequentially supplied to the initialization control line Gli (for example, the (i−1)-th scan line Si−1) and the scan line Si connected to the pixel PXL.

When the light emission control signal having the gate-off voltage is supplied to the light emission control line Ei, the fifth and sixth transistors TP5 and TP6 are turned off. Therefore, the current path through which the driving current may flow in the pixel PXL is blocked (or disconnected), and thus, the pixel PXL may be set to the non-light emission state.

When an initialization control signal (for example, the previous scan signal) having the gate-on voltage is supplied to the initialization control line Gli, the fourth transistor TP4 is turned on. Therefore, the first node N1 is initialized to the voltage of the initialization power Vint.

Following the initialization control signal, when the scan signal having the gate-on voltage is supplied to the scan line Si, each of the second, third, and seventh transistors TP2", TP3", and TP7 is turned on. In addition, the first transistor TP1 is turned on in a diode-connected form by the third transistor TP3".

When the first, second, and third transistors TP1, TP2" and TP3" are turned on, the data signal from the data line DLj may be transferred to the first node N1 through the second transistor TP2", the first transistor TP1, and the third transistor TP3", sequentially. At this time, the voltage corresponding to the data signal and the threshold voltage of the first transistor TP1 (for example, a difference voltage between the voltage of the data signal and the threshold voltage of the first transistor TP1) is transferred to the first node N1, and the voltage transferred to the first node N1 is stored in the storage capacitor Cst.

When the seventh transistor TP7 is turned on, the voltage of the initialization power Vint is transferred to the anode electrode of the light emitting element EL. Therefore, charges that are charged in a parasitic capacitor of the light emitting element EL are initialized during a previous frame period.

The non-light emission period NEP ends when a voltage of the light emission control line Ei is changed to have the gate-on voltage, and the light emission period EP starts following (e.g., after) the non-light emission period NEP. During the light emission period EP, the voltage of the light emission control line Ei is maintained or substantially maintained to have the gate-on voltage. Therefore, each of the fifth and sixth transistors TP5 and TP6 is turned on to form a current path through which the driving current may flow in the pixel PXL.

During the light emission period EP, the first transistor TP1 generates the driving current corresponding to the voltage of the first node N1. The driving current flows from the first pixel power ELVDD to the second pixel power ELVSS through the light emitting element EL. Therefore, the light emitting element EL emits light having a desired luminance corresponding to the driving current.

On the other hand, during the non-light emission period NEP, during a period in which the scan signal having the gate-on voltage is supplied to the scan line Si, when the data signal corresponding to the black grayscale (e.g., a black grayscale level or a black gray level) is supplied to the pixel PXL, the first transistor TP1 does not generate a driving current during a corresponding frame period 1F. In this case, the pixel PXL may maintain or substantially maintain the non-light emission state even during the light emission period EP of the corresponding frame to express a black grayscale (e.g., a grayscale value, a grayscale level, or a gray level corresponding to a black image).

Figure 5:
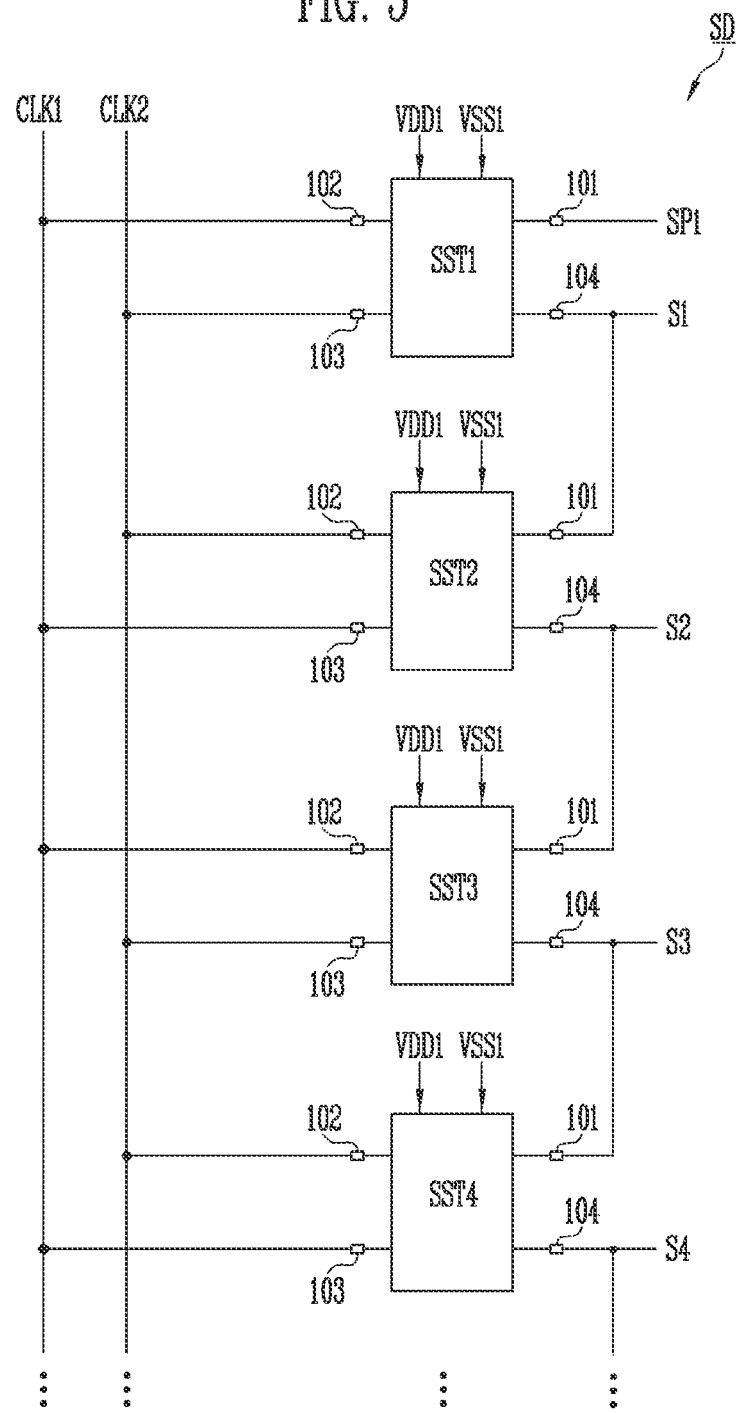
FIG. 5 illustrates a scan driver according to an embodiment of the disclosure.

FIG. 5 illustrates a scan driver SD according to an embodiment of the disclosure. For example, FIG. 5 illustrates an embodiment of the scan driver SD that may be provided in any of the gate drivers GD shown in FIGS. 1A to 2B. For convenience, FIG. 5 shows only four scan stages, for example, first to fourth scan stages SST1 to SST4, but the disclosure is not limited thereto.

Referring to FIG. 5, the scan driver SD according to an embodiment of the disclosure includes a plurality of scan stages to supply respective scan signals to the plurality of scan lines S. For example, the scan driver SD may include a plurality of scan stages that are connected (e.g., dependently connected) to an input terminal of a first start pulse SP1 (for example, a first input terminal 101 of a first scan stage SST1). In the following description, when arbitrarily referring to at least one of the scan stages, or when collectively referring to at least two of (e.g., or each of) the scan stages, the at least one of the scan stages or the collective ones of the scan stages may be referred to as a "scan stage SST" or "scan stages SST" as appropriate.

The scan stages SST output a scan signal to each scan line S, and are driven in correspondence with at least one scan clock signal. For example, the first to fourth scan stages SST1 to SST4 are connected to the first to fourth scan lines S1 to S4, respectively, and generate each scan signal using first and second clock signals CLK1 and CLK2. The first to fourth scan stages SST1 to SST4 may sequentially output a scan signal (e.g., a scan signal having a gate-on voltage) to the first to fourth scan lines S1 to S4. According to an embodiment, the scan stages SST may have the same or substantially the same circuit structure as each other.

Each of the scan stages SST includes a first input terminal 101, a second input terminal 102, a third input terminal 103, and an output terminal 104.

The first input terminal 101 receives a first input signal. According to an embodiment, the first input signal may be the first start pulse SP1 or an output signal of a previous scan stage (e.g., a scan signal of a previous stage). For example, the first scan stage SST1 may receive the first start pulse SP1 through the first input terminal 101, and the other remaining scan stages SST may receive the output signal of the previous scan stage through their respective first input terminals 101. For example, the second scan stage SST2 may receive the output signal of the first scan stage SST1, the third scan stage SST3 may receive the output signal of the second scan stage SST2, the fourth scan stage SST4 may receive the output signal of the third scan stage SST3, and so on.

The second input terminal 102 and the third input terminal 103 receive a second input signal and a third input signal, respectively. According to an embodiment, a second input signal and a third input signal of a k-th (k is an odd number or an even number) scan stage SSTk may be the first clock signal CLK1 and the second clock signal CLK2, respectively. In addition, a second input signal and a third input signal of a (k+1)-th scan stage SSTk+1 may be the second clock signal CLK2 and the first clock signal CLK1, respectively. For example, the k-th scan stage SSTk (e.g., an odd-numbered scan stage) may receive the first clock signal CLK1 and the second clock signal CLK2 through the second input terminal 102 and the third input terminal 103, respectively, and the (k+1)-th scan stage SSTk+1 (e.g., an even-numbered scan stage) may receive the second clock signal CLK2 and the first clock signal CLK1 through the second input terminal 102 and the third input terminal 103, respectively.

The first clock signal CLK1 and the second clock signal CLK2 may alternately have a gate-on voltage. For example, the first clock signal CLK1 and the second clock signal CLK2 may be signals having the same or substantially the same period as each other and phases that do not overlap with each other. For example, the second clock signal CLK2 may be a clock signal having a form in which the first clock signal CLK1 is shifted by a half period.

In addition, the scan stages SST are operated by receiving a first driving power (e.g., a first driving power supply) VDD1 and a second driving power (e.g., a second driving power supply) VSS1. A voltage of the first driving power supply VDD1 may be set to a gate-off voltage (for example, a gate-high voltage) having a suitable level (e.g., a predetermined level), and a voltage of the second driving power supply VSS1 may be set to a gate-on voltage (for example, a gate-low voltage) of a suitable level (e.g., a predetermined level). In this case, the voltage of the second driving power VSS1 that is transferred to the output terminal 104 of each scan stage SST may be used as the scan signal for selecting the pixels PXL.

Figure 6:
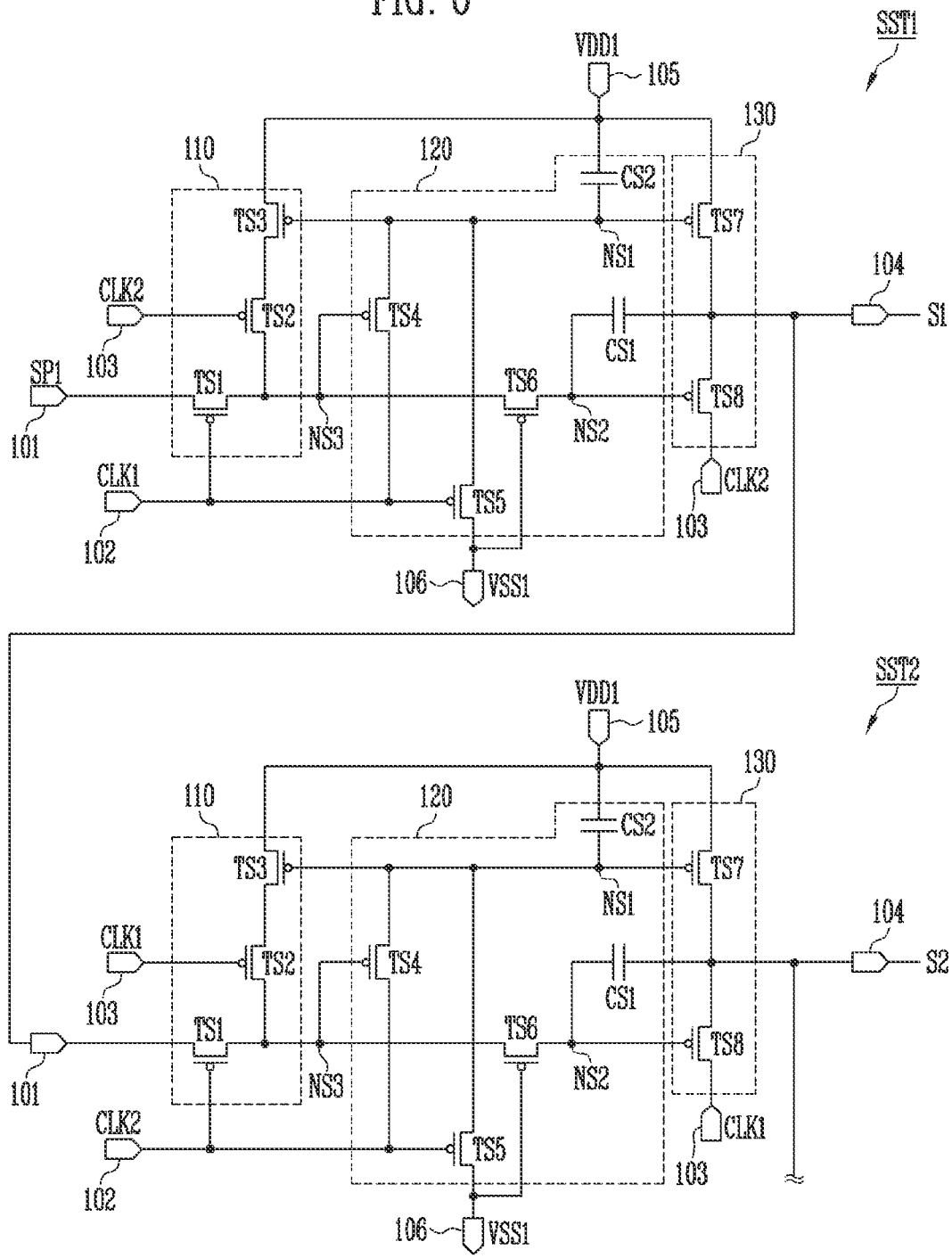
FIG. 6 illustrates scan stages according to an embodiment of the disclosure.

FIG. 6 illustrates scan stages SST according to an embodiment of the disclosure. For example, FIG. 6 illustrates the scan stages SST that may be included in the scan driver SD of FIG. 5, and shows the first scan stage SST1 and the second scan stages SST2 in more detail as a representative of the scan stages SST.

Referring to FIG. 6, each of the scan stages SST according to an embodiment of the disclosure may include an input unit (e.g., an input circuit) 110, a controller 120, and an output unit (e.g., an output circuit) 130 (which may also be referred to as a "buffer unit", a "buffer circuit", and/or an "output buffer"). The scan stage SST generates the scan signal using first, second, and third input signals (also referred to as "first, second, and third scan driving signals", respectively) that are supplied through the first, second, and third input terminals 101, 102, and 103 (also referred to as "first, second, and third scan driving input terminals", respectively), respectively. The scan stage SST supplies the scan signal to the output terminal 104. For example, the scan stage SST may output each scan signal using the first start pulse SP1 or the output signal of the previous scan stage, any one of the first and second clock signals CLK1 and CLK2, and the other one of the first and second clock signals CLK1 and CLK2, which are supplied through the first, second, and third input terminals 101, 102, and 103, respectively.

In addition, the scan stage SST receives the first driving power VDD1 and the second driving power VSS1 through a first power terminal 105 and a second power terminal 106, respectively. The scan stage SST may control a voltage of the output terminal 104 by using the first to third input signals and voltages of the first and second driving power VDD1 and VSS1.

In more detail, the scan stage SST may include first to eighth transistors TS1 to TS8, and first and second capacitors CS1 and CS2. Hereinafter, when arbitrarily referring to at least one of the first to eighth transistors TS1 to TS8, the at least one of the first to eighth transistors TS1 to TS8 may be referred to as a "first driver transistor TS" or "first driver transistors TS" as appropriate. When arbitrarily referring to at least one of the first and second capacitors CS1 and CS2, the least one of the first and second capacitors CS1 and CS2 may be referred to as a "first driver capacitor CS" or "first driver capacitors CS" as appropriate. For convenience, hereinafter, a circuit structure of each scan stage SST will be described with reference to the first scan stage SST1.

The input unit 110 controls a voltage of a third node NS3 in correspondence with the first, second, and third input signals supplied to the first, second, and third input terminals 101, 102, and 103, respectively. For example, the input unit 110 may controls the voltage of the third node NS3 in correspondence with the first start pulse SP1 supplied to the first input terminal 101, the first clock signal CLK1 supplied to the second input terminal 102, and the second clock signal CLK2 supplied to the third input terminal 103. Accordingly, the input unit 110 includes the first, second, and third transistors TS1, TS2, and TS3.

The first transistor TS1 is connected between the first input terminal 101 and the third node NS3, and a gate electrode of the first transistor TS1 is connected to the second input terminal 102. The first transistor TS1 is turned on when the first clock signal CLK1 having a gate-on voltage (for example, a low voltage) is supplied to the second input terminal 102 to connect the first input terminal 101 and the third node NS3 to each other.

The second transistor TS2 and the third transistor TS3 are connected between the third node NS3 and the first driving power VDD1. For example, the second transistor TS2 and the third transistor TS3 may be connected in series between the third node NS3 and the first driving power VDD1.

The second transistor TS2 is connected between the third transistor TS3 and the third node NS3, and a gate electrode of the second transistor TS2 is connected to the third input terminal 103. The second transistor TS2 is turned on when the second clock signal CLK2 having a gate-on voltage (for example, a low voltage) is supplied to the third input terminal 103 to connect the third transistor TS3 and the third node NS3 to each other.

The third transistor TS3 is connected between the second transistor TS2 and the first driving power VDD1, and a gate electrode of the third transistor TS3 is connected to a first node NS1. The third transistor TS3 controls a connection between the second transistor TS2 and the first driving power VDD1 in correspondence with the voltage of the first node NS1.

The controller 120 controls the voltage of the first node NS1 and a voltage of a second node NS2 in correspondence with the second input signal supplied to the second input terminal 102 and the voltage of the third node NS3. For example, the controller 120 may control the voltages of the first node NS1 and the second node NS2 in correspondence with the first clock signal CLK1 supplied to the second input terminal 102 and the voltage of the third node NS3. Accordingly, the controller 120 includes the fourth, fifth, and sixth transistors TS4, TS5, and TS6, and the first and second capacitors CS1 and CS2.

The fourth transistor TS4 is connected between the first node NS1 and the second input terminal 102, and a gate electrode of the fourth transistor TS4 is connected to the third node NS3. The fourth transistor TS4 controls a connection between the first node NS1 and the second input terminal 102 in correspondence with the voltage of the third node NS3.

The fifth transistor TS5 is connected between the first node NS1 and the second power terminal 106, and a gate electrode of the fifth transistor TS5 is connected to the second input terminal 102. The fifth transistor TS5 is turned on when the first clock signal CLK1 having a gate-on voltage is supplied to the second input terminal 102 to connect the first node NS1 to the second power terminal 106. Therefore, when the fifth transistor TS5 is turned on, a low voltage of the second driving power VSS1 is transferred to the first node NS1.

The sixth transistor TS6 is connected between the third node NS3 and the second node NS2, and a gate electrode of the sixth transistor TS6 is connected to the second power terminal 106. The sixth transistor TS6 is turned on by the low voltage of the second driving power VSS1 supplied to the second power terminal 106 to connect the third node NS3 and the second node NS2 to each other. A voltage drop width (e.g., a voltage drop amount) of the third node NS3 may be limited by the sixth transistor TS6. For example, even though the voltage of the second node NS2 drops to a voltage that is less than the voltage of the second driving power VSS1, the voltage of the third node NS3 may not be less than a voltage corresponding to a difference between the voltage of the second driving power VSS1 and a threshold voltage of the sixth transistor TS6 (e.g., a voltage obtained by subtracting the threshold voltage of the sixth transistor TS6 from the voltage of the second driving power VSS1).

The first capacitor CS1 is connected between the second node NS2 and the output terminal 104. The first capacitor CS1 charges a suitable voltage to turn-on and/or turn-off the eighth transistor TS8.

The second capacitor CS2 is connected between the first node NS1 and the first power terminal 105. The second capacitor CS2 charges a voltage applied to the first node NS1.

The output unit 130 controls a voltage supplied to the output terminal 104 in correspondence with the voltages of the first node NS1 and the second node NS2. For example, the output unit 130 may apply a high voltage of the first driving power VDD1 or a low voltage of the second driving power VSS1 to the output terminal 104 in correspondence with the voltages of the first node NS1 and the second node NS2. Accordingly, the output unit 130 includes the seventh transistor TS7 and the eighth transistor TS8.

The seventh transistor TS7 is connected between the first power terminal 105 and the output terminal 104, and a gate electrode of the seventh transistor TS7 is connected to the first node NS1. The seventh transistor TS7 is turned on or turned off in correspondence with the voltage of the first node NS1 to control a connection between the first power terminal 105 and the output terminal 104. When the seventh transistor TS7 is turned on, the high voltage of the first driving power VDD1 is transferred to the output terminal 104. Therefore, the gate-off voltage may be output to the scan line S (for example, the first scan line S1) connected to the output terminal 104.

The eighth transistor TS8 is connected between the output terminal 104 and the third input terminal 103, and a gate electrode of the eighth transistor TS8 is connected to the second node NS2. The eighth transistor TS8 is turned on or turned off in correspondence with the voltage of the second node NS2 to control a connection between the third input terminal 103 and the output terminal 104. When the eighth transistor TS8 is turned on, the voltage of the second clock signal CLK2 is transferred to the output terminal 104. The second clock signal CLK2 has a high voltage and a low voltage that repeats according to a period (e.g., a predetermined period), and during a period in which the second clock signal CLK2 has the low voltage in a state in which the eighth transistor TS8 is turned on, the low voltage of the second clock signal CLK2 may be transferred to the scan line S (for example, the first scan line S1) connected to the output terminal 104 and may be used as the scan signal.

In the second scan stage SST2, the first, second, and third input signals that are supplied to the first, second, and third input terminals 101, 102, and 103 are different from those of the first scan stage SST1, and a circuit structure and an operation process of the second scan stage SST2 may be the same or substantially the same as those of the first scan stage SST1. For example, the second scan stage SST2 may receive an output signal of the first scan stage SST1 (e.g., a first scan signal supplied to the first scan line S1), the second clock signal CLK2, and the first clock signal CLK1 through the first, second, and third input terminals 101, 102, and 103, respectively, and may generate the scan signal (e.g., the scan signal provided to the output terminal 104 of the second scan stage SST2) using the output signal of the first scan stage SST1, the first clock signal CLK2, and the first clock signal CLK1. The scan signal generated by (e.g., or in) the second scan stage SST2 is supplied to a second scan line S2.

The scan stages SST may sequentially output scan signals to the scan lines S while operating in the above-described method. A circuit structure and an operation process of each of the second scan stage SST2 and the other remaining scan stages SST that are subsequent to the second scan stage SST2 may be the same or substantially the same as those of the first scan stage SST1. Therefore, redundant description thereof may not be repeated.

However, the structure of the scan stages SST according to an embodiment of the disclosure is not limited to the embodiment of FIG. 6, and may be variously modified. For example, each scan stage SST may be configured from stage circuits having various suitable structures and/or various suitable driving methods as would be known to those skilled in the art.

Figure 7:
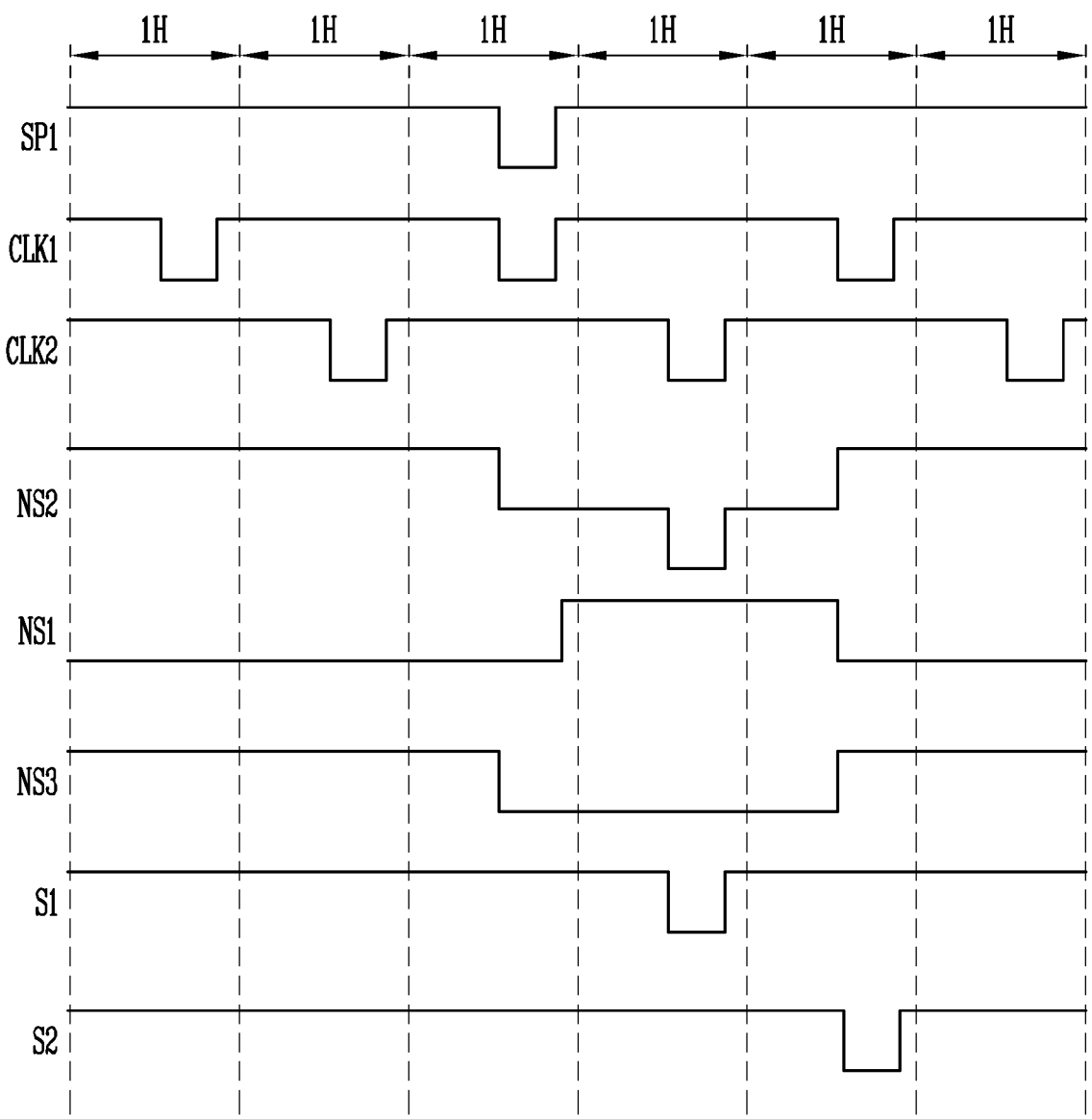
FIG. 7 illustrates a driving method of the scan stages according to an embodiment of the disclosure.

FIG. 7 illustrates a driving method of the scan stages SST according to an embodiment of the disclosure. For example, FIG. 7 illustrates exemplary waveforms of input/output signals of the scan stages SST shown in FIGS. 5 and 6. For convenience, an operation process of each scan stage SST will be described with reference to FIG. 7 using the first scan stage SST1 as a representative example.

Referring to FIG. 7, each of the first clock signal CLK1 and the second clock signal CLK2 may have a period corresponding to two horizontal periods (2H), and the first clock signal CLK1 and the second clock signal CLK2 may be supplied during different horizontal periods. For convenience, in describing the present embodiment, when each of the first clock signal CLK1 and the second clock signal CLK2 has a gate-on voltage, each of the first clock signal CLK1 and the second clock signal CLK2 may be described to as being "supplied". Similarly, when the first start pulse SP1 has a gate-on voltage, the first start pulse SP1 may be described as being "supplied". Because the first driver transistors TS are shown in FIG. 6 as being P-type transistors, hereinafter, the gate-on voltage and the gate-off voltage will be described as a "low voltage" and a "high voltage", respectively, but the disclosure is not limited thereto.

According to an embodiment, the second clock signal CLK2 may be a signal that is shifted by a half period (e.g., one horizontal period 1H) from that of the first clock signal CLK1. In addition, the first start pulse SP1 that is supplied to the first input terminal 101 may be supplied in synchronization with the second input signal that is supplied to the second input terminal 102, for example, the first clock signal CLK1. In other words, the first start pulse SP1 may be supplied to the first input terminal 101 concurrently (e.g., simultaneously) with at least one time that the second input signal (e.g., the first clock signal CLK1) is supplied to the second input terminal 102.

In an embodiment, when the first start pulse SP1 is supplied, the first input terminal 101 may be set to the low voltage of the second driving power VSS1, and when the first start pulse SP1 is not supplied, the first input terminal 101 may be set to the high voltage of the first driving power VDD1. In addition, when the first clock signal CLK1 and the second clock signal CLK2 are supplied to the second input terminal 102 and the third input terminal 103, respectively, the second input terminal 102 and the third input terminal 103 may be set to the low voltage of the second driving power VSS1, and when the first clock signal CLK1 and the second clock signal CLK2 are not supplied, the second input terminal 102 and the third input terminal 103 may be set to the high voltage of the first driving power VDD1.

Hereinafter, an operation process will be described in more detail with reference to FIGS. 6 and 7. First, the first start pulse SP1 is supplied in synchronization with the supply of the first clock signal CLK1.

When the first clock signal CLK1 is supplied, the first transistor TS1 and the fifth transistor TS5 are turned on. When the first transistor TS1 is turned on, the first input terminal 101 and the third node NS3 are electrically connected to each other. In some embodiments, because the sixth transistor TS6 may be always turned on by the second driving power VSS1, the third node NS3 is connected to the second node NS2.

When the first input terminal 101 and the third node NS3 are electrically connected to each other, voltages of the third node NS3 and the second node NS2 are set to the low voltage by the first start pulse SP1 supplied to the first input terminal 101. When the voltages of the third node NS3 and the second node NS2 are set to the low voltage, the eighth transistor TS8 and the fourth transistor TS4 are turned on.

When the eighth transistor TS8 is turned on, the third input terminal 103 and the output terminal 104 are electrically connected to each other. Here, the third input terminal 103 is set to the high voltage (e.g., according to the second clock signal CLK2 that is not supplied), and thus, the high voltage is output to the output terminal 104. When the fourth transistor TS4 is turned on, the second input terminal 102 and the first node NS1 are electrically connected to each other. Then, a voltage of the first clock signal CLK1 supplied to the second input terminal 102 (e.g., the low voltage) is supplied to the first node NS1.

In addition, when the first clock signal CLK1 is supplied, the fifth transistor TS5 is turned on. When the fifth transistor TS5 is turned on, the low voltage of the second driving power VSS1 is supplied to the first node NS1. Here, the low voltage of the second driving power VSS1 is set to be the same or substantially the same as (e.g., or similar to) the voltage of the first clock signal CLK1, and thus, the first node NS1 maintains or substantially maintains (e.g., stably maintains) the low voltage.

When the first node NS1 is set to the low voltage, the third transistor TS3 and the seventh transistor TS7 are turned on. When the third transistor TS3 is turned on, the first driving power VDD1 and the second transistor TS2 are connected to each other. At this time, because the second transistor TS2 is set to be in a turn-off state, the third node NS3 maintains or substantially maintains (e.g., stably maintains) the low voltage, even though the third transistor TS3 is turned on. When the seventh transistor TS7 is turned on, the high voltage of the first driving power VDD1 is supplied to the output terminal 104. Here, the voltage of the first driving power VDD1 is set to be the same or substantially the same as the high voltage that is supplied to the third input terminal 103, and thus, the output terminal 104 may maintain or substantially maintain (e.g., stably maintains) the high voltage.

Thereafter, the supply of the first start pulse SP1 and the first clock signal CLK1 is stopped (e.g., is changed to have the high voltage). When the supply of the first clock signal CLK1 is stopped, the first transistor TS1 and the fifth transistor TS5 are turned off. At this time, the eighth transistor TS8 and the fourth transistor TS4 maintain or substantially maintain the turn-on state in correspondence with the voltage stored in the first capacitor CS1. In other words, the second node NS2 and the third node NS3 may maintain or substantially maintain the low voltage by the voltage stored in the first capacitor CS1.

When the eighth transistor TS8 maintains or substantially maintains the turn-on state, the output terminal 104 remains in a state in which the output terminal 104 is connected to the third input terminal 103. When the fourth transistor TS4 maintains or substantially maintains the turn-on state, the first node NS1 maintains or substantially maintains a state in which the first node NS1 is connected to the second input terminal 102. Here, a voltage of the second input terminal 102 is set to the high voltage in correspondence with the stopping (or changing) of the supply of the first clock signal CLK1, and thus, the first node NS1 is also set to the high voltage. When the high voltage is supplied to the first node NS1, the third transistor TS3 and the seventh transistor TS7 are turned off.

Thereafter, the second clock signal CLK2 is supplied to the third input terminal 103. At this time, because the eighth transistor TS8 is set to the turn-on state, the second clock signal CLK2 that is supplied to the third input terminal 103 is supplied to the output terminal 104. In this case, the output terminal 104 outputs the second clock signal CLK2 having the low voltage to the first scan line S1 as the scan signal having the gate-on voltage.

When the second clock signal CLK2 is supplied to the output terminal 104, the voltage of the second node NS2 is reduced to a voltage that is less than the low voltage of the second driving power VSS1 due to coupling of the first capacitor CS1, and thus, the eighth transistor TS8 maintains or substantially maintains (e.g., stably maintains) the turn-on state.

Even when the voltage of the second node NS2 is reduced, the third node NS3 may maintain or substantially maintain a voltage corresponding to (e.g., approximating) the voltage of the second driving power VSS1 (e.g., a voltage obtained by subtracting a threshold voltage of the sixth transistor TS6 from the low voltage of the second driving power VSS1).

After the scan signal is output to the first scan line S1, the supply of the second clock signal CLK2 is stopped (e.g., is changed to the high voltage). When the supply of the second clock signal CLK2 is stopped, the output terminal 104 outputs the high voltage. In addition, the voltage of the second node NS2 increases to the high voltage of the second driving power VSS1 in correspondence with the high voltage of the output terminal 104.

Thereafter, the first clock signal CLK1 is supplied. When the first clock signal CLK1 is supplied, the first transistor TS1 and the fifth transistor TS5 are turned on. When the first transistor TS1 is turned on, the first input terminal 101 and the third node NS3 are connected to each other. At this time, the first start pulse SP1 is not supplied to the first input terminal 101, and thus, the first input terminal 101 is set to the high voltage. Therefore, the high voltage is supplied to the third node NS3 and the second node NS2, and thus, the eighth transistor TS8 and the fourth transistor TS4 are turned off.

When the fifth transistor TS5 is turned on, the low voltage of the second driving power VSS1 is supplied to the first node NS1, and thus, the third transistor TS3 and the seventh transistor TS7 are turned on. When the seventh transistor TS7 is turned on, the high voltage of the first driving power VDD1 is supplied to the output terminal 104. Thereafter, the third transistor TS3 and the seventh transistor TS7 maintain or substantially maintain the turn-on state in correspondence with the voltage that is charged in the second capacitor CS2, and thus, the output terminal 104 stably receives the high voltage of the first driving power VDD1.

In addition, when the second clock signal CLK2 is supplied, the second transistor TS2 is turned on. At this time, because the third transistor TS3 is set to the turn-on state, the high voltage of the first driving power VDD1 is supplied to the third node NS3 and the second node NS2. In this case, the eighth transistor TS8 and the fourth transistor TS4 maintain or substantially maintain (e.g., stably maintain) the turn-off state.

The second scan stage SST2 receives the output signal (for example, the first scan signal that is supplied to the first scan line S1) of the first scan stage SST1 in synchronization with the second clock signal CLK2. In addition, the second scan stage SST2 outputs a scan signal to the second scan line S2 in synchronization with the first clock signal CLK1. The scan stages SST according to an embodiment of the disclosure sequentially output the scan signals to the scan lines S by repeating the above-described processes.

Figure 8:
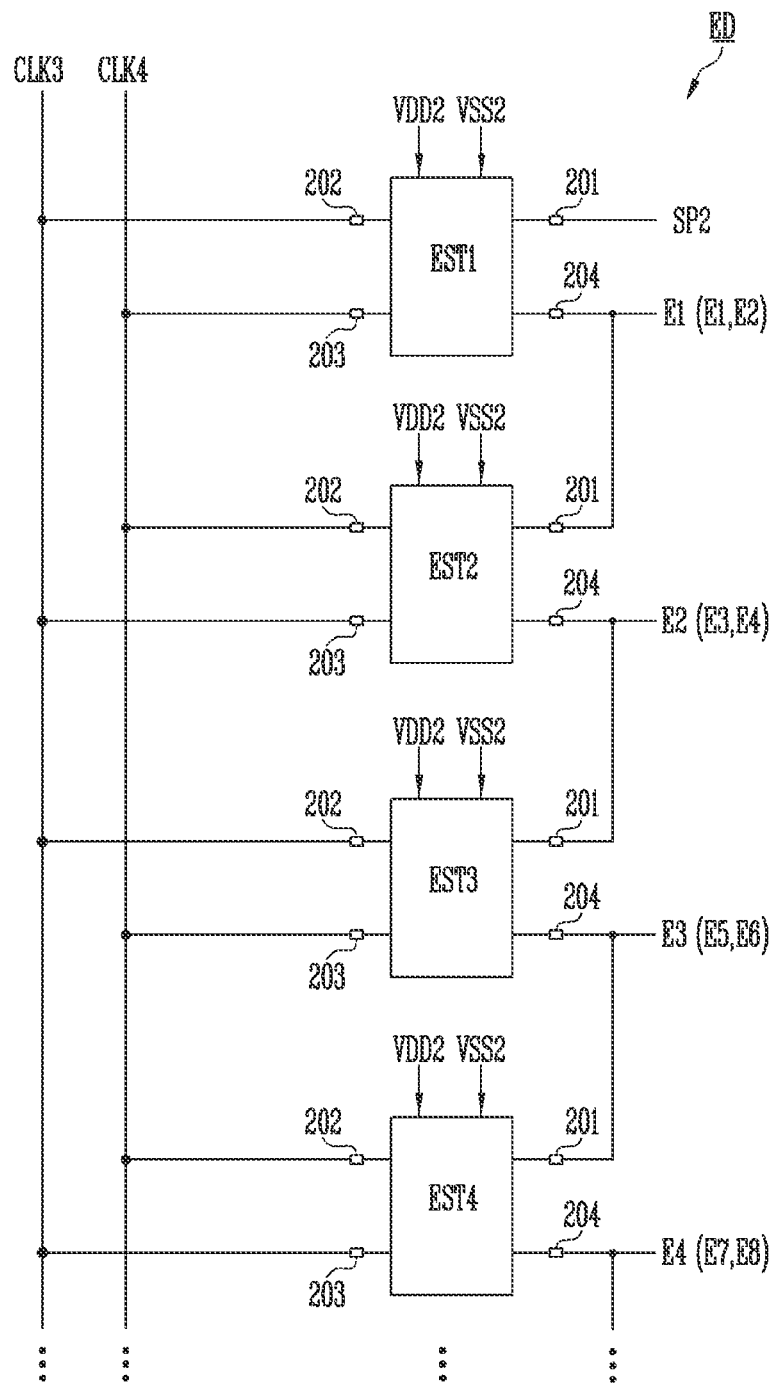
FIG. 8 illustrates a light emission control driver according to an embodiment of the disclosure.

FIG. 8 illustrates a light emission control driver ED according to an embodiment of the disclosure. For example, FIG. 8 illustrates an embodiment of the light emission control driver ED that may be included in any of the gate drivers GD shown in FIGS. 1A to 2B. For convenience, FIG. 8 shows only four light emission control stages, for example, first to fourth light emission control stages EST1 to EST4, but the disclosure is not limited thereto.

Referring to FIG. 8, the light emission control driver ED according to an embodiment of the disclosure includes a plurality of light emission control stages to supply respective light emission control signals to a plurality of light emission control lines E. For example, the light emission control driver ED may include a plurality of light emission stages that are connected (e.g., dependently connected) to an input terminal of the second start pulse SP2 (for example, a first input terminal 201 of the first light emission control stage EST1). In the following description, when arbitrarily referring to at least one of the light emission control stages, or when collectively referring to at least two of (e.g., or each of) the light emission control stages, the at least one of the light emission control stages or the collective ones of the light emission control stages may be referred to as a "light emission control stage EST" or "light emission control stages EST" as appropriate.

In an embodiment, the light emission control stages EST are respectively connected to any one emission control line E, and are driven in correspondence with at least one light emission clock signal. For example, the first to fourth light emission control stages EST1 to EST4 are connected to first to fourth light emission control lines E1 to E4, respectively, and generate respective light emission control signals using third and fourth clock signals CLK3 and CLK4. The first to fourth light emission control stages EST1 to EST4 may sequentially output the light emission control signals (e.g., the light emission control signals having a gate-off voltage) to the first to fourth light emission control lines E1 to E4. According to an embodiment, the light emission control stages EST may have the same or substantially the same circuit structure as each other.

In another embodiment, the light emission control stages EST may be connected to the plurality of light emission control lines E, respectively, to concurrently (e.g., simultaneously) supply the light emission control signals to the plurality of light emission control lines E. For example, the first light emission control stage EST1 may be commonly connected to the first and second light emission control lines E1 and E2 through an output terminal 204 to concurrently (e.g., simultaneously) supply the light emission control signal to the first and second light emission control lines E1 and E2. In this case, the pixels PXL of first and second horizontal lines that are connected to the first and second light emission control lines E1 and E2 may emit light or not emit light concurrently (e.g., simultaneously) with each other. For example, the first light emission control stage EST1 may concurrently (e.g., simultaneously) supply the light emission control signal to the first and second light emission control lines E1 and E2 so as to overlap with the initialization control signals and the scan signals that are supplied to first and second initialization control lines Gl1 and Gl2 and first and second scan lines S1 that are connected to the pixels PXL of the first and second horizontal lines. In this case, the first light emission control stage EST1 may drive the first and second light emission control lines E1 and E2 concurrently (e.g., simultaneously).

Similarly, the remaining light emission control stages EST may concurrently (e.g., simultaneously) drive the plurality of light emission control lines E, respectively. For example, the second light emission control stage EST2 may concurrently (e.g., simultaneously) drive third and fourth light emission control lines E3 and E4, the third light emission control stage EST3 may concurrently (e.g., simultaneously) drive fifth and sixth light emission control lines E5 and E6, and the fourth light emission control stage EST4 may concurrently (e.g., simultaneously) drive seventh and eighth light emission control lines E7 and E8.

As described above, when each of the light emission control stages EST concurrently (e.g., simultaneously) drives a plurality of light emission control lines E, a circuit structure of the light emission control driver SD may be simplified and an area (e.g., a size) of the light emission control driver SD may be reduced. However, for convenience, in describing the embodiment of FIG. 8 and the embodiments of FIGS. 9 and 10 related thereto, it may be assumed that each of the light emission control stages EST may supply the light emission control signals to any one or more of the light emission control lines E.

Each of the light emission control stages EST includes a first input terminal 201, a second input terminal 202, a third input terminal 203, and an output terminal 204.

The first input terminal 201 receives a first input signal. According to an embodiment, the first input signal may be the second start pulse SP2 or an output signal of a previous light emission control stage (e.g., a light emission control signal of a previous stage). For example, the first light emission control stage EST1 may receive the second start pulse SP2 through the first input terminal 201, and the other remaining light emission control stages EST may receive the output signal of the previous light emission control stage through their respective first input terminal 201. For example, the second light emission control stage EST2 may receive the output signal of the first light emission control stage EST1, the third light emission control stage EST3 may receive the output signal of the second light emission control stage EST2, the fourth light emission control stage EST4 may receive the output signal of the third light emission control stage EST3, and so on.

The second input terminal 202 and the third input terminal 203 receive a second input signal and a third input signal, respectively. According to an embodiment, the second input signal and the third input signal of a k-th (k is an odd number or an even number) light emission control stage ESTk may be a third clock signal CLK3 and a fourth clock signal CLK4, respectively. In addition, the second input signal and the third input signal of a (k+1)-th light emission control stage ESTk+1 may be the fourth clock signal CLK4 and the third clock signal CLK3, respectively. For example, the k-th light emission control stage ESTk (e.g., an odd-numbered light emission control stage) may receive the third clock signal CLK3 and the fourth clock signal CLK4 through the second input terminal 202 and the third input terminal 203, respectively, and the (k+1)-th light emission control stage ESTk+1 (e.g., an even-numbered light emission control stage) may receive the fourth clock signal CLK4 and the third clock signal CLK3 through the second input terminal 202 and the third input terminal 203, respectively.

The third clock signal CLK3 and the fourth clock signal CLK4 may alternately have a gate-on voltage. For example, the third clock signal CLK3 and the fourth clock signal CLK4 may be signals having the same or substantially the same period as each other and phases that do not overlap with each other. For example, the fourth clock signal CLK4 may be a clock signal having a form in which the third clock signal CLK3 is shifted by a half period.

In addition, the light emission control stages EST operate by receiving a third driving power (e.g., a third driving power supply) VDD2 and fourth driving power (e.g., a fourth driving power supply) VSS2. A voltage of the third driving power VDD2 is set to a gate-off voltage (e.g., a gate-high voltage), and the fourth driving power VSS2 is set to a gate-on voltage (e.g., a gate-low voltage). In this case, the high voltage of the third driving power VDD2 that is transferred to the output terminal 204 of each light emission control stage EST may be used as the light emission control signal for preventing or substantially preventing light emission of the pixels PXL.

According to an embodiment, the high voltage of the third driving power VDD2 may be the same or substantially the same as or may be different from the high voltage of the first driving power VDD1 that is supplied to the scan driver SD. Similarly, the low voltage of the fourth driving power VSS2 may be the same or substantially the same as or may be different from the low voltage of the second driving power VSS1 that is supplied to the scan driver SD.

Figure 9:
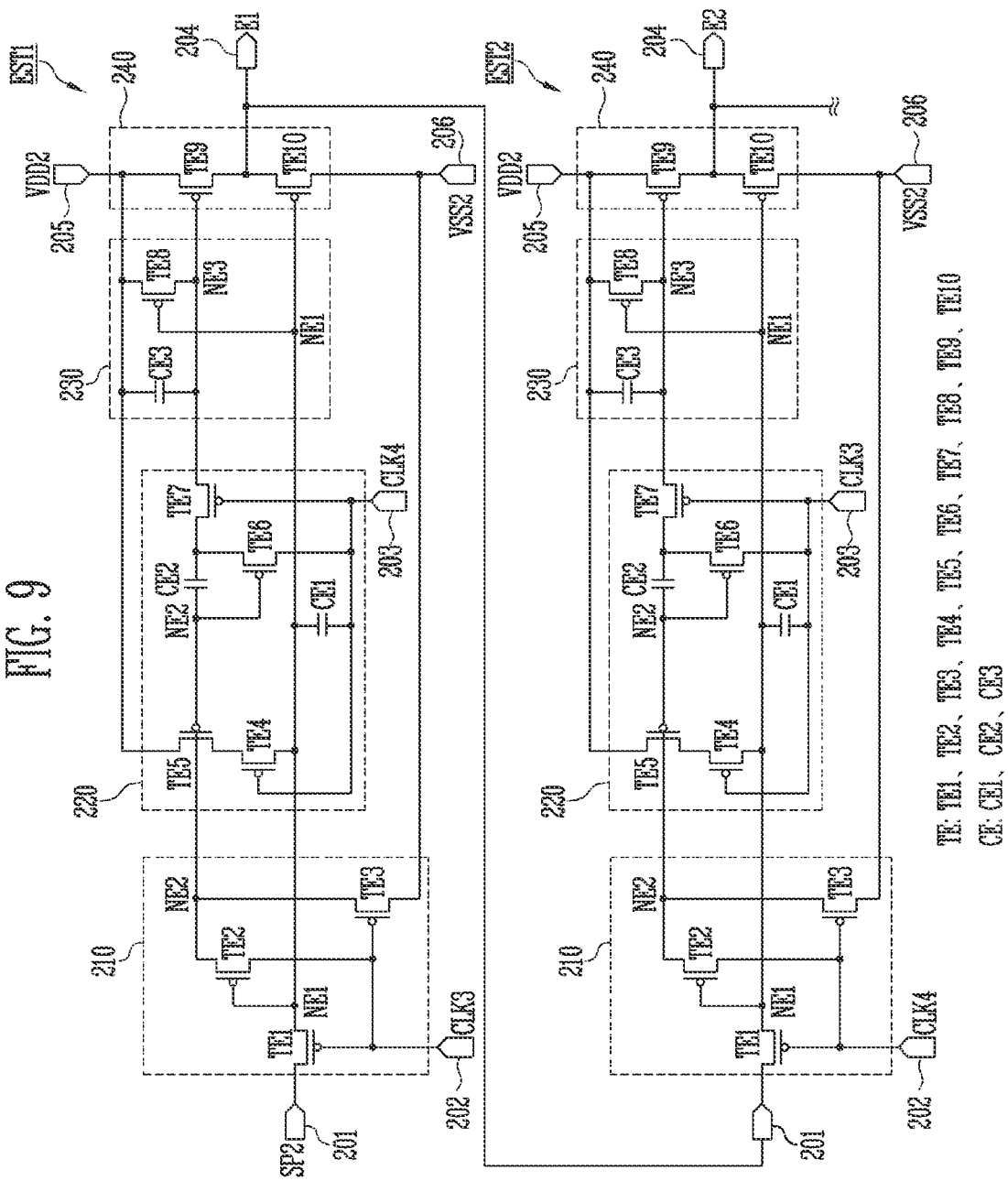
FIG. 9 illustrates light emission control stages according to an embodiment of the disclosure.

FIG. 9 illustrates the light emission control stages EST according to an embodiment of the disclosure. For example, FIG. 9 illustrates the light emission control stages EST that may be included in the light emission control driver ED of FIG. 8, and shows a first light emission control stage EST1 and a second light emission control stage EST2 in more detail as a representative of the light emission control stages EST.

Referring to FIG. 9, each of the light emission control stages EST includes an input unit (e.g., an input circuit) 210, a first control unit (e.g., a first control circuit) 220, a second control unit (e.g., a second control circuit) 230, and an output unit (e.g., an output circuit) 240. The light emission control stage EST generates the light emission control signal using first, second, and third input signals (which may also be referred to as "first, second, and third light emission driving signals", respectively) that are supplied through the first, second, and third input terminals 201, 202, and 203 (which may also be referred to as "first, second, and third light emission driving input terminals", respectively), respectively. The light emission control stage EST supplies the generated light emission control signal to the output terminal 204. For example, the light emission control stage EST may output each light emission control signal using the second start pulse SP2 or the output signal of the previous light emission control stage, any one of the third and fourth clock signals CLK3 and CLK4, and the other one of the third and fourth clock signals CLK3 and CLK4, which are supplied through the first, second, and third input terminals 201, 202, and 203, respectively.

In addition, the light emission control stage EST receives the third driving power VDD2 and the fourth driving power VSS2 through a first power terminal 205 and a second power terminal 206, respectively. The light emission control stage EST may control a voltage of the output terminal 204 using the first to third input signals and voltages of the third and fourth driving power VDD2 and VSS2.

In more detail, the light emission control stage EST may include first to tenth transistors TE1 to TE10 and first to third capacitors CE1 to CE3. Hereinafter, when arbitrarily referring to at least one of the first to tenth transistors TE1 to TE10, the at least one of the first to tenth transistors TE1 to TE10 may be referred to as a "second driver transistor TE" or "second driver transistors TE", and when arbitrarily referring to at least one of the first to third capacitors CE1 to CE3, the at least one of the first to third capacitors CE1 to CE3 may be referred to as a "second driver capacitor CE" or "second driver capacitors CE". For convenience, hereinafter, a circuit structure of each light emission control stage EST will be described with reference to the first light emission control stage EST1.

The input unit 210 controls a voltage of a first node NE1 and a voltage of a second node NE2 in correspondence with the first input signal supplied to the first input terminal 201 and the second input signal supplied to the second input terminal 202. For example, the input unit 210 of the first light emission control stage EST1 may control the voltages of the first node NE1 and the second node NE2 in correspondence with the second start pulse SP2 supplied to the first input terminal 201 and the third clock signal CLK3 supplied to the second input terminal 202. Accordingly, the input unit 210 includes the first, second, and third transistors TE1, TE2, and TE3.

The first transistor TE1 is connected between the first input terminal 201 and the first node NE1, and a gate electrode of the first transistor TE1 is connected to the second input terminal 202. The first transistor TE1 is turned on when the third clock signal CLK3 having a gate-on voltage (for example, a low voltage) is supplied to the second input terminal 202 to connect the first input terminal 201 and the first node NE1 to each other.

The second transistor TE2 is connected between the second node NE2 and the second input terminal 202, and a gate electrode of the second transistor TE2 is connected to the first node NE1. The second transistor TE2 controls a connection between the second node NE2 and the second input terminal 202 in correspondence with the voltage of the first node NE1.

The third transistor TE3 is connected between the second node NE2 and the fourth driving power VSS2, and a gate electrode of the third transistor TE3 is connected to the second input terminal 202. The third transistor TE3 is turned on when the third clock signal CLK3 having the gate-on voltage is supplied to the second input terminal 202 to supply a voltage of the fourth driving power VSS2 to the second node NE2.

The first controller 220 controls the voltage of the first node NE1 and a voltage of a third node NE3 in correspondence with a third input signal (for example, the fourth clock signal CLK4) that is supplied to the third input terminal 203 and the voltage of the second node NE2. In more detail, the first controller 220 includes the fourth to seventh transistors TE4 to TE7, and the first and second capacitors CE1 and CE2.

The fourth transistor TE4 and the fifth transistor TE5 are connected between the first node NE1 and the third driving power VDD2. For example, the fourth transistor TE4 and the fifth transistor TE5 may be connected in series between the first node NE1 and the third driving power VDD2.

The fourth transistor TE4 is connected between the first node NE1 and the fifth transistor TE5, and a gate electrode of the fourth transistor TE4 is connected to the third input terminal 203. The fourth transistor TE4 is turned on when the fourth clock signal CLK4 having a gate-on voltage (for example, a low voltage) is supplied to the third input terminal 203 to connect the first node NE1 and the fifth transistor TE5 to each other.

The fifth transistor TE5 is connected between the fourth transistor TE4 and the third driving power VDD2, and a gate electrode of the fifth transistor TE5 is connected to the second node NE2. The fifth transistor TE5 controls a connection between the fourth transistor TE4 and the third driving power VDD2 in correspondence with the voltage of the second node NE2.

The sixth transistor TE6 is connected between a first electrode of the seventh transistor TE7 and the third input terminal 203, and a gate electrode of the sixth transistor TE6 is connected to the second node NE2. The sixth transistor TE6 controls a connection between the first electrode of the seventh transistor TE7 and the third input terminal 203 in correspondence with the voltage of the second node NE2.

The seventh transistor TE7 is connected between a first electrode of the sixth transistor TE6 and the third node NE3, and a gate electrode of the seventh transistor TE7 is connected to the third input terminal 203. The seventh transistor TE7 is turned on when the fourth clock signal CLK4 having the gate-on voltage is supplied to the third input terminal 203 to connect the first electrode of the sixth transistor TE6 and the third node NE3 to each other.

The first capacitor CE1 is connected between the first node NE1 and the third input terminal 203.

The second capacitor CE2 is connected between the second node NE2 and the first electrode of the seventh transistor TE7.

The second controller 230 controls the voltage of the third node NE3 in correspondence with the voltage of the first node NE1. In more detail, the second controller 230 includes the eighth transistor TE8 and the third capacitor CE3.

The eighth transistor TE8 is connected between the third node NE3 and the third driving power VDD2, and a gate electrode of the eighth transistor TE8 is connected to the first node NE1. The eighth transistor TE8 controls a connection between the third node NE3 and the third driving power VDD2 in correspondence with the voltage of the first node NE1.

The third capacitor CE3 is connected between the third node NE3 and the third driving power VDD2.

The output unit 240 controls the voltage that is supplied to the output terminal 204 in correspondence with the voltages of the first node NE1 and the third node NE3. In more detail, the output unit 240 includes the ninth transistor TE9 and the tenth transistor TE10.

The ninth transistor TE9 is connected between the first power terminal 205 and the output terminal 204, and a gate electrode of the ninth transistor TE9 is connected to the third node NE3. The ninth transistor TE9 is turned on or turned off in correspondence with the voltage of the third node NE3, and controls a connection between the first power terminal 205 and the output terminal 204. When the ninth transistor TE9 is turned on, the high voltage of the third driving power VDD2 is transferred to the output terminal 204. Therefore, the high voltage of the third driving power VDD2 is supplied to the light emission control line E (for example, the first light emission control line E1) that is connected to the output terminal 204. The high voltage of the third driving power VDD2 may be used as the light emission control signal having the gate-off voltage.

The tenth transistor TE10 is connected between the output terminal 204 and the second power terminal 206, and a gate electrode of the tenth transistor TE10 is connected to the first node NE1. The tenth transistor TE10 is turned on or turned off in correspondence with the voltage of the first node NE1, and controls a connection between the second power terminal 206 and the output terminal 204. When the tenth transistor TE10 is turned on, the low voltage of the fourth driving power VSS2 is transferred to the output terminal 204. Therefore, the gate-on voltage may be output to the light emission control line E (for example, the first light emission control line E1) that is connected to the output terminal 204.

In the second light emission control stage EST2, the first, second, and third input signals that are supplied to the first, second, and third input terminals 201, 202, and 203, respectively, are different from those of the first light emission control stage EST1, and a circuit structure and an operation process of the second light emission control stage EST2 may be the same or substantially the same as those of the first light emission control stage EST1. For example, the second light emission control stage EST2 may receive an output signal of the first light emission control stage EST1 (e.g., a first light emission control signal supplied to the first light emission control line E1), the fourth clock signal CLK4, and the third clock signal CLK3 through the first, second, and third input terminals 201, 202, and 203, respectively, and may generate the light emission control signal (e.g., the light emission control signal provided to the output terminal 204 of the second light emission control stage EST2) using the output signal of the first light emission control stage EST1, the fourth clock signal CLK4, and the third clock signal CLK3. The light emission control signal generated by (e.g., or in) the second light emission control stage EST2 is supplied to a second light emission control line E2.

The light emission control stages EST may sequentially output the light emission control signals to the light emission control lines E while operating in the above-described method. A circuit structure and an operation process of each of the second light emission control stage EST2 and the other remaining light emission control stages EST that are subsequent to the second light emission control stage EST2 may be the same or substantially the same as those of the first light emission control stage EST1. Therefore, redundant description thereof may not be repeated.

However, the structure of the light emission control stages EST according to an embodiment of the disclosure is not limited to the embodiment of FIG. 9, and may be variously modified. For example, each light emission control stage EST may be configured from stage circuits having various suitable structures and/or various suitable driving methods as would be known to those skilled in the art.

Figure 10:
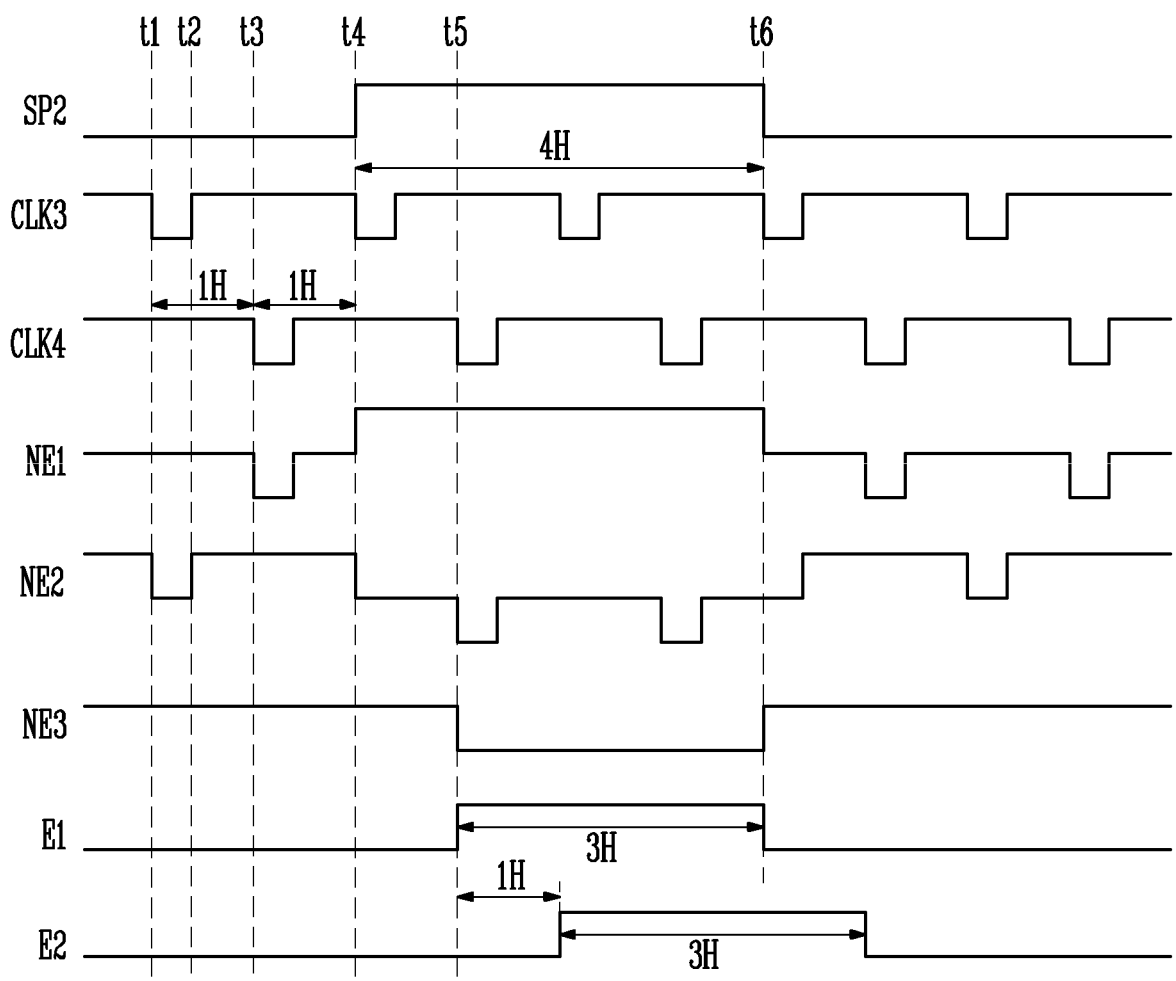
FIG. 10 illustrates a driving method of the light emission control stages according to an embodiment of the disclosure.

FIG. 10 illustrates a driving method of the light emission control stages EST according to an embodiment of the disclosure. For example, FIG. 10 illustrates exemplary waveforms of input/output signals of the light emission control stages EST shown in FIGS. 8 and 9. For convenience, an operation process of each light emission control stage EST will be described with reference to FIG. 10 using the first light emission control stage EST1 as a representative example.

Referring to FIG. 10, each of the third clock signal CLK3 and the fourth clock signal CLK4 may have a period corresponding to two horizontal periods (2H), and the third clock signal CLK3 and the fourth clock signal CLK4 may be supplied during different horizontal periods. For example, the fourth clock signal CLK4 may be a signal that is shifted by a half period (e.g., one horizontal period 1H) from that of the third clock signal CLK3. For convenience, in describing the present embodiment, when each of the third clock signal CLK3 and the fourth clock signal CLK4 has a gate-on voltage (for example, a low voltage), each of the third clock signal CLK3 and the fourth clock signal CLK4 may be described as being "supplied". For example, when the third clock signal CLK3 and the fourth clock signal CLK4 are supplied to the second input terminal 202 and the third input terminal 203, respectively, the second input terminal 202 and the third input terminal 203 may be set to the low voltage of the fourth driving power VSS2, and when the third clock signal CLK3 and the fourth clock signal CLK4 are not supplied, the second input terminal 202 and the third input terminal 203 may be set to the high voltage of the third driving power VDD2.

The second start pulse SP2 that is supplied to the second input terminal 102 may be supplied in synchronization with the clock signal that is supplied to the second input terminal 202, for example, the third clock signal CLK3. In addition, the second start pulse SP2 is set to have a width that is wider than that of the third clock signal CLK3. For example, the second start pulse SP2 may be supplied during four horizontal periods 4H.

The second start pulse SP2 is used for generating the light emission control signal to disconnect (e.g., to temporarily block) the light emission of the pixels PXL, and thus, when the second start pulse SP2 has a gate-off voltage (for example, a high voltage), the second start pulse SP2 may be described as being "supplied". For example, when the second start pulse SP2 is supplied, the first input terminal 201 may be set to the high voltage of the third driving power VDD2, and when the second start pulse SP2 is not supplied, the first input terminal 201 may be set to the low voltage of the fourth driving power VSS2. In the embodiment of FIG. 9, because the second driver transistors TE are shown as being formed of P-type transistors, the gate-on voltage and the gate-off voltage will be described hereinafter as a "low voltage" and a "high voltage", respectively, but the disclosure is not limited thereto.

Hereinafter, an operation process will be described in more detail with reference to FIGS. 9 and 10. First, the third clock signal CLK3 is supplied to the second input terminal 202 for a suitable period (e.g., a predetermined period) from a first time point t1. When the third clock signal CLK3 is supplied to the second input terminal 202, the first transistor TE1 and the third transistor TE3 are turned on.

When the first transistor TE1 is turned on, the first input terminal 201 and the first node NE1 are connected to each other. At this time, because the second start pulse SP2 is not supplied to the first input terminal 201, the low voltage is supplied to the first node NE1.

When the low voltage is supplied to the first node NE1, the second transistor TE2, the eighth transistor TE8, and the tenth transistor TE10 are turned on.

When the eighth transistor TE8 is turned on, the high voltage of the third driving power VDD2 is supplied to the third node NE3, and thus, the ninth transistor TE9 is turned off. At this time, the third capacitor CE3 charges a voltage corresponding to the high voltage of the third driving power VDD2, and thus, the ninth transistor TE9 maintains or substantially maintains (e.g., stably maintains) the turn-off state even after the first time point t1.

When the tenth transistor TE10 is turned on, the low voltage of the fourth driving power VSS2 is supplied to the output terminal 204. Therefore, the light emission control signal is not supplied to the first light emission control line E1 at the first time point t1.

When the second transistor TE2 is turned on, the third clock signal CLK3 is supplied to the second node NE2. In addition, when the third transistor TE3 is turned on, the low voltage of the fourth driving power VSS2 is supplied to the second node NE2. Here, the third clock signal CLK3 may be set to the low voltage of the fourth driving power VSS2, and thus, the second node NE2 may be stably set to the low voltage of the fourth driving power VSS2. When the voltage of the second node NE2 is set to the low voltage of the fourth driving power VSS2, the seventh transistor TE7 is set to be in the turn-off state. Therefore, the third node NE3 maintains or substantially maintains the high voltage of the third driving power VDD2 regardless of the voltage of the second node NE2.

The supply of the third clock signal CLK3 is stopped at a second time point t2. When the supply of the third clock signal CLK3 is stopped, the first transistor TE1 and the third transistor TE3 are turned off. At this time, the voltage of the first node NE1 is maintained or substantially maintained at the low voltage by the first capacitor CE1, and thus, the second transistor TE2, the eighth transistor TE8, and the tenth transistor TE10 maintain or substantially maintain the turn-on state.

When the second transistor TE2 is turned on, the second input terminal 202 and the second node NE2 are connected to each other. At this time, the second node NE2 is set to the high voltage.

When the eighth transistor TE8 is turned on, the high voltage of the third driving power VDD2 is supplied to the third node NE3, and thus, the ninth transistor TE9 maintains or substantially maintains the turn-off state.

When the tenth transistor TE10 is turned on, the low voltage of the fourth driving power VSS2 is supplied to the output terminal 204.

The fourth clock signal CLK4 is supplied to the third input terminal 203 at a third time point t3. When the fourth clock signal CLK4 is supplied to the third input terminal 203, the fourth transistor TE4 and the seventh transistor TE7 are turned on.

When the seventh transistor TE7 is turned on, the second capacitor CE2 and the third node NE3 are electrically connected to each other. At this time, the third node NE3 maintains or substantially maintains the high voltage of the third driving power VDD2. In addition, because the fifth transistor TE5 is set to be in the turn-off state when the fourth transistor TE4 is turned on, the voltage of the first node NE1 does not change even though the fourth transistor TE4 is turned on.

When the fourth clock signal CLK4 is supplied to the third input terminal 203, the voltage of the first node NE1 is reduced to a voltage that is less than the low voltage of the fourth driving power VSS2 due to coupling of the first capacitor CE1. As described above, when the voltage of the first node NE1 is reduced to the voltage that is less than that of the fourth driving power VSS2, driving characteristics of the eighth transistor TE8 and the tenth transistor TE10 may be improved.

At a fourth time point t4, the second start pulse SP2 is supplied to the first input terminal 201, and the third clock signal CLK3 is supplied to the second input terminal 202. When the third clock signal CLK3 is supplied to the second input terminal 202, the first transistor TE1 and the third transistor TE3 are turned on.

When the first transistor TE1 is turned on, the first input terminal 201 and the first node NE1 are connected to each other. At this time, because the second start pulse SP2 is supplied to the first input terminal 201, the high voltage is supplied to the first node NE1. When the high voltage is supplied to the first node NE1, the second transistor TE2, the eighth transistor TE8, and the tenth transistor TE10 are turned off.

When the third transistor TE3 is turned on, the low voltage of the fourth driving power VSS2 is supplied to the second node NE2. At this time, because the fourth transistor TE4 is set to be in the turn-off state, the first node NE1 maintains or substantially maintains the high voltage. In addition, because the seventh transistor TE7 is set to be in the turn-off state, the voltage of the third node NE3 maintains or substantially maintains the high voltage by the third capacitor CE3. Therefore, the ninth transistor TE9 maintains or substantially maintains the turn-off state.

The fourth clock signal CLK4 is supplied to the third input terminal 203 at a fifth time point t5. When the fourth clock signal CLK4 is supplied to the third input terminal 203, the fourth transistor TE4 and the seventh transistor TE7 are turned on. In addition, because the voltage of the second node NE2 is set to the low voltage of the fourth driving power VSS2, the fifth transistor TE5 and the sixth transistor TE6 are turned on.

When the sixth transistor TE6 and the seventh transistor TE7 are turned on, the fourth clock signal CLK4 is supplied to the third node NE3. When the fourth clock signal CLK4 is supplied to the third node NE3, the ninth transistor TE9 is turned on. When the ninth transistor TE9 is turned on, the high voltage of the third driving power VDD2 is supplied to the output terminal 204. The high voltage of the third driving power VDD2 that is supplied to the output terminal 204 is supplied to the first light emission control line E1 as the light emission control signal.

When the voltage of the fourth clock signal CLK4 is supplied to the third node NE3, the voltage of the second node NE2 is reduced to a voltage that is less than the low voltage of the fourth driving power VSS2 due to coupling of the second capacitor CE2, and thus, driving characteristics of the transistors that are connected to the second node NE2 may be improved.

When the fourth transistor TE4 and the fifth transistor TE5 are turned on, the high voltage of the third driving power VDD2 is supplied to the first node NE1. As the high voltage of the third driving power VDD2 is supplied to the first node NE1, the tenth transistor TE10 maintains or substantially maintains the turn-off state. Therefore, the high voltage of the third driving power VDD2 may be stably supplied to the first light emission control line E1.

The third clock signal CLK3 is supplied to the second input terminal 202 at a sixth time point t6. In addition, the supply of the second start pulse SP2 is stopped at the sixth time point t6.

When the third clock signal CLK3 is supplied to the second input terminal 202, the first transistor TE1 and the third transistor TE3 are turned on.

When the first transistor TE1 is turned on, the first node NE1 and the first input terminal 201 are electrically connected to each other. Therefore, the voltage of the first node NE1 is set to the low voltage. When the voltage of the first node NE1 is set to the low voltage, the eighth transistor TE8 and the tenth transistor TE10 are turned on.

When the eighth transistor TE8 is turned on, the high voltage of the third driving power VDD2 is supplied to the third node NE3, and thus, the ninth transistor TE9 is turned off. When the tenth transistor TE10 is turned on, the low voltage of the fourth driving power VSS2 is supplied to the output terminal 204. The low voltage of the fourth driving power VSS2 that is supplied to the output terminal 204 is supplied to the first light emission control line E1, and thus, the supply of the light emission control signal is stopped.

The second light emission control stage EST2 receives an output signal of the first light emission control stage EST1 (for example, the first light emission control signal supplied to the first light emission control line E1) in synchronization with the fourth clock signal CLK4. In this case, the second light emission control stage EST2 outputs a light emission control signal to the second light emission control line E2 in synchronization with the third clock signal CLK3. The light emission control stages EST according to an embodiment of the disclosure sequentially output the light emission control signals to the light emission control lines E by repeating the above-described processes.

Figure 11A:
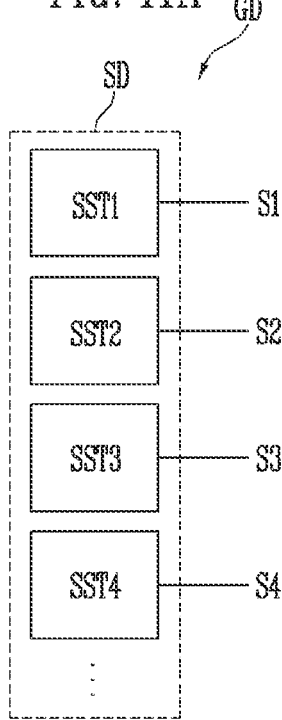
FIGS. 11A-11C illustrate various examples of gate drivers according to embodiments of the disclosure.
Figure 11B:
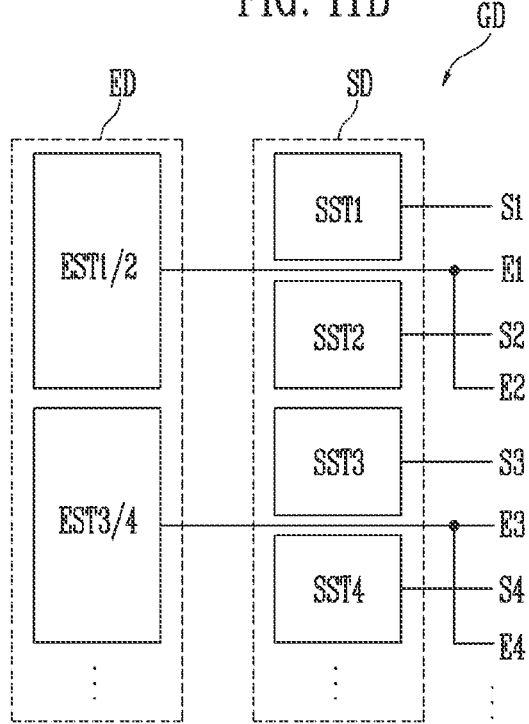
Figure 11C:
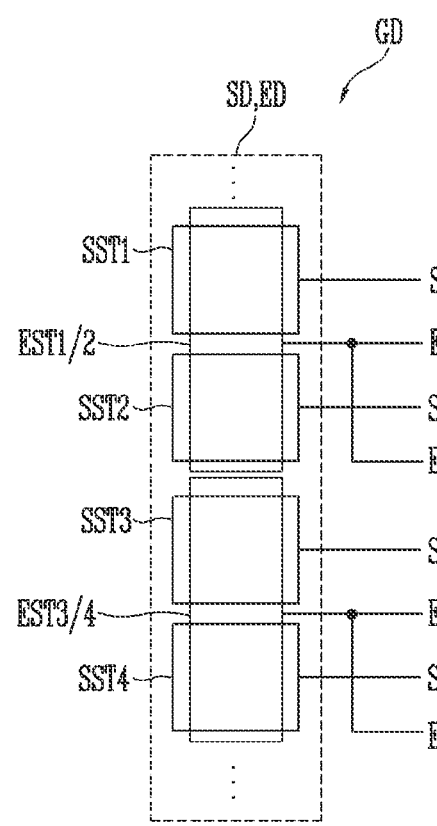

FIGS. 11A to 11C illustrate various examples of gate drivers GD according to embodiments of the disclosure. For example, FIGS. 11A to 11C illustrate different embodiments from each other of any of the gate drivers GD shown in FIGS. 1A to 2B. In describing the embodiments of FIGS. 11A to 11C, redundant description of configurations and/or components that are the same or substantially the same as (e.g., or similar to) those of one or more of the embodiments described above may not be repeated.

Referring to FIGS. 1A to 11A, the gate lines GL according to an embodiment of the disclosure may include the scan lines S, and the gate driver GD for driving the gate lines GL may include the scan driver SD. The scan driver SD includes the scan stages SST for supplying the scan signals to the scan lines S.

According to an embodiment, the scan driver SD may be disposed at (e.g., in or on) the display panel PNL, in addition to (e.g., together with) the pixels PXL. For example, the scan stages SST are disposed at (e.g., in or on) the non-display area NDA of the display panel PNL to be adjacent to at least one side (for example, the left side and/or the right side) of the display area DA, and may be sequentially arranged along one direction (for example, a column direction, a vertical direction, or a longitudinal direction).

Referring to FIG. 11B, the gate lines GL according to an embodiment of the disclosure may include the scan lines S and the light emission control lines E, and the gate driver GD for driving the gate lines GL may include the scan driver SD and the light emission control driver ED. The scan driver SD includes the scan stages SST for supplying the scan signals to the scan lines S. The light emission control driver ED includes the light emission control stages EST for supplying the light emission control signals to at least one or more light emission control lines E. For example, each of the light emission control stages EST may supply the light emission control signals to a respective one of the light emission control lines E, or to one or more respective ones of the light emission control lines E.

According to an embodiment, the light emission control driver ED may be disposed at (e.g., in or on) the display panel PNL, in addition to (e.g., together with) the scan driver SD and the pixels PXL. For example, the light emission control stages EST are disposed at (e.g., in or on) the non-display area NDA of the display panel PNL to be adjacent to at least one side (for example, the left side and/or the right side) of the display area DA, and may be sequentially arranged along one direction (for example, the column direction, the vertical direction, or the longitudinal direction).

In an embodiment, the light emission control stages EST may be disposed to be adjacent to the scan stages SST. For example, the light emission control stages EST may be disposed on any one side (for example, the left side or the right side) of the display area DA in addition to (e.g., together with) the scan stages SST, or may be disposed on both sides (for example, the left side and the right side) of the display area DA in addition to (e.g., together with) the scan stages SST.

In another embodiment, the light emission control stages EST and the scan stages SST may be disposed on different sides (for example, the left side and the right side, respectively) of the display area DA from each other. For example, the scan stages SST may be disposed at (e.g., in or on) the non-display area NDA on the left side of the display area DA, and the light emission control stages EST may be disposed at (e.g., in or on) the non-display area NDA on the right side of the display area DA.

In another embodiment, some of the light emission control stages EST may be disposed at (e.g., in or on) the non-display area NDA positioned on one side (for example, the left side) of the display area DA in addition to (e.g., together with) some of the scan stages SST. In addition, the other remaining light emission control stages EST may be disposed at (e.g., in or on) the non-display area NDA positioned on the other side (for example, the right side or an opposite side) of the display area DA in addition to (e.g., together with) the other remaining scan stages SST.

In addition to the above-described embodiments, a structure (e.g., a disposition structure) of the scan stages SST and the light emission control stages EST may be variously modified according to an embodiment.

In an embodiment, the light emission control driver ED may include light emission control stages EST for concurrently (e.g., simultaneously) supplying light emission control signals to two or more light emission control lines E, respectively. For example, the light emission control driver ED may include a first light emission control stage EST1/2 for concurrently (e.g., simultaneously) supplying the light emission control signals to first and second light emission control lines E1 and E2, and a second light emission control stage EST3/4 for concurrently (e.g., simultaneously) supplying the light emission control signals to third and fourth light emission control lines E3 and E4. In the above-described one or more embodiments, each of the light emission control drivers ED may include light emission control stage ESTi/i+1 for concurrently (e.g., simultaneously) supplying the light emission control signals to an i-th and an (i+1)-th light emission control lines Ei and Ei+1, respectively.

Referring to FIG. 11C, the gate lines GL according to an embodiment of the disclosure may include the scan lines S and the light emission control lines E, and the gate driver GD may include the scan driver SD and the light emission control driver ED. In addition, the scan driver SD and the light emission control driver ED may be disposed to overlap with each other.

For example, each light emission control stages EST may overlap with at least one scan stage SST. In more detail, the at least one first driver transistor TS included in each scan stage SST may be disposed at (e.g., in or on) a layer that is different from a layer of at least one second driver transistor TE included in each light emission control stage EST, and the at least one first driver transistor TS may overlap with the at least one second driver transistor TE.

When the scan driver SD and the light emission control driver ED are disposed to overlap with each other as described above, an area occupied by the gate driver GD may be reduced. Therefore, even though the gate driver GD is disposed at (e.g., in or on) the display panel PNL, the non-display area NDA of the display panel PNL may be effectively reduced by reducing or minimizing the area occupied by the gate driver GD on the display panel PNL.

As in one or more of the above-described embodiments, a structure of the gate driver GD may be variously modified. For example, the gate driver GD may include at least the scan driver SD, and may further include the light emission control driver ED according to an embodiment. In addition, the scan driver SD and the light emission control driver ED may or may not overlap with each other.

Figure 12A:
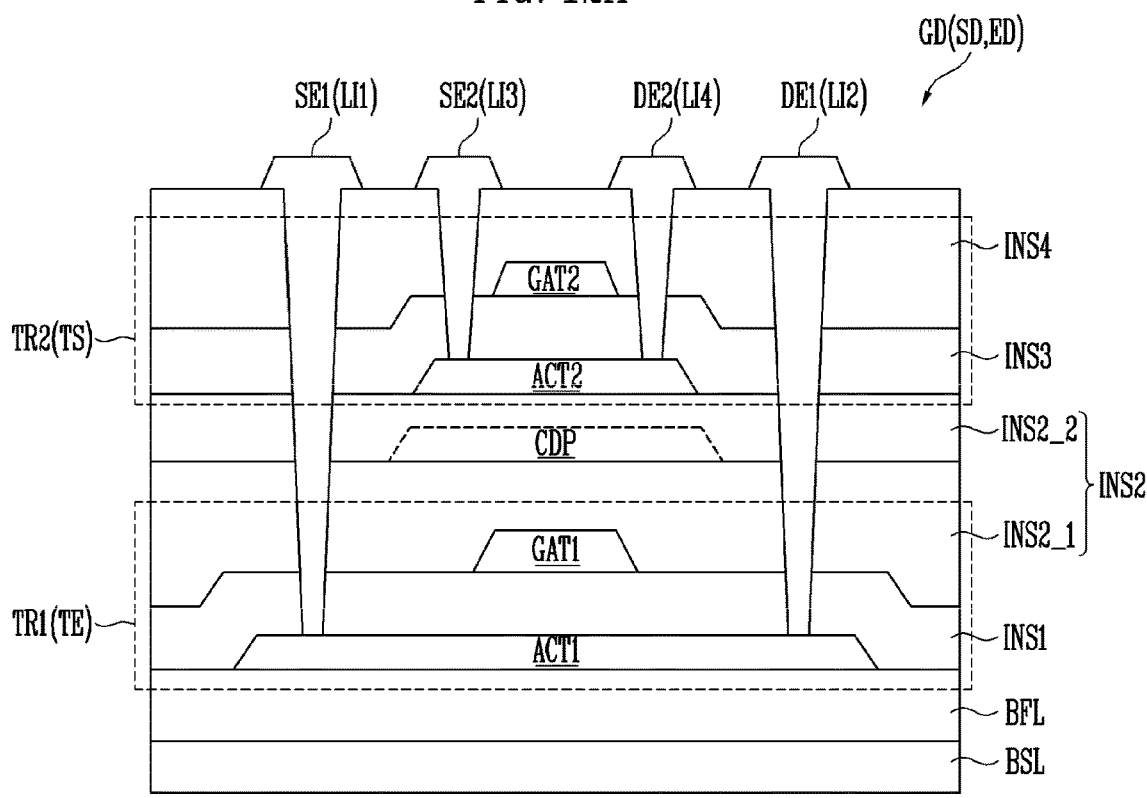
FIGS. 12A-12D illustrate cross sectional views of the gate driver according to embodiments of the disclosure.

FIGS. 12A to 12D illustrate cross sectional views of the gate driver GD according to embodiments of the disclosure. For example, FIGS. 12A to 12D illustrate cross sectional views of the gate driver GD according to at least one of the embodiments described above. In addition, FIG. 13 illustrates a cross sectional view of the gate driver GD according to an embodiment of the disclosure. For example, FIG. 13 illustrates a modified embodiment of at least one of the embodiments shown in FIGS. 12A to 12D. In the embodiments of FIGS. 12A to 13, the same or substantially the same (e.g., or similar) configurations and/or components as those of each other are denoted by the same or substantially the same reference symbols, and thus, redundant description thereof may be simplified or may not be repeated.

The gate driver GD according to one or more of the embodiments of FIGS. 12A to 13 may have a stacked structure including a plurality of transistors that are disposed at (e.g., in or on) different layers. For example, the gate driver GD may include a first transistor TR1 including a first active layer ACT1 disposed at (e.g., in or on) a first layer (for example, disposed directly above or directly on a buffer layer BFL) that is on the base layer BSL, and a second transistor TR2 including a second active layer ACT2 disposed at (e.g., in or on) a second layer (for example, disposed directly above or directly on a second insulating layer INS2) that is on the first layer.

For convenience, each of FIGS. 12A to 13 illustrates one first transistor TR1 and one second transistor TR2. However, the gate driver GD may include a plurality of first transistors TR1 each including a first active layer ACT1 and a plurality of second transistors TR2 each including a second active layer ACT2. For example, the gate driver GD may include the plurality of first transistors TR1 that are disposed at (e.g., in or on) a lower layer, and the plurality of second transistors TR2 that are disposed at (e.g., in or on) an upper layer that is on the first transistors TR1. Here, the "lower layer" and the "upper layer" relatively defines positions of the first and second transistors TR1 and TR2 based on the respective first and second active layers ACT1 and ACT2 and first and second gate electrodes of the first and second transistors TR1 and TR2.

Referring to FIGS. 1A to 12A, the gate driver GD according to an embodiment of the disclosure includes the scan driver SD and the light emission control driver ED that overlap with each other. For example, the scan driver SD may be disposed above (e.g., on) the light emission control driver ED.

The light emission control driver ED may include a light emission control stage EST including the first transistor TR1, and the scan driver SD may include a scan stage SST including the second transistor TR2. For example, each light emission control stage EST may include a plurality of second driver transistors TE, and each of the second driver transistors TE may be (e.g., may have the same or substantially the same structure as that of) the first transistor TR1 including the first active layer ACT1 that is disposed at (e.g., in or on) the first layer on the base layer BSL. In addition, each scan stage SST may include a plurality of first driver transistors TS, and each of the first driver transistors TS may be (e.g., may have the same or substantially the same structure as that of) the second transistor TR2 including the second active layer ACT2 that is positioned at (e.g., in or on) the second layer that is above (e.g., on) the first layer on the base layer BSL.

In more detail, according to an embodiment of the disclosure, the gate driver GD may include the plurality of first and second transistors TR1 and TR2 that are disposed at (e.g., in or on) different layers from each other, and a plurality of insulating layers. For example, the gate driver GD may include the buffer layer BFL, the first active layer ACT1, a first insulating layer INS1, a first gate electrode GAT1, the second insulating layer INS2, the second active layer ACT2, a third insulating layer INS3, a second gate electrode GAT2, a fourth insulating layer INS4, and first and second source/drain electrodes SE1, DE1, SE2, and DE2, which may be stacked (e.g., sequentially disposed) on a surface (e.g., one surface) of the base layer BSL. In addition, the gate driver GD may further selectively include at least one conductive pattern CDP.

According to an embodiment, the first transistor TR1 may include at least the first active layer ACT1 and the first gate electrode GAT1, and may further selectively include the first source electrode SE1 and the first drain electrode DE1 that are connected to different regions (for example, respective source and drain regions) of the first active layer ACT1 from each other. For example, the first active layer ACT1 and the first gate electrode GAT1 may configure (or may form) an active layer and a gate electrode of the first transistor TR1, respectively. In addition, the first source electrode SE1 and the first drain electrode DE1 may configure (or may form) a source electrode and a drain electrode of the first transistor TR1, respectively.

However, according to an embodiment, the first source electrode SE1 and/or the first drain electrode DE1 may be omitted, and the source and/or drain electrode of the first transistor TR1 may be configured (e.g., or may be formed) integrally with the first active layer ACT1 (for example, the source region and/or the drain region of the first active layer ACT1). In another example, according to an embodiment, the first source electrode SE1 and/or the first drain electrode DE1 may be regarded as a line (for example, a first line LI1 and/or a second line LI2), or may be regarded as an electrode of another circuit element (for example, an electrode of at least one or more other transistors and/or capacitors) that is connected to the first transistor TR1.

According to an embodiment, the second transistor TR2 may include at least the second active layer ACT2 and the second gate electrode GAT2, and may further selectively include the second source electrode SE2 and the second drain electrode DE2 that are connected to different regions (for example, respective source and drain regions) of the second active layer ACT2 from each other. For example, the second active layer ACT2 and the second gate electrode GAT2 may configure (or may form) an active layer and a gate electrode of the second transistor TR2, respectively. In addition, the second source electrode SE2 and the second drain electrode DE2 may configure (or may form) a source electrode and a drain electrode of the second transistor TR2, respectively.

However, according to an embodiment, the second source electrode SE2 and/or the second drain electrode DE2 may be omitted, and the source and/or drain electrode of the second transistor TR2 may be configured (or may be formed) integrally with the second active layer ACT2 (for example, the source region and/or the drain region of the second active layer ACT2). In another example, according to an embodiment, the second source electrode SE2 and/or the second drain electrode DE2 may be regarded as a line (for example, a third line LI3 and/or a fourth line LI4), or may be regarded as an electrode of another circuit element (for example, an electrode of at least one or more other transistors and/or capacitors) that is connected to the second transistor TR2.

The buffer layer BFL may prevent or reduce diffusion of an impurity to a circuit element (e.g., to each circuit element). The buffer layer BFL may be configured of (or may include) a single layer, but the disclosure is not limited thereto, and the buffer layer BFL may be configured of (or may include) multiple layers of at least two layers. When the buffer layer BFL is provided in multiple layers, each layer may be formed of the same or substantially the same material or of different materials.

The first active layer ACT1 may be disposed on the buffer layer BFL. For example, the first active layer ACT1 may be disposed on a surface (e.g., one surface) of the base layer BSL at (e.g., on) which the buffer layer BFL is formed. The first active layer ACT1 may include a channel region overlapping with the first gate electrode GAT1, and the source and drain regions positioned on respective sides (e.g., opposite sides) of the channel region.

According to an embodiment, the first active layer ACT1 may include (or may be) a semiconductor pattern formed of polysilicon, amorphous silicon, oxide semiconductor, and/or the like. In addition, the channel region of the first active layer ACT1 may be an intrinsic semiconductor region in which an impurity is not doped, and each of the source and drain regions of the first active layer ACT1 may be a conductive region in which a suitable impurity (e.g., a predetermined impurity) is doped.

In an embodiment, the first active layers ACT1 of the first transistors TR1 (e.g., the second driver transistors TE) configuring (or included in) each light emission control stage EST may be formed of the same or substantially the same (e.g., or similar) material. For example, the first active layers ACT1 may be formed of the same or substantially the same material including at least one from among polysilicon, amorphous silicon, and oxide semiconductor. For example, each of (or all of) the first active layers ACT1 may be formed of polysilicon that is manufactured through a crystallization process using a laser. However, the disclosure is not limited thereto. For example, in another embodiment, at least one first transistor TR1 may include a first active layer ACT1 that is formed of a material different from that of the first active layer ACT1 of at least one of the other remaining first transistors TR1.

In addition, in an embodiment, when the first transistor TR1 overlaps with at least one second transistor TR2, the first active layer ACT1 of the first transistor TR1 may overlap with the second active layer ACT2 of the at least one second transistor TR2. Therefore, the area of the gate driver GD may be reduced or minimized by densely disposing circuit elements configuring (or included in) the gate driver GD at (e.g., in or on) the non-display area NDA.

The first insulating layer INS1 may be disposed on the first active layer ACT1 to cover the first active layer ACT1. For example, the first insulating layer INS1 may include (or may be) a first gate insulating layer that is interposed between each first active layer ACT1 and each first gate electrode GAT1. The first insulating layer INS1 may be configured of (or may include) a single layer or multiple layers, and may include at least one inorganic insulating material and/or an organic insulating material. For example, the first insulating layer INS1 may include various suitable kinds of organic/inorganic insulating materials as would be known to those skilled in the art, for example, such as silicon nitride (SiNx), silicon oxide (SiOx), and/or the like. However, a structure and/or a configuration material of the first insulating layer INS1 are not limited thereto.

The first gate electrode GAT1 may be disposed to overlap with the first active layer ACT1 with the first insulating layer INS1 interposed therebetween. For example, the first gate electrode GAT1 may be disposed on the first insulating layer INS1 to overlap with a region (e.g., the channel region) of the first active layer ACT1. The first gate electrode GAT1 may be configured of (or may include) a single layer or multiple layers, and may have conductivity by including at least one conductive material.

The second insulating layer INS2 may be interposed between the first transistor TR1 (for example, the plurality of first transistors TR1) and the second transistor TR2 (for example, the plurality of second transistors TR2). For example, the second insulating layer INS2 may be disposed on the first gate electrode GAT1 to cover the first active layer ACT1 and the first gate electrode GAT1. The second insulating layer INS2 may be configured of (or may include) a single layer or multiple layers. For example, the second insulating layer INS2 may be configured of (or may include) multiple layers including a lower insulating layer INS2_1 that is disposed on (e.g., directly on) the first gate electrode GAT1, and an upper insulating layer INS2_2 that is disposed on the lower insulating layer INS2_1.

In addition, the second insulating layer INS2 may include at least one inorganic insulating material and/or an organic insulating material. For example, each of the lower insulating layer INS2_1 and the upper insulating layer INS2_2 of the second insulating layer INS2 may include various suitable kinds of organic/inorganic materials as would be known to those skilled in the art, for example, such as silicon nitride (SiNx), silicon oxide (SiOx), and/or the like. However, a structure and/or a configuration material of the second insulating layer INS2 are not limited thereto.

In an embodiment, after the second insulating layer INS2 is formed, a process of planarizing a surface of the second insulating layer INS2 may be further performed through a chemical mechanical polishing process or the like. For example, after the lower insulating layer INS2_1 and/or the upper insulating layer INS2_2 of the second insulating layer INS2 is formed, a planarization process, for example, such as a chemical mechanical polishing process may be performed.

In addition, according to an embodiment, when the second insulating layer INS2 is formed of multiple layers including the lower insulating layer INS2_1 and the upper insulating layer INS2_2, at least one conductive pattern CDP may be further formed between the lower insulating layer INS2_1 and the upper insulating layer INS2_2. For example, at least one conductive pattern CDP may be formed between the lower insulating layer INS2_1 and the upper insulating layer INS2_2 of the second insulating layer INS2 so as to overlap with or not overlap with at least one first and/or second transistors TR1 and/or TR2.

In an embodiment, the conductive pattern CDP may be disposed to overlap with the at least one first transistor TR1 or second transistor TR2 to configure (or to form) a light blocking pattern or an electrode (for example, a back-gate electrode) of the at least one first transistor TR1 or second transistor TR2. In another embodiment, the conductive pattern CDP may configure an electrode (e.g., one electrode) of at least one first driver capacitor CS or second driver capacitor CE.

The second active layer ACT2 may be disposed on the second insulating layer INS2. The second active layer ACT2 may include the channel region that overlaps with the second gate electrode GAT2, and the source and drain regions positioned on respective sides (e.g., opposite sides) of the channel region.

According to an embodiment, the second active layer ACT2 may include (or may be) a semiconductor pattern formed of polysilicon, amorphous silicon, oxide semiconductor, and/or the like. In addition, the channel region of the second active layer ACT2 may be an intrinsic semiconductor region in which an impurity is not doped, and each of the source and drain regions of the second active layer ACT2 may be a conductive region in which a suitable impurity (e.g., a predetermined impurity) is doped.

In an embodiment, the second active layers ACT2 of the second transistors TR2 (e.g., the first driver transistors TS) configuring (e.g., that are included in) each scan stage SST may be formed of the same or substantially the same (e.g., or similar) material as each other. For example, the second active layers ACT2 may be formed of the same or substantially the same material including, for example, at least one from among polysilicon, amorphous silicon, and oxide semiconductor. For example, each of (or all of) the second active layers ACT2 may be formed of polysilicon that is manufactured through a crystallization process using a laser. However, the disclosure is not limited thereto. For example, in another embodiment, at least one second transistor TR2 may include a second active layer ACT2 formed of a material that is different from that of the second active layer ACT2 of at least one of the other remaining second transistors TR2.

The third insulating layer INS3 may be disposed on the second active layer ACT2 to cover the second active layer ACT2. For example, the third insulating layer INS3 may include (or may be) a second gate insulating layer that is interposed between each second active layer ACT1 and each second gate electrode GAT2. The third insulating layer INS3 may be configured of (or may include) a single layer or multiple layers, and may include at least one inorganic insulating material and/or an organic insulating material. For example, the third insulating layer INS3 may include various suitable kinds of organic/inorganic insulating materials as would be known to those skilled in the art, for example, such as silicon nitride (SiNx), silicon oxide (SiOx), and/or the like. However, a structure and/or a configuration material of the third insulating layer INS3 are not limited thereto.

The second gate electrode GAT2 may be disposed to overlap with the second active layer ACT2 with the third insulating layer INS3 interposed therebetween. For example, the second gate electrode GAT2 may be disposed on the third insulating layer INS3 to overlap with a region (e.g., the channel region) of the second active layer ACT2. The second gate electrode GAT2 may be configured of (or may include) a single layer or multiple layers, and may have conductivity by including at least one conductive material.

The fourth insulating layer INS4 may be disposed on the second gate electrode GAT2 to cover the second active layer ACT2 and the second gate electrode GAT2 of the second transistor TR2 (for example, the plurality of second transistors TR2). The fourth insulating layer INS4 may be configured of (or may include) a single layer or multiple layers, and may include at least one inorganic insulating material and/or an organic insulating material. For example, the fourth insulating layer INS4 may include various suitable kinds of organic/inorganic insulating materials as would be known to those skilled in the art, for example, such as silicon nitride (SiNx), silicon oxide (SiOx), and/or the like. However, a structure and/or a configuration material of the fourth insulating layer INS4 are not limited thereto. In an embodiment, after the fourth insulating layer INS4 is formed, a process of planarizing a surface of the fourth insulating layer INS4 may be further performed through a chemical mechanical polishing process or the like.

The first and second source electrodes SE1 and SE2 and the first and second drain electrodes DE1 and DE2 may be spaced apart from each other on the fourth insulating layer INS4. The first and second source electrodes SE1 and SE2 and the first and second drain electrodes DE1 and DE2 are connected to respective regions of the active layers (the first active layer ACT1 or the second active layer ACT2).

The first source electrode SE1 may be disposed on the first active layer ACT1 with the first to fourth insulating layers INS1 to INS4 interposed therebetween. The first source electrode SE1 may be connected to one region (for example, the source region) of the first active layer ACT1 through at least one contact hole that extends (e.g., passes) through the first to fourth insulating layers INS1 to INS4. However, the disclosure is not limited thereto, and according to an embodiment, the first source electrode SE1 may not be formed separately from the first active layer ACT1, and instead, may be formed integrally with the first active layer ACT1. For example, in another embodiment of the disclosure, the source region of at least one first active layer ACT1 may be directly connected to one electrode of another circuit element (for example, another transistor and/or another capacitor), or to a desired or a predetermined line (for example, the first line LI1).

The first drain electrode DE1 may be disposed on the first active layer ACT1 with the first to fourth insulating layers INS1 to INS4 interposed therebetween. The first drain electrode DE1 may be connected to another region (for example, the drain region) of the first active layer ACT1 through at least one contact hole that extends (e.g., passes) through the first to fourth insulating layers INS1 to INS4. However, the disclosure is not limited thereto, and according to an embodiment, the first drain electrode DE1 may not be formed separately from the first active layer ACT1, and instead, may be formed integrally with the first active layer ACT1. For example, in another embodiment of the disclosure, the drain region of at least one first active layer ACT1 may be directly connected to one electrode of another circuit element (for example, another transistor and/or another capacitor), or to a desired or a predetermined line (for example, the second line LI2).

The second source electrode SE2 may be disposed on the second active layer ACT2 with the third and fourth insulating layers INS3 and INS4 interposed therebetween. The second source electrode SE2 may be connected to one region (for example, the source region) of the second active layer ACT2 through at least one contact hole that extends (e.g., passes) through the third and fourth insulating layers INS3 and INS4. However, the disclosure is not limited thereto, and according to an embodiment, the second source electrode SE2 may not be formed separately from the second active layer ACT2, and instead, may be formed integrally with the second active layer ACT2. For example, in another embodiment of the disclosure, the source region of at least one second active layer ACT2 may be directly connected to one electrode of another circuit element (for example, another transistor and/or another capacitor), or to a desired or a predetermined line (for example, the third line LI3).

The second drain electrode DE2 may be disposed on the second active layer ACT2 with the third and fourth insulating layers INS3 and INS4 interposed therebetween. The first second drain electrode DE2 may be connected to another region (for example, the drain region) of the second active layer ACT2 through at least one contact hole that extends (e.g., passes) through the third and fourth insulating layers INS3 and INS4. However, the disclosure is not limited thereto, and according to an embodiment, the second drain electrode DE2 may not be formed separately from the second active layer ACT2, and instead, may be formed integrally with the second active layer ACT2. For example, in another embodiment of the disclosure, the drain region of at least one second active layer ACT2 may be directly connected to one electrode of another circuit element (for example, another transistor and/or another capacitor), or to a desired or a predetermined line (for example, the fourth line LI4).

Referring to FIGS. 1A to 12B, the gate driver GD according to an embodiment of the disclosure includes the scan driver SD and the light emission control driver ED that overlap with each other, and the light emission control driver ED may be disposed above (e.g., on) the scan driver SD. For example, the scan driver SD may include the scan stage SST having the first transistor TR1, and the light emission control driver ED may include the light emission control stage EST having the second transistor TR2.

For example, each scan stage SST may include a plurality of first driver transistors TS, and each of the first driver transistors TS may be (e.g., may have the same or substantially the same structure as that of) the first transistor TR1 including the first active layer ACT1 disposed at (e.g., in or on) the first layer on the base layer BSL. In addition, each light emission control stage EST may include a plurality of second driver transistors TE, and each of the second driver transistors TE may be (e.g., may have the same or substantially the same structure as that of) the second transistor TR2 including the second active layer ACT2 disposed at (e.g., in or on) the second layer that is positioned above (e.g., on) the first layer on the base layer BSL.

Figure 12B:
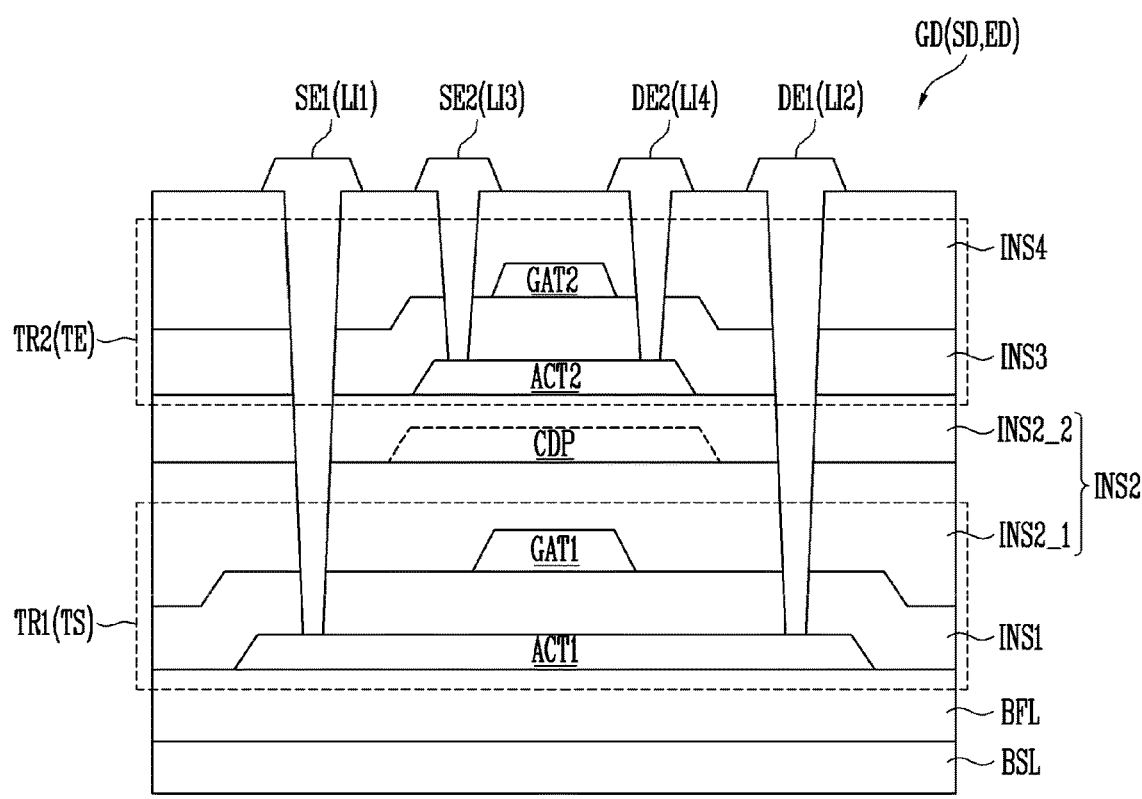
Figure 13:
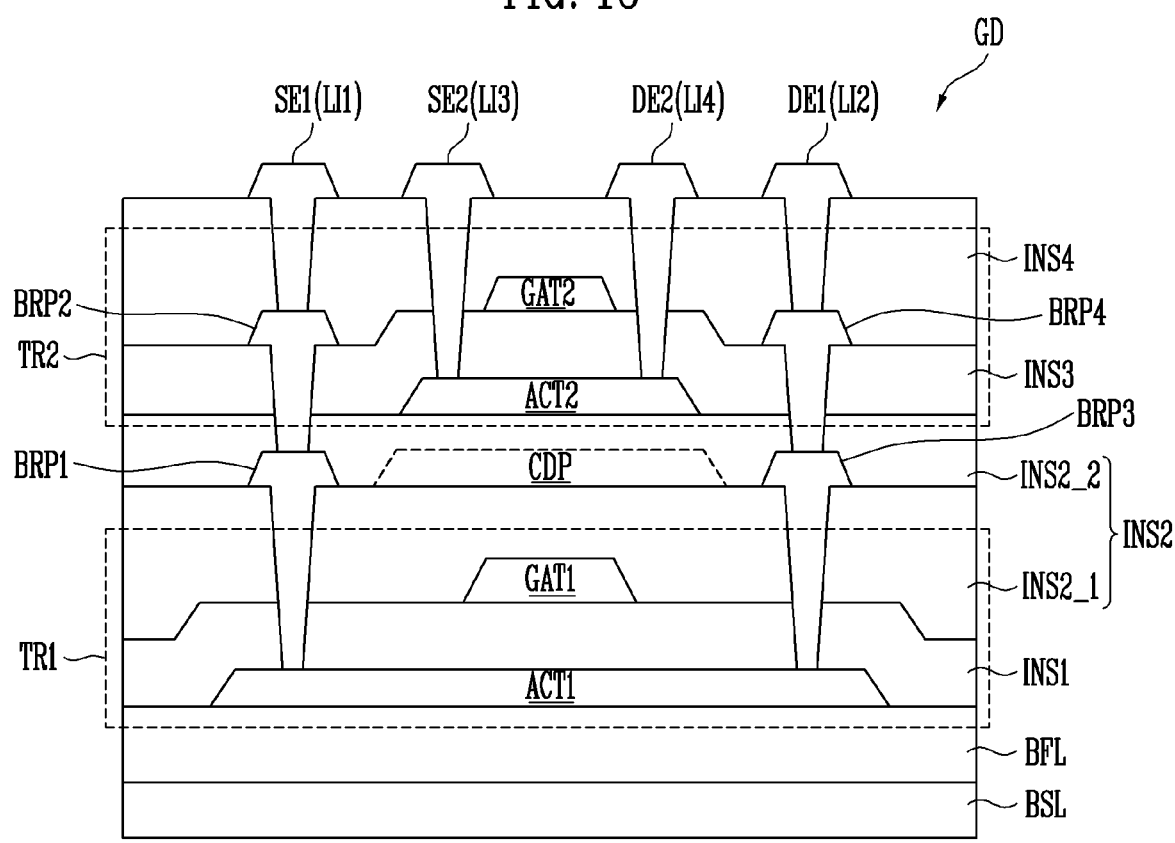
FIG. 13 illustrates a cross sectional view of the gate driver according to an embodiment of the disclosure.

In the embodiments of FIGS. 12A and 12B, the gate driver GD may include the first transistor TR1 and the second transistor TR2 that are disposed to overlap with each other. In addition, one of the first transistor TR1 and the second transistor TR2 may be one of the first driver transistor TS of the scan driver SD and the second driver transistor TE of the light emission control driver ED, and the other one of the first transistor TR1 and the second transistor TR2 may be the other one of the first driver transistor TS and the second driver transistor TE. In other words, according to an embodiment, the scan driver SD and the light emission control driver ED may be divided and disposed at (e.g., in or on) different layers from each other in the gate driver GD.

According to an embodiment, the first transistor TR1 and the second transistor TR2 may have different characteristics. For example, the first transistor TR1 and the second transistor TR2 may have different threshold voltages.

In an embodiment, each of the first transistor TR1 and the second transistor TR2 may be formed as a P-type transistor, and the threshold voltage of the first transistor TR1 may be greater than the threshold voltage of the second transistor TR2. For example, after crystallizing the first active layer ACT1 to have a threshold voltage having a desired value or range (e.g., a predetermined value or range), a positive shift in which the threshold voltage of the first active layer ACT1 increases may occur due to one or more subsequent processes of forming and crystallizing the second active layer ACT2 on the first active layer ACT1, and/or the like. Therefore, according to an embodiment of the disclosure, the stacked structure of the gate driver GD may be designed in consideration of the difference in characteristics between the first transistor TR1 and the second transistor TR2.

For example, for each of the first driver transistors TS configuring each scan stage SST and the second driver transistors TE configuring each emission control stage EST, an operation characteristic for a change in threshold voltage may be tested, and the position of each layer of the first driver transistors TS and the second driver transistors TE may be determined according to (e.g., based on or depending on) a result of the test. For example, assuming that the result of the test indicates that the first driver transistors TS exhibit an operation characteristic that is improved over (e.g., better than) that of the second driver transistors TE with respect to a negative shift corresponding to a threshold voltage drop, and the second driver transistors exhibit an operation characteristic that is improved over (e.g., better than) that of the first driver transistors TS with respect to the positive shift corresponding to the threshold voltage increase. In this case, the second driver transistors TE may be formed at (e.g., in or on) a lower layer as the first transistors (e.g., as each first transistor) TR1, and the first driver transistors TS may be formed at (e.g., in or on) an upper layer as the second transistors (e.g., as each second transistor) TR2.

On the other hand, when the second driver transistors TE exhibit an improved (e.g., a better) operation characteristic with respect to the negative shift of the threshold voltage, and the first driver transistors TS exhibit an improved (e.g., a better) operation characteristic with respect to the positive shift of the threshold voltage, the first driver transistors TS may be formed at (e.g., in or on) the lower layer as the first transistors (e.g., as each first transistor) TR1, and second driver transistors TE may be formed at (e.g., in or on) the upper layer as the second transistors (e.g., as each second transistor) TR2.

In addition, in consideration of various factors, the first driver transistors TS and the second driver transistors TE may be divided and disposed at (e.g., in or on) different layers from each other. As described above, when the first driver transistors TS and the second driver transistors TE are disposed at (e.g., in or on) different layers from each other, the characteristic of the first driver transistors TS and the characteristic of the second driver transistors TE may be independently controlled.

Referring to FIGS. 1A to 12C, the gate driver GD according to an embodiment of the disclosure may include at least the scan driver SD, and may be formed as a stacked scan driver SD including the first transistor TR1 having the first active layer ACT1 on the first layer and the second transistor TR2 having the second active layer ACT2 on the second layer. For example, some of the first driver transistors TS configuring (e.g., that are included in) each scan stage SST may be formed at (e.g., in or on) the lower layer as the first transistors (e.g., as each first transistor) TR1, and the other of the first driver transistors TS may be disposed at (e.g., in or on) the upper layer as the second transistors (e.g., as each second transistor) TR2.

For example, from among the first driver transistors TS configuring (e.g., included in) the scan stage SST of FIG. 6, the transistors of the output unit 130 (for example, the seventh and eighth transistors TS7 and TS8 of the scan stage SST), which are used to ensure a higher on-current and occupy a relatively large area, may be formed as the first transistors TR1 of the lower layer. In addition, from among the first driver transistors TS, at least some of transistors of the input unit 110 and the controller 120 (for example, the first to sixth transistors TS1 to TS6 of the scan stage SST), which are used to ensure a stable threshold voltage characteristic to prevent or substantially prevent malfunction of the scan driver SD, may be formed as the second transistors TR2 of the upper layer.

For example, each scan stage SST may include the input unit 110 including the second transistors TR2, the controller 120 including other ones of the second transistors TR2, and the output unit 130 including the first transistors TR1. Each of the first driver capacitors CS1 may include at least one electrode disposed on the same or substantially the same layer as those of some of the electrodes of the first and second transistors TR1 and TR2.

Referring to FIGS. 1A to 12D, the gate driver GD according to an embodiment of the disclosure may include at least the light emission control driver ED, and the light emission control driver ED may be formed as a stacked scan driver including the first transistor TR1 having the first active layer ACT1 on the first layer and the second transistor TR2 having the second active layer ACT2 on the second layer. For example, some of the second driver transistors TE configuring (e.g., included in) each light emission control stage EST may be formed at (e.g., in or on) the lower layer as the first transistors (e.g., as each first transistor) TR1, and the other of the second driver transistors TE may be disposed at (e.g., in or on) the upper layer as the second transistors (e.g., as each second transistor) TR2.

For example, from among the second driver transistors TE configuring (e.g., that are included in) the light emission control stage EST of FIG. 9, the transistors of the output unit 240 (for example, the ninth and tenth transistors TE9 and TE10 of the light emission control stage EST), which are used to ensure a higher on-current and occupy a relatively large area, may be formed as the first transistors TR1 of the lower layer. In addition, from among the second driver transistors TE, at least some of the transistors of the input unit 210, the first controller 220, and the second controller 230 (for example, the first to eighth transistors TE1 to TE8 of the light emission control stage EST), which are used to ensure a stable threshold voltage characteristic to prevent or substantially prevent malfunction of the light emission control driver ED, may be formed as the second transistors TR2 of the upper layer.

For example, each light emission control stage EST may include the input unit 210 including the second transistors TR2, the first control unit 220 including other one of the second transistors TR2, the second control unit 230 including still other ones of the second transistors TR2 that are not included in the second transistors TR2 of the input unit 210 and the second transistors TR2 of the first control unit 220, and the output unit 240 including the first transistors TR1. Each of the second driver capacitors CE may include at least one electrode disposed on the same or substantially the same layer as those of some of the electrodes of the first and second transistors TR1 and TR2.

Figure 12C:
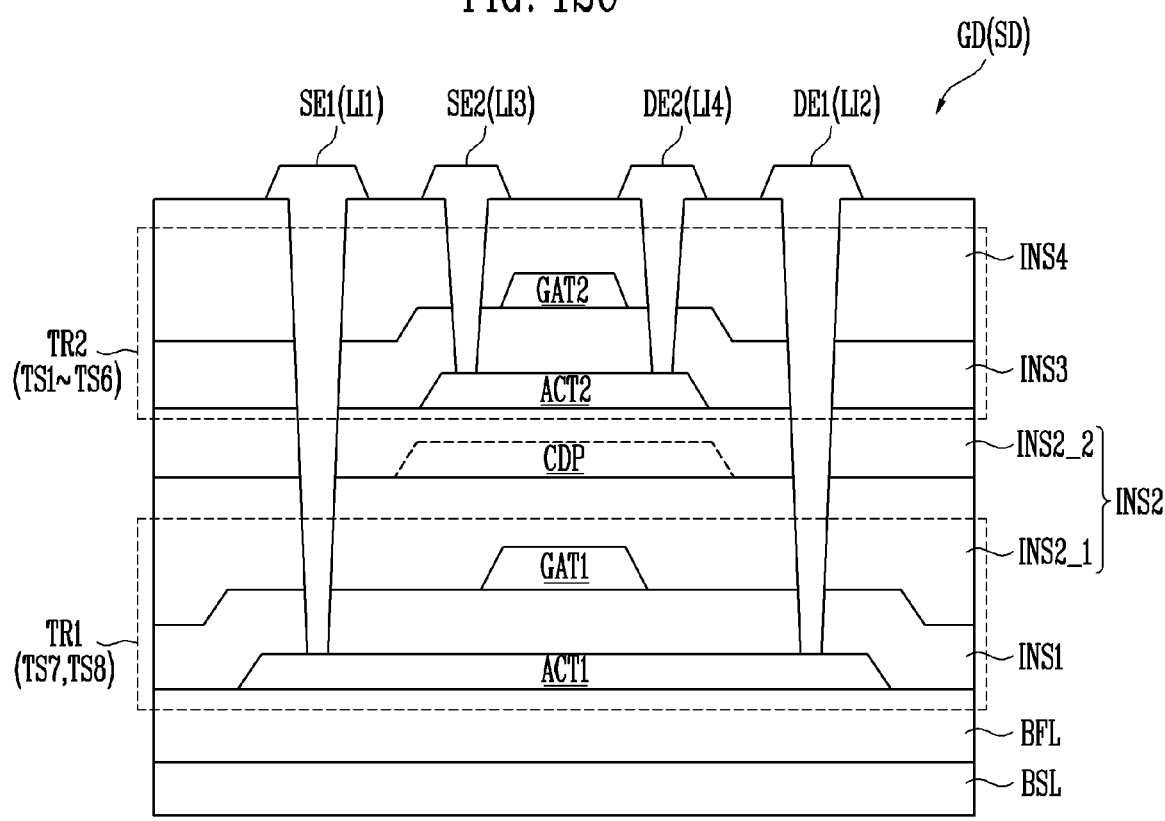
Figure 12D:
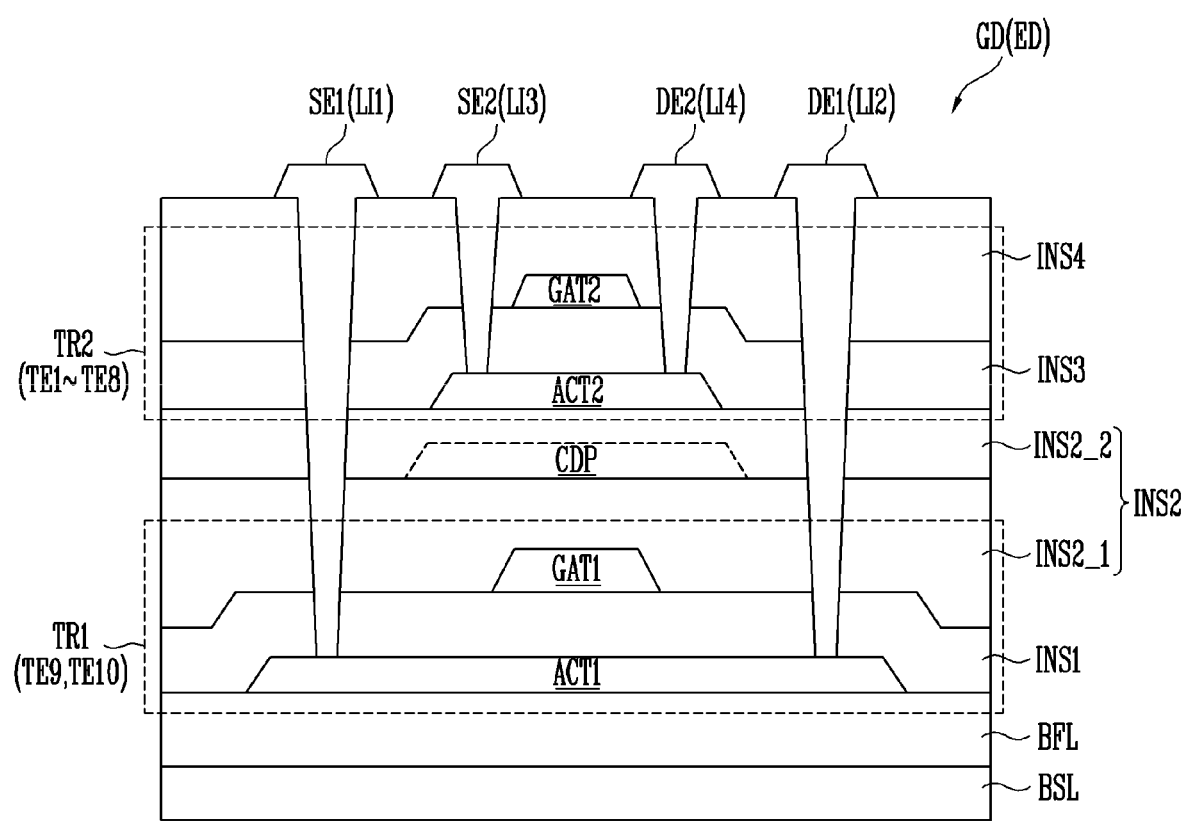

In the embodiments of FIGS. 12C and 12D, each of the scan driver SD and the light emission control driver ED may include the first transistor TR1 and the second transistor TR2 that are divided and disposed at (e.g., in or on) different layers from each other. For example, the first driver transistors TS may be divided and disposed at (e.g., in or on) the lower layer and the upper layer in consideration of the characteristics used for each of the first driver transistors TS. Similarly, the second driver transistors TE may be divided and disposed at (e.g., in or on) the lower layer and the upper layer in consideration of the characteristics used for each of the second driver transistors TE.

Referring to FIGS. 1 to 13, according to an embodiment of the disclosure, at least one electrode from among the first and second source electrodes SE1 and SE2 and the first and second drain electrodes DE1 and DE2 may be connected to an active layer or each active layer (for example, the first active layer ACT1 and/or the second active layer ACT2) through a multi-stage contact structure that is formed through at least one bridge pattern. For example, the first source electrode SE1 may be connected to the source region of the first active layer ACT1 through first and second bridge patterns BRP1 and BRP2, and the first drain electrode DE1 may be connected to the drain region of the first active layer ACT1 through third and fourth bridge patterns BRP3 and BRP4. In this case, even though a distance between the first source and drain electrodes SE1 and DE1 and the first active layer ACT1 increases, the first source electrode SE1 and the first drain electrode DE1 may be stably connected to the first active layer ACT1.

In an embodiment, each bridge pattern may be disposed at (e.g., in or on) the same or substantially the same layer as that of any one of the first gate electrode GAT1, the second gate electrode GAT2, and the conductive pattern CDP. For example, the first and third bridge patterns BRP1 and BRP3 may be disposed at (e.g., in or on) the same or substantially the same layer as that of the conductive pattern CDP, and the second and fourth bridge patterns BRP2 and BRP4 may be disposed at (e.g., in or on) the same or substantially the same layer as that of the second gate electrode GAT2. In this case, the bridge patterns may be formed (e.g., easily formed) inside the gate driver GD without increasing the number of conductive layers configuring (or included in) the gate driver GD.

According to one or more of the embodiments described above, in consideration of the characteristics used for each transistor configuring (or included in) the gate driver GD, the transistors configuring (or included in) the gate driver GD may be divided into at least two groups and may be disposed at (e.g., in or on) different layers from each other. Therefore, while configuring (or forming) the high-density gate driver GD having a reduced area, the operation characteristic of the gate driver GD may be improved or secured.

Figure 14:
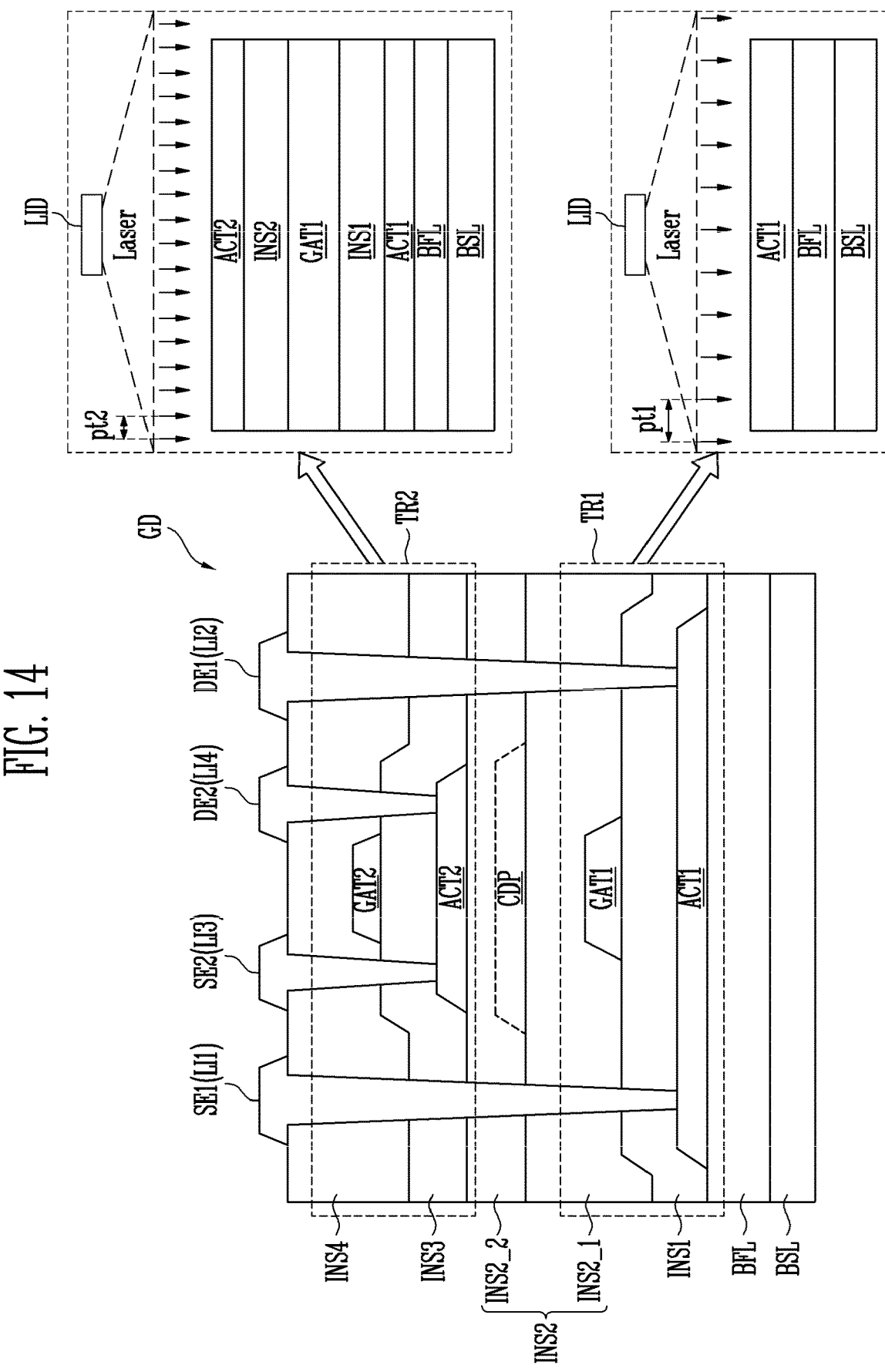
FIG. 14 illustrates a method of manufacturing the display device according to an embodiment of the disclosure.

FIG. 14 illustrates a method of manufacturing the display device according to an embodiment of the disclosure. For example, FIG. 14 illustrates an embodiment of a method of crystallizing the first and second active layers ACT1 and ACT2 of the stacked gate driver GD according to one or more of the above-described embodiments. For convenience, FIG. 14 shows an illustration that may emphasize a method characteristic for controlling a crystallization condition of the first and second active layers ACT1 and ACT2, and thus, a cross-sectional structure of a crystallization process is schematically shown in more detail in FIG. 14.

Referring to FIGS. 1A to 14, the first active layer ACT1 and the second active layer ACT2 are disposed at (e.g., in or on) different layers from each other. In this case, the first active layer ACT1 and the second active layer ACT2 may be crystallized under different conditions from each other. For example, the display device according to an embodiment of the disclosure may include the gate driver GD including the first transistor TR1 and the second transistor TR2 that are disposed at (e.g., in or on) different layers from each other. In addition, the method of manufacturing the display device may include forming the first active layer ACT1 of the first transistor TR1 on the base layer BSL, and forming the second active layer ACT2 of the second transistor TR2 on the first active layer ACT1. The first active layer ACT1 and the second active layer ACT2 may be crystallized under different conditions from each other. For example, a pitch of a laser that is emitted to the first and second active layers ACT1 and ACT2 may be set to be different when crystallizing the first and second active layers ACT1 and ACT2 using a laser emission device LID.

According to an embodiment, the crystallizing of the first active layer ACT1 may include crystallizing the first active layer ACT1 by emitting the laser at a first pitch pt1 after forming the first active layer ACT1 on the surface of the base layer BSL on which the buffer layer BFL is formed. The crystallizing of the first active layer ACT1 may be performed before the formation of the second active layer ACT2. In other words, the first active layer ACT1 and the second active layer ACT2 may be crystallized sequentially in different processes from each other.

According to an embodiment, the crystallizing of the second active layer ACT2 may include crystallizing the second active layer ACT2 by emitting the laser at a second pitch pt2 on the second active layer ACT2 after forming the second active layer ACT2 on the surface of the base layer BSL on which the buffer layer BFL, the first active layer ACT1, the first insulating layer INS1, the first gate electrode GAT1, and the second insulating layer INS2 are sequentially formed. In addition, during the crystallizing of the second active layer ACT2, the laser may be additionally emitted to at least one region of the crystallized (e.g., previously crystallized) first active layer ACT1.

According to an embodiment, the first active layer ACT1 and the second active layer ACT2 are sequentially formed and crystallized, and some characteristics of the first active layer ACT1 may be changed due to a subsequent process even after the crystallization process (e.g., of the first active layer ACT1 and/or the second active layer ACT2) is completed. For example, the threshold voltage of the first active layer ACT1 may be changed (shifted) due to an influence of the subsequent process.

In an embodiment, in consideration of the threshold voltage shift of the first active layer ACT1, the transistors that are relatively robust to the threshold voltage shift may be disposed at (e.g., in or on) the lower layer as the first transistors TR1. For example, buffer transistors (e.g., the seventh and eighth transistors TS7 and TS8 of the scan stage SST) that are disposed at (e.g., in or on) the output units 130 of the scan stage SST may be disposed at (e.g., in or on) the lower layer as the first transistors TR1. In another example, buffer transistors (e.g., the ninth and tenth transistors TE9 and TE10 of the light emission control stage EST) that are disposed at (e.g., in or on) the output units 240 of the light emission control stage EST may be disposed at (e.g., in or on) the lower layer as the first transistors TR1.

In these cases, the first pitch pt1 of the laser for crystallizing the first active layer ACT1 may be greater than the second pitch pt2 of the laser for crystallizing the second active layer ACT2 in consideration of the characteristics used (or desired) for each of the first and second transistors TR1 and TR2. In an embodiment, the first pitch pt1 may be about 20.3 μm, and the second pitch pt2 may be less than 20.3 μm, but the pitch of the laser emitted in the crystallization processes is not limited thereto. In another embodiment, the second pitch pt2 of the laser for crystallizing the second active layer ACT2 may be greater than the first pitch pt1 of the laser for crystallizing the first active layer ACT1 in consideration of the characteristics used (or desired) for each of the first and second transistors TR1 and TR2. In an embodiment, the first pitch pt1 may be about 20.3 μm, and the second pitch pt2 may be greater than 20.3 μm, but the pitch of the laser emitted in the crystallization processes is not limited thereto.

Therefore, each first active layer ACT1 may have different characteristics from those of each second active layer ACT2. For example, the first active layer ACT1 may have a degree of crystallization that is less than that of the second active layer ACT2.

However, the disclosure is not limited thereto. For example, the crystallization conditions of the first active layer ACT1 and the second active layer ACT2, and/or the degree of crystallizations of the first active layer ACT1 and the second active layer ACT2 according to the crystallization conditions may be variously modified according to the characteristics used (or desired) for each of the first transistor TR1 and the second transistor TR2, as would be understood by those skilled in the art.

According to the above-described embodiment, a time used (e.g., or required) for the crystallization process of at least some of the active layers (for example, the first active layers ACT1) may be shortened while improving or securing the operation characteristic of the gate driver GD. Therefore, a tact time of the display device may be reduced, and manufacturing efficiency thereof may be improved.

In addition, when the first transistor (e.g., each first transistor) TR1 has a relatively large area as compared to the second transistor (e.g., each second transistor) TR2, the second transistor (e.g., at least one second transistor) TR2 may be formed at (e.g., in or on) an area that completely overlaps with the first transistor (e.g., any suitable one of the first transistors) TR1. In this case, disconnection (e.g., between an electrode of the second transistor TR2 and the second active layer ACT2) may be prevented or substantially prevented by reducing or minimizing a step difference of the at least one second active layer ACT2.

According to one or more of the above-described embodiments, the crystallization conditions of the first active layer ACT1 and the second active layer ACT2 may be controlled independently from each other for each layer in consideration of the characteristics used (or desired) for each transistor configuring (e.g., that is included in) the gate driver GD. Therefore, the manufacturing efficiency of the gate driver GD may be increased while improving or securing the operation characteristic of the gate driver GD.

Figure 15:
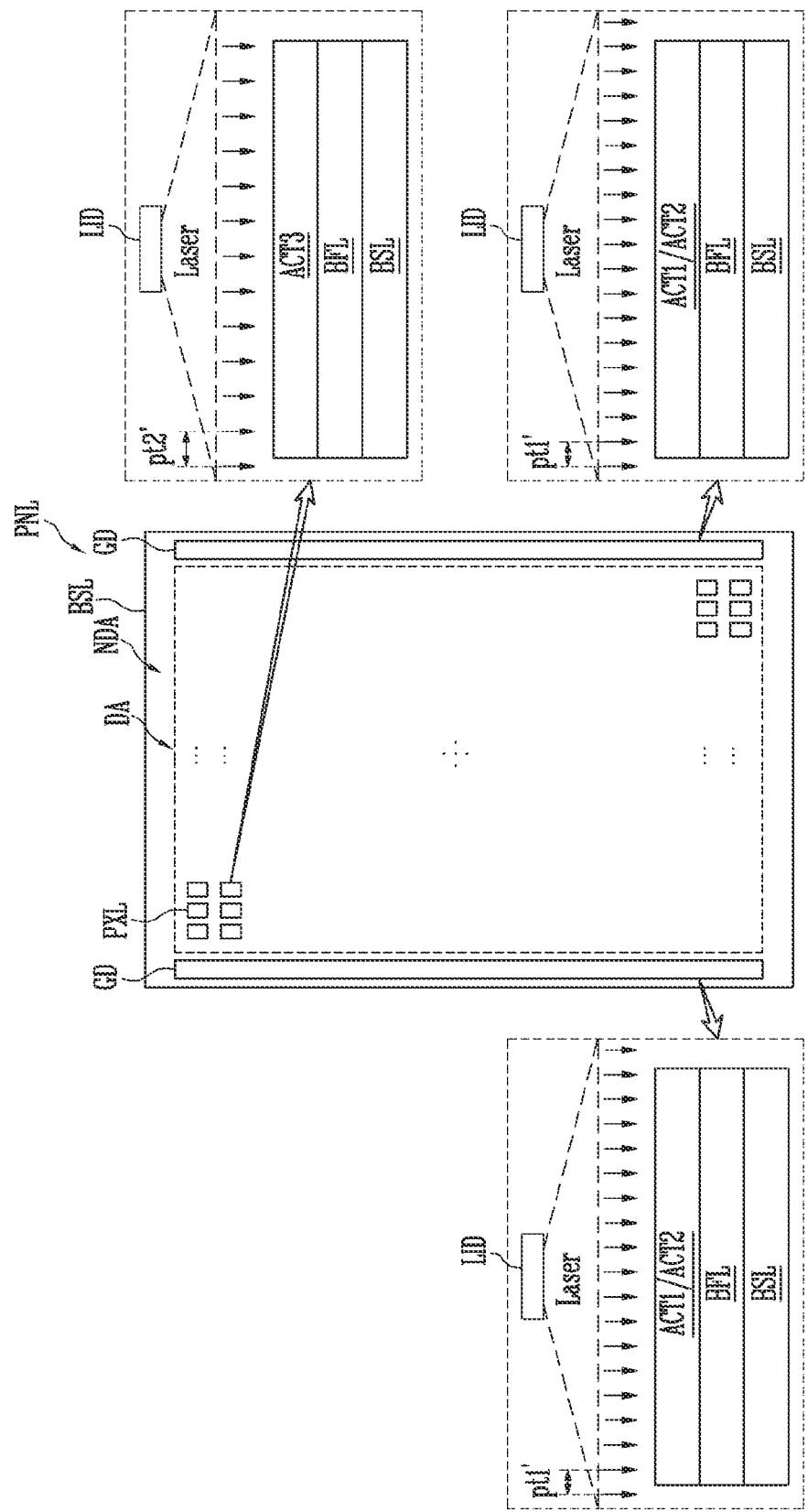
FIG. 15 illustrates a method of manufacturing the display device according to an embodiment of the disclosure.

FIG. 15 illustrates a method of manufacturing the display device according to an embodiment of the disclosure. For example, FIG. 15 illustrates an embodiment of a method of crystallizing the active layers of the display area DA and the non-display area at (e.g., in or on) the display panel PNL including the pixels PXL and the gate driver GD at (e.g., in or on) the display area DA and the non-display area NDA, respectively. For convenience, FIG. 15 shows an illustration that may emphasize a method characteristic for controlling the crystallization conditions of the active layers, and thus, the cross-sectional structure of a crystallization process is schematically shown in more detail in FIG. 15.

Referring to FIGS. 1A to 15, the gate driver GD may include the first transistors TR1 and/or the second transistors TR2 including the first and/or second active layers ACT1 and/or ACT2 that are disposed at (e.g., in or on) a suitable layer (e.g., a predetermined layer) on the base layer BSL. The first and/or second active layers ACT1 and ACT2 may be formed at (e.g., in or on) an embedded circuit area (e.g., a gate driver area) of the non-display area NDA.

In addition, each pixel PXL may include one or more pixel transistors TP including respective third active layers ACT3 that are disposed at (e.g., in or on) a suitable layer (e.g., a predetermined layer) on the base layer BSL (for example, an upper portion of the buffer layer BFL). The third active layers ACT3 of each of the pixels PXL may be formed at (e.g., in or on) the display area DA (e.g., at each pixel area).

According to an embodiment, the first active layers ACT1 and/or the second active layers ACT2 of the non-display area NDA, and the third active layers ACT3 of the display area DA may be crystallized under different conditions from each other. For example, the method of manufacturing the display device according to an embodiment of the disclosure may include forming the first and second transistors TR1 and TR2 including the first and second active layers ACT1 and ACT2, respectively, at (e.g., in or on) the non-display area NDA, and forming the pixel transistors TP including the respective third active layers ACT3 at (e.g., in or on) the display area DA. In addition, in manufacturing the display device, the third active layers ACT3 may be crystallized under different conditions from that of at least one of the first and second active layers ACT1 and ACT2.

In an embodiment, a more stable threshold voltage characteristic may be used (or desired) for the first and/or second transistors TR1 and/or TR2 that configure (e.g., or that are included in) the gate driver GD compared to those of the pixel transistors TP. For example, each pixel PXL may be configured to have the same or substantially the same structure as that of the pixel PXL shown in the embodiment of FIG. 3B, and may compensate for a characteristic deviation of the pixels PXL through an external compensation method. In this case, even though a threshold voltage deviation (or a threshold voltage variation) may occur between the driving transistors of the pixels PXL, the pixels PXL may emit light at a uniform or substantially uniform luminance corresponding to each data signal by converting the image data so that the threshold voltage deviation (or the threshold voltage variation) may be compensated.

In this case, when crystallizing at least one active layer from among the first and second active layers ACT1 and ACT2, a laser may be densely emitted to the at least one active layer at a relatively small first pitch pt1' (for example, about 20.3 μm), and when crystallizing the third active layers ACT3, the laser may be emitted to the third active layers at a second pitch pt2' that is greater than the first pitch pt1' (for example, a pitch that is greater than 20.3 μm). Therefore, the third active layer (e.g., each third active layer) ACT3 may have a degree of crystallization that is less than that of at least one active layer from among the first and second active layers ACT1 and ACT2.

However, the disclosure is not limited thereto. For example, the crystallization conditions of the first and/or second active layers ACT1 and/or ACT2 and the third active layers ACT3 may be variously modified according to one or more transistor characteristics that are used (or desired) for the gate driver GD and the pixels PXL, respectively.

In addition, according to an embodiment, the pixel transistors TP may be formed to have a stacked structure. For example, some of the plurality of pixel transistors TP configuring (e.g., included in) each pixel PXL may be disposed at (e.g., in or on) a lower layer to include respective active layers that are disposed at (e.g., in or on) the same or substantially the same layer as that of the first active layer ACT1, and others of the pixel transistors TP may be disposed on the upper layer to include respective active layers that are disposed at (e.g., in or on) the same or substantially the same layer as that of the second active layer ACT2.

According to one or more of the above-described embodiments, the crystallization conditions of the active layers (for example, the first and/or second active layers ACT1 and ACT2 and the third active layers ACT3) formed on the display panel PNL may be controlled independently from each other for each region in consideration of the characteristics used (or desired) for the transistors included in the gate driver GD and the pixels PXL and/or the manufacturing efficiency of the display device. Therefore, a time used for the crystallization process of the active layers may be shortened while improving or securing the operation characteristic used (or desired) for each of the gate driver GD and the pixels PXL. For example, when crystallizing the third active layers ACT3 of the display area DA, the time used for the crystallization process of the third active layers ACT3 may be shortened by emitting the laser at a greater pitch. Thus, the tact time of the display device may be reduced, and manufacturing efficiency thereof may be improved. For example, when the display device is enlarged in size, a time used for crystallizing the pixel transistors TP of the display area DA may be reduced (e.g., significantly shortened) by one or more of the above-described methods.

According to the display device and the method of manufacturing the same according to various embodiments of the disclosure as described above, the first and second transistors TR1 and TR2 configuring (e.g., included in) the gate driver GD are divided and disposed at (e.g., in or on) different layers from each other. Therefore, a space utilization efficiency may be increased, and a high-density stacked gate driver GD may be formed. Accordingly, even though the gate driver GD is disposed at (e.g., in or on) the display panel PNL, the area occupied by the gate driver GD may be reduced, and thus, the non-display area NDA of the display panel PNL may be effectively reduced.

In addition, according to the display device and the method of manufacturing the same according to various embodiments of the disclosure, each of the first transistor TR1 and the second transistor TR2 may be configured by dividing the transistors of the gate driver GD into different layers from each other in consideration of the characteristics used (or desired) for each of the transistors (for example, the first driver transistors TS and/or the second driver transistors TE) that configure (e.g., that are included in) the gate driver GD. In addition, the crystallization conditions of the first and second active layers ACT1 and ACT2 may be controlled for each layer by disposing the active layers of the first and second transistors TR1 and TR2 (e.g., the first and second active layers ACT1 and ACT2, respectively) at (e.g., in or on) different layers from each other. Therefore, the manufacturing efficiency of the display device may be improved while forming the first and second transistors TR1 and TR2 to satisfy the characteristics used (or desired) for the gate driver GD.

In addition, according to the display device and the method of manufacturing the same according to an embodiment of the disclosure, the active layers may be crystallized under different conditions for each region of the display panel PNL in consideration of the characteristics used (or desired) for each of the first and second transistors TR1 and TR2 that configure (or that are included in) the gate driver GD and the pixel transistors TP. For example, the active layers (e.g., the third active layers ACT3) of the pixel transistors TP may be crystallized under different conditions from that of at least one of the active layers of the first and second transistors TR1 and TR2 (e.g., the first and/or second active layers ACT1 and/or ACT2). Therefore, the manufacturing efficiency of the display device may be improved while improving or securing an operation characteristic of the display device.

While one or more example embodiments of the disclosure have been described with reference to the figures, it should be understood that the example embodiments described herein should be considered in a descriptive sense only and not for purposes of limitation. Accordingly, it will be understood by those having ordinary skill in the art that various modifications in form and details may be made therein without departing from the spirit and scope of the disclosure as defined by the following claims, and their equivalents.

What is claimed is:

1. A display device comprising:
a plurality of pixels connected to gate lines and data lines;
a gate driver to supply a gate signal to the gate lines; and
a data driver to supply a data signal to the data lines;
wherein the gate driver comprises:
a first transistor comprising a first active layer at a first layer;
a second transistor comprising a second active layer at a second layer on the first layer; and
an insulating layer on the second layer to cover the second active layer,
wherein the first and second transistors are different from pixel transistors of the plurality of pixels,
wherein the first active layer and the second active layer overlap with each other in a plan view and at least one contact hole penetrates through the insulating layer to expose a region of the first active layer that does not overlap with the second active layer in the plan view, and
wherein:
the first transistor further includes a first source electrode, a first drain electrode, and a first gate;
the second transistor further includes a second source electrode, a second drain electrode, and a second gate;
the at least one contact hole includes a first contact hole and a second contact hole;
the first source electrode fills the first contact hole such that the first source electrode and a portion of the first active layer are electrically connected to each other;
the first drain electrode fills the second contact hole such that the first drain electrode and another portion of the first active layer are electrically connected to each other;
the second source electrode is electrically connected to a portion of the second active layer;
the second drain electrode is electrically connected to another portion of the second active layer;
the display device further comprises:
a first insulating layer disposed between the first active layer and the first gate; and
a second insulating layer disposed between the first gate and the second active layer;
the insulating layer includes a third insulating layer, and a fourth insulating layer on the third insulating layer;
at least a portion of the third insulating layer is disposed between the second active layer and the second gate;
an upper surface of the fourth insulating layer contacts the first source electrode, the second source electrode, the first drain electrode, and the second drain electrode; and
the first source electrode, the second source electrode, the first drain electrode, and the second drain electrode are disposed on a same layer.

2. The display device according to claim 1, wherein:
the gate lines comprise scan lines and light emission control lines; and
the gate driver comprises:
a scan driver to supply a scan signal to the scan lines; and
a light emission control driver to supply a light emission control signal to the light emission control lines.

3. The display device according to claim 2, wherein:
the scan driver comprises a scan stage comprising the second transistor; and
the light emission control driver comprises a light emission control stage comprising the first transistor.

4. The display device according to claim 2, wherein:
the scan driver comprises a scan stage comprising the first transistor; and
the light emission control driver comprises a light emission control stage comprising the second transistor.

5. The display device according to claim 1, wherein:
the gate lines comprise scan lines;
the gate driver comprises scan stages to sequentially supply scan signals to the scan lines; and
each of the scan stages comprises:
an input circuit comprising the second transistor; and
an output circuit comprising the first transistor.

6. The display device according to claim 1, wherein:
the gate lines comprise light emission control lines;
the gate driver comprises light emission control stages to sequentially supply light emission control signals to the light emission control lines; and
each of the light emission control stages comprises:
an input circuit comprising the second transistor; and
an output circuit comprising the first transistor.

7. The display device according to claim 1, wherein the first transistor and the second transistor have different characteristics from each other.

8. The display device according to claim 7, wherein the first transistor and the second transistor have different threshold voltages from each other.

9. The display device according to claim 8, wherein:
each of the first transistor and the second transistor comprises a P-type transistor; and
the threshold voltage of the first transistor is greater than the threshold voltage of the second transistor.

10. The display device according to claim 1, wherein the first active layer and the second active layer have different characteristics from each other.

11. The display device according to claim 10, wherein the first active layer has a degree of crystallization that is less than a degree of crystallization of the second active layer.

12. The display device according to claim 1, further comprising:
a display panel comprising a display area at which the pixels are disposed, and a non-display area at which the gate driver is disposed.

13. The display device according to claim 12, wherein:
each of the pixels comprises a pixel transistor comprising a third active layer; and
the third active layer has a degree of crystallization that is less than a degree of crystallization of at least one active layer from among the first active layer and the second active layer.

14. The display device according to claim 1, wherein another contact hole penetrates through the insulating layer and exposes a region of the second active layer that overlaps with the first active layer in the plan view, and the another contact hole is located between the contact hole and a gate of the second transistor in the plan view.

* * * * *